(12) United States Patent
Kimura et al.

(10) Patent No.: US 9,813,682 B2
(45) Date of Patent: Nov. 7, 2017

(54) LASER DRIVING CIRCUIT, LASER DRIVING METHOD, AND DEVICE USING LASER LIGHT

(71) Applicant: Sony Corporation, Tokyo (JP)

(72) Inventors: Motoi Kimura, Kanagawa (JP); Tsutomu Kurihara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/348,587

(22) Filed: Nov. 10, 2016

(65) Prior Publication Data

US 2017/0064265 A1 Mar. 2, 2017

Related U.S. Application Data

(63) Continuation of application No. 14/349,592, filed as application No. PCT/JP2012/075785 on Oct. 4, 2012, now Pat. No. 9,516,258.

(30) Foreign Application Priority Data

Oct. 25, 2011 (JP) ................................ 2011-233729
Mar. 30, 2012 (JP) ................................ 2012-078917

(51) Int. Cl.
*H04N 9/31* (2006.01)
*G02B 27/48* (2006.01)
(Continued)

(52) U.S. Cl.
CPC ........... *H04N 9/3135* (2013.01); *G02B 27/48* (2013.01); *H01S 5/0427* (2013.01);
(Continued)

(58) Field of Classification Search
CPC ......................... H01S 5/06206; H01S 5/06821
(Continued)

(56) References Cited

U.S. PATENT DOCUMENTS 2,970,187 A 1/1961 Hinton
5,109,280 A 4/1992 Karlock
(Continued)

FOREIGN PATENT DOCUMENTS

JP 2000-347311 A 12/2000
JP 2008-103515 A 5/2008
(Continued)

OTHER PUBLICATIONS

Chinese Office Action dated Jun. 27, 2016 for corresponding Chinese Application No. 201280051484.1.
(Continued)

*Primary Examiner* — Tuan Nguyen
(74) *Attorney, Agent, or Firm* — Michael Best & Friedrich LLP

(57) ABSTRACT

A laser driving circuit, a laser driving method, and a device using laser light that can reduce speckle noise caused by laser light as coherent light are provided.
In the laser driving circuit that generates laser driving current for driving a plurality of laser light sources emitting laser light of different wavelengths on the basis of an input video signal, a high-frequency signal of a frequency exceeding the band of the video signal is superimposed on the laser driving current generated on the basis of the input video signal, whereby speckle noise caused by the laser light as coherent light is reduced.

9 Claims, 50 Drawing Sheets

(51) Int. Cl.
  *H01S 5/042* (2006.01)
  *H01S 5/065* (2006.01)
  *H01S 5/40* (2006.01)
  *H04N 5/74* (2006.01)
  *H01S 5/062* (2006.01)
  *G09G 3/02* (2006.01)

(52) U.S. Cl.
  CPC ........ *H01S 5/0652* (2013.01); *H01S 5/06213* (2013.01); *H01S 5/4093* (2013.01); *H04N 5/74* (2013.01); *H04N 9/3129* (2013.01); *H04N 9/3161* (2013.01); *H04N 9/3179* (2013.01); *G09G 3/02* (2013.01); *G09G 2320/0233* (2013.01); *H01S 5/06216* (2013.01); *H01S 2301/02* (2013.01)

(58) Field of Classification Search
  USPC ....................................................... 372/38.2
  See application file for complete search history.

(56) References Cited

U.S. PATENT DOCUMENTS

| | | | |
|---|---|---|---|
| 5,467,104 A | 11/1995 | Furness, III et al. | |
| 6,489,600 B1 * | 12/2002 | Taguchi | H01S 5/0683 250/205 |
| 2005/0047457 A1 | 3/2005 | Shibuya | |
| 2007/0147450 A1 | 6/2007 | Inoue et al. | |
| 2008/0170285 A1 * | 7/2008 | Kasazumi | G02B 26/101 359/223.1 |
| 2009/0067459 A1 | 3/2009 | Mizuuchi et al. | |
| 2010/0097534 A1 | 4/2010 | Teller et al. | |
| 2012/0140784 A1 | 6/2012 | Quirk et al. | |
| 2014/0368556 A1 | 12/2014 | Funatsu et al. | |

FOREIGN PATENT DOCUMENTS

| | | |
|---|---|---|
| JP | 2009-157111 A | 7/2009 |
| JP | 2010-066303 | 3/2010 |
| JP | 2010-276689 A | 12/2010 |
| JP | 2011-102847 A | 5/2011 |
| JP | 2011-180277 A | 9/2011 |
| WO | WO-2007/099847 A1 | 9/2007 |
| WO | WO-2010/125866 A1 | 11/2010 |
| WO | WO-2011/114928 A1 | 9/2011 |

OTHER PUBLICATIONS

Chinese Office Action dated Oct. 26, 2015 for corresponding Chinese Application No. 201280051484.1.

Japanese Office Action dated Nov. 4, 2015 for corresponding Japanese Application No. 2011-233729.

Japanese Office Action dated Feb. 23, 2017 for corresponding Japanese Application No. 2016-068072.

* cited by examiner

WAVELENGTH

WAVELENGTH

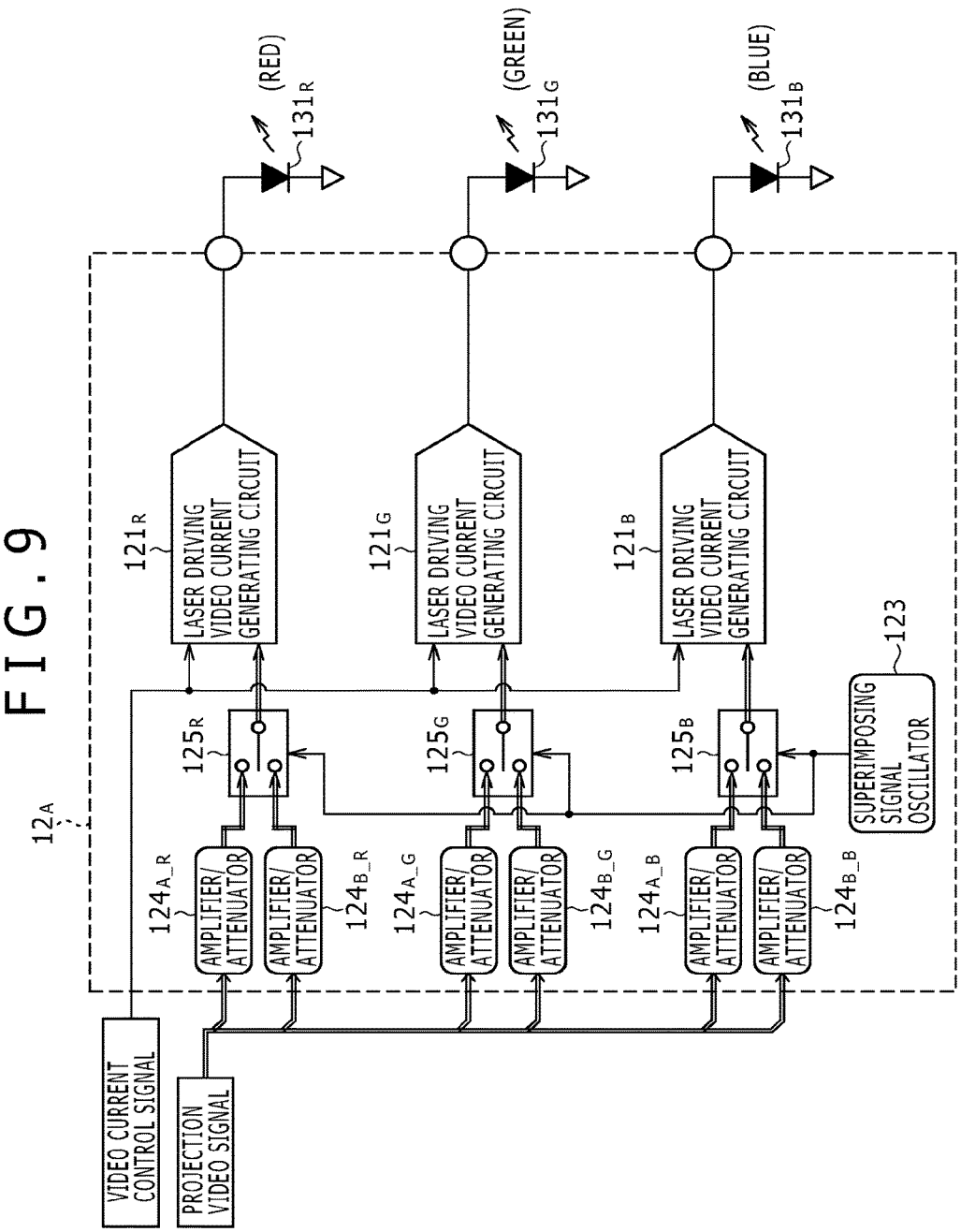

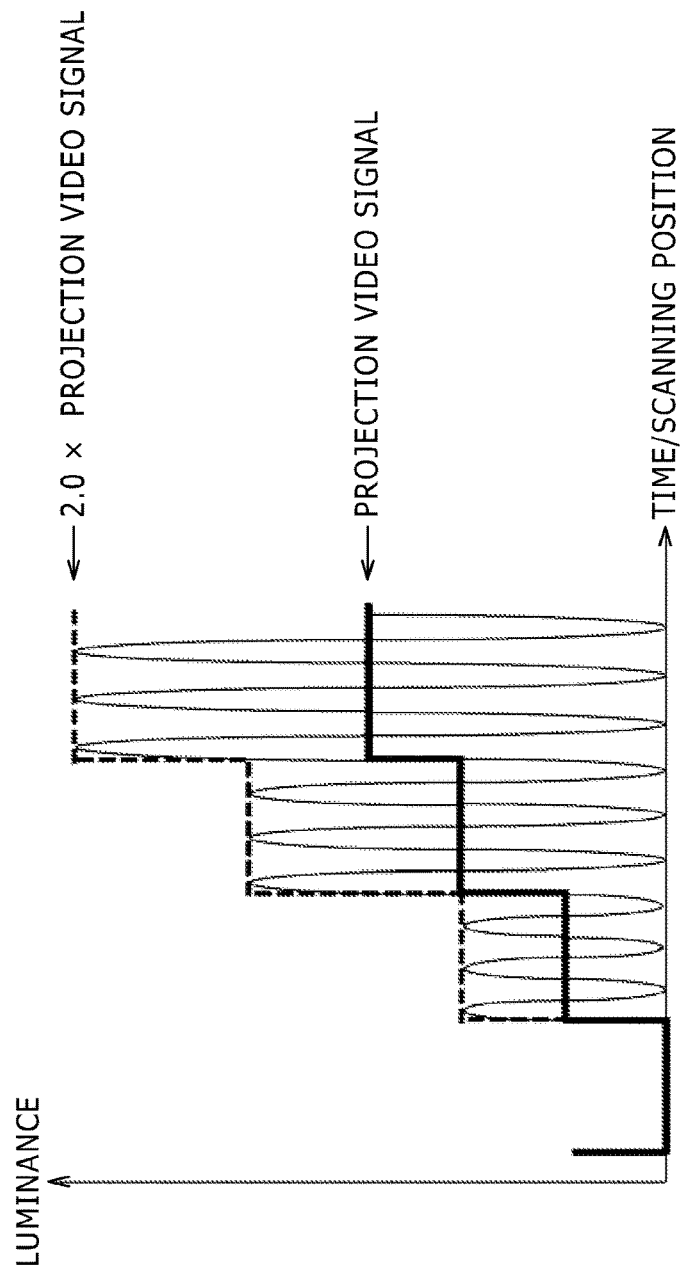

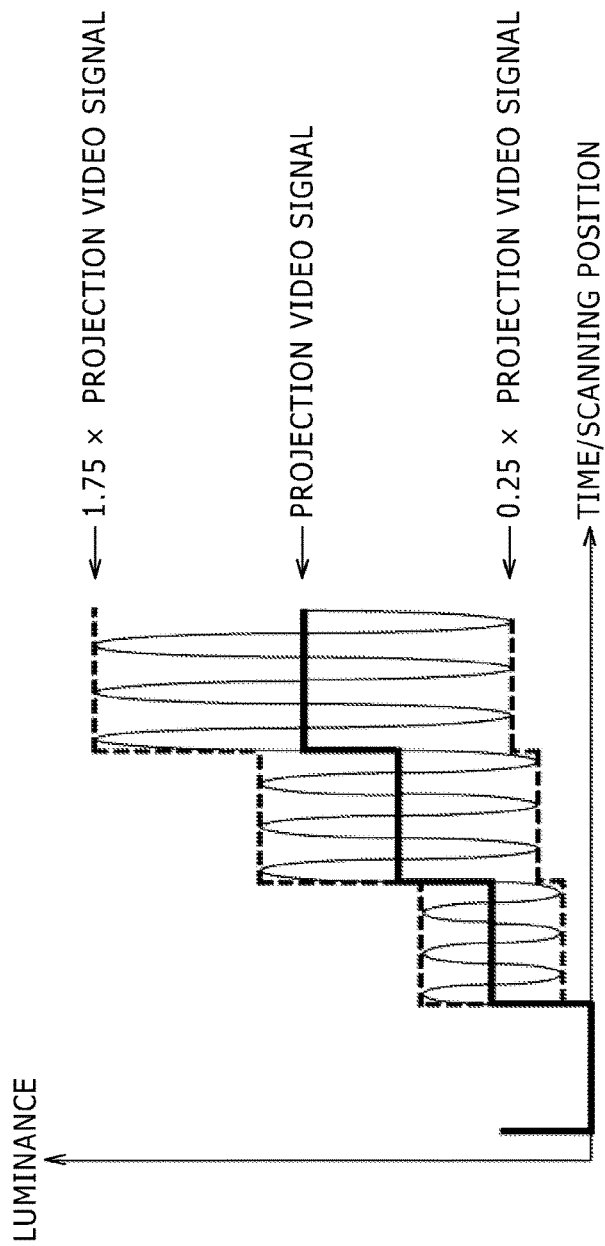

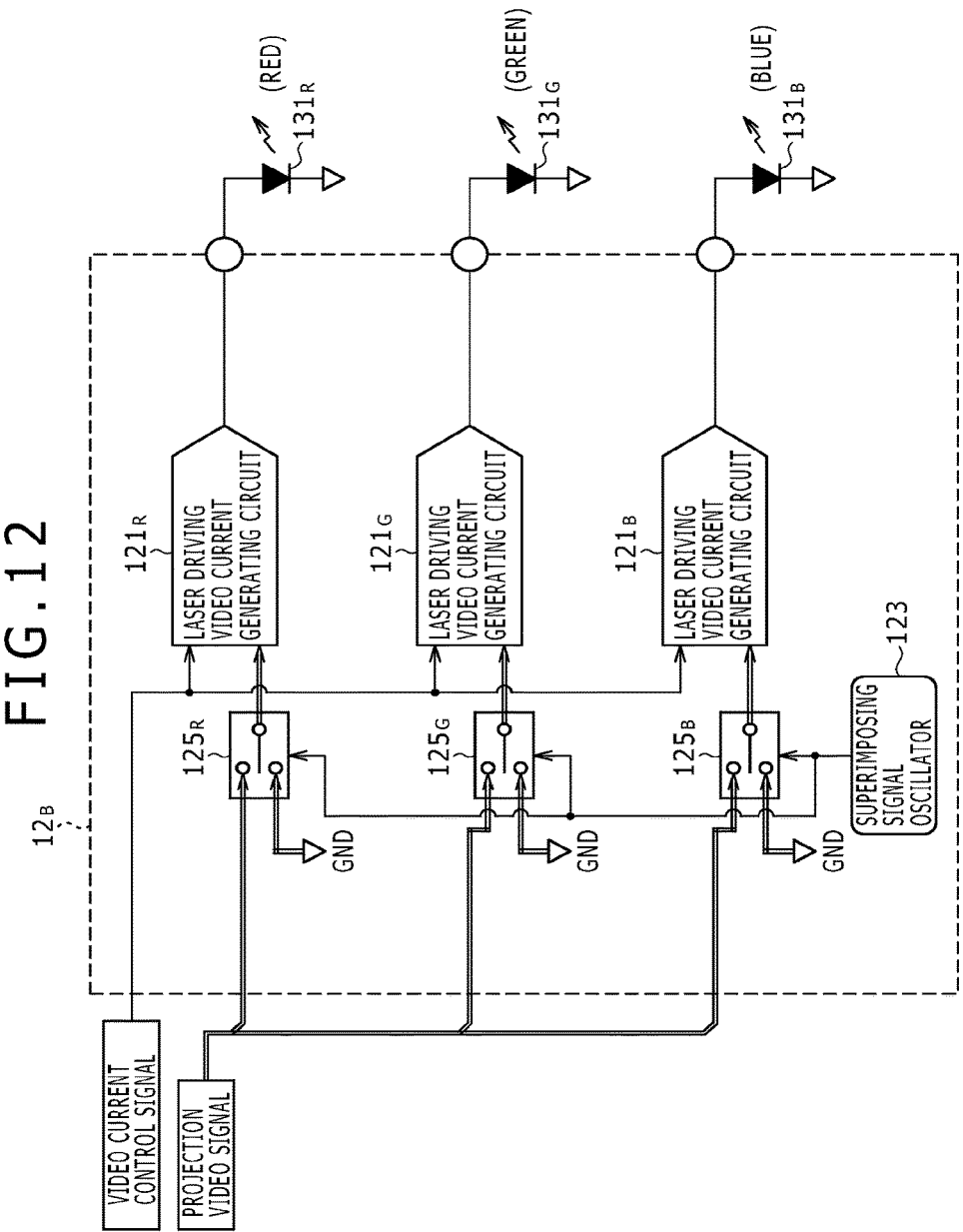

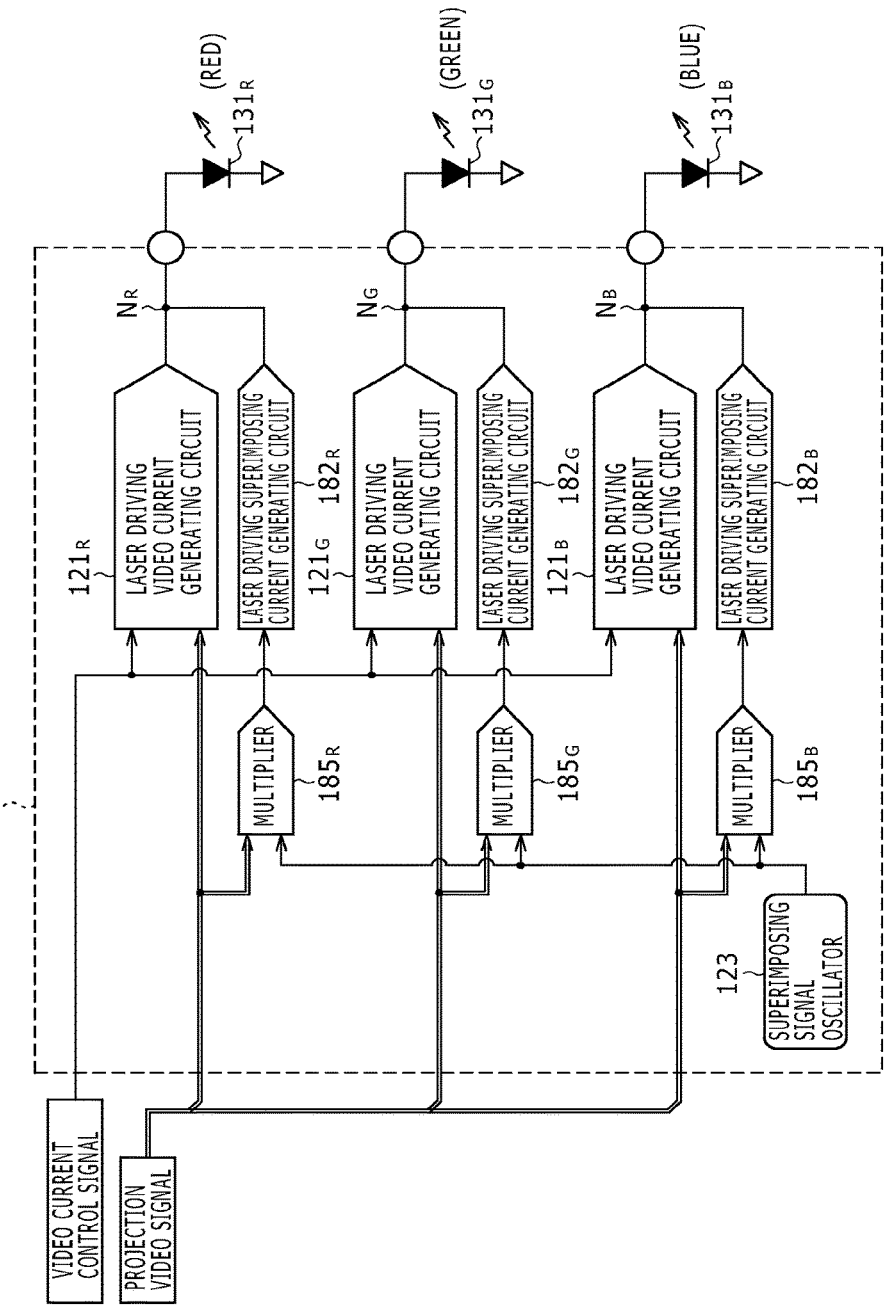

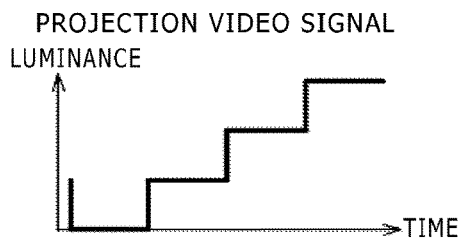
FIG.24A
PROJECTION VIDEO SIGNAL
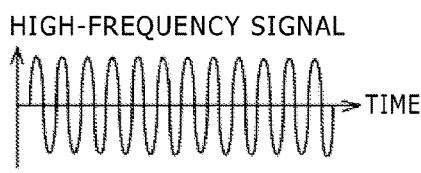
FIG.24B
HIGH-FREQUENCY SIGNAL
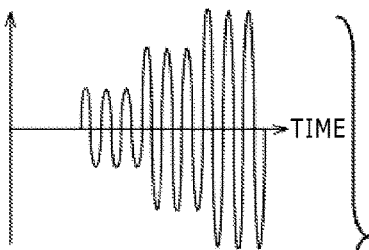
FIG.24C
OUTPUT OF MULTIPLIER TO OUTPUT OF LASER DRIVING SUPERIMPOSING CURRENT GENERATING CIRCUIT
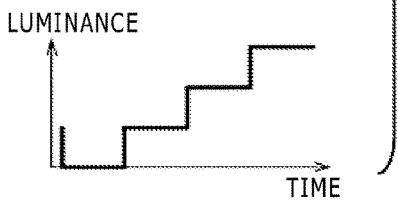
FIG.24D
OUTPUT OF LASER DRIVING VIDEO CURRENT GENERATING CIRCUIT
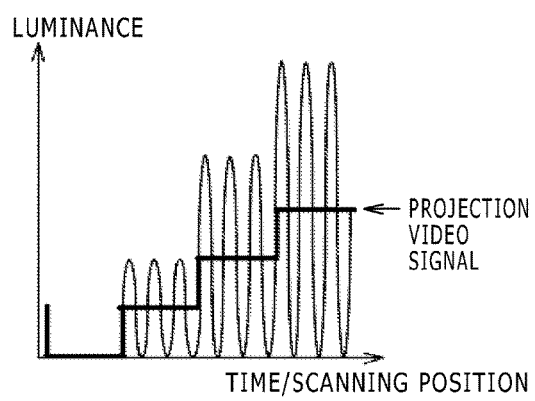
FIG.24E
LASER DRIVING CURRENT

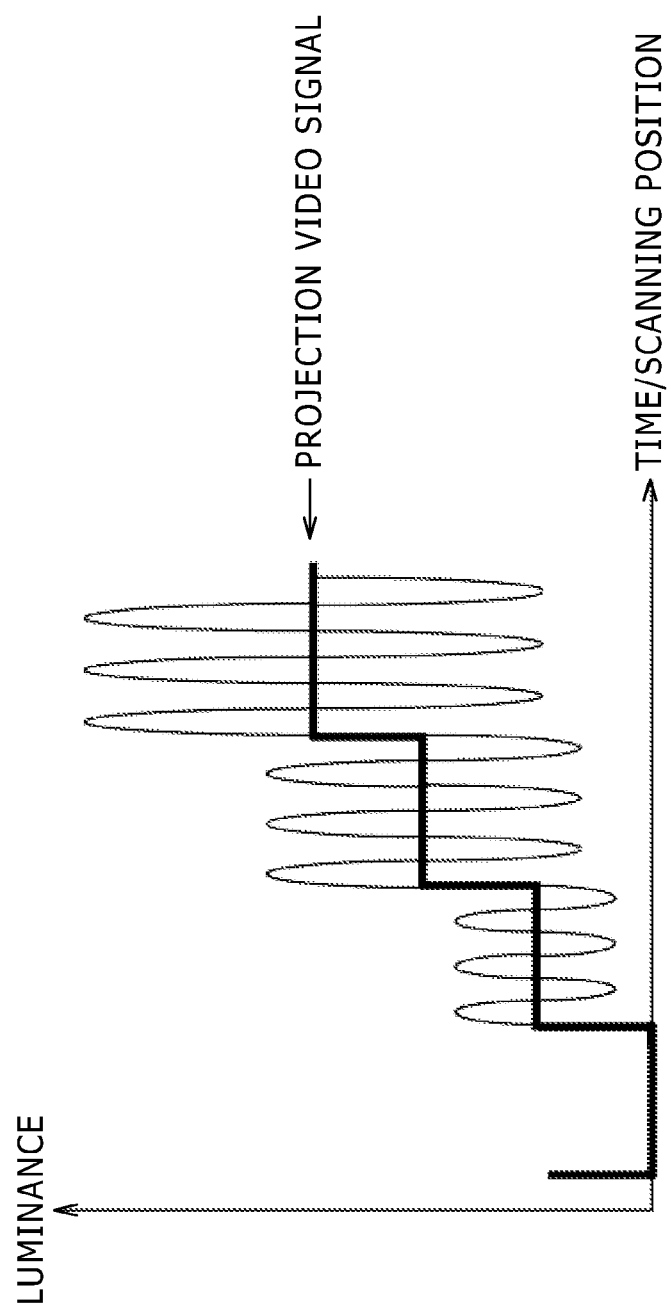

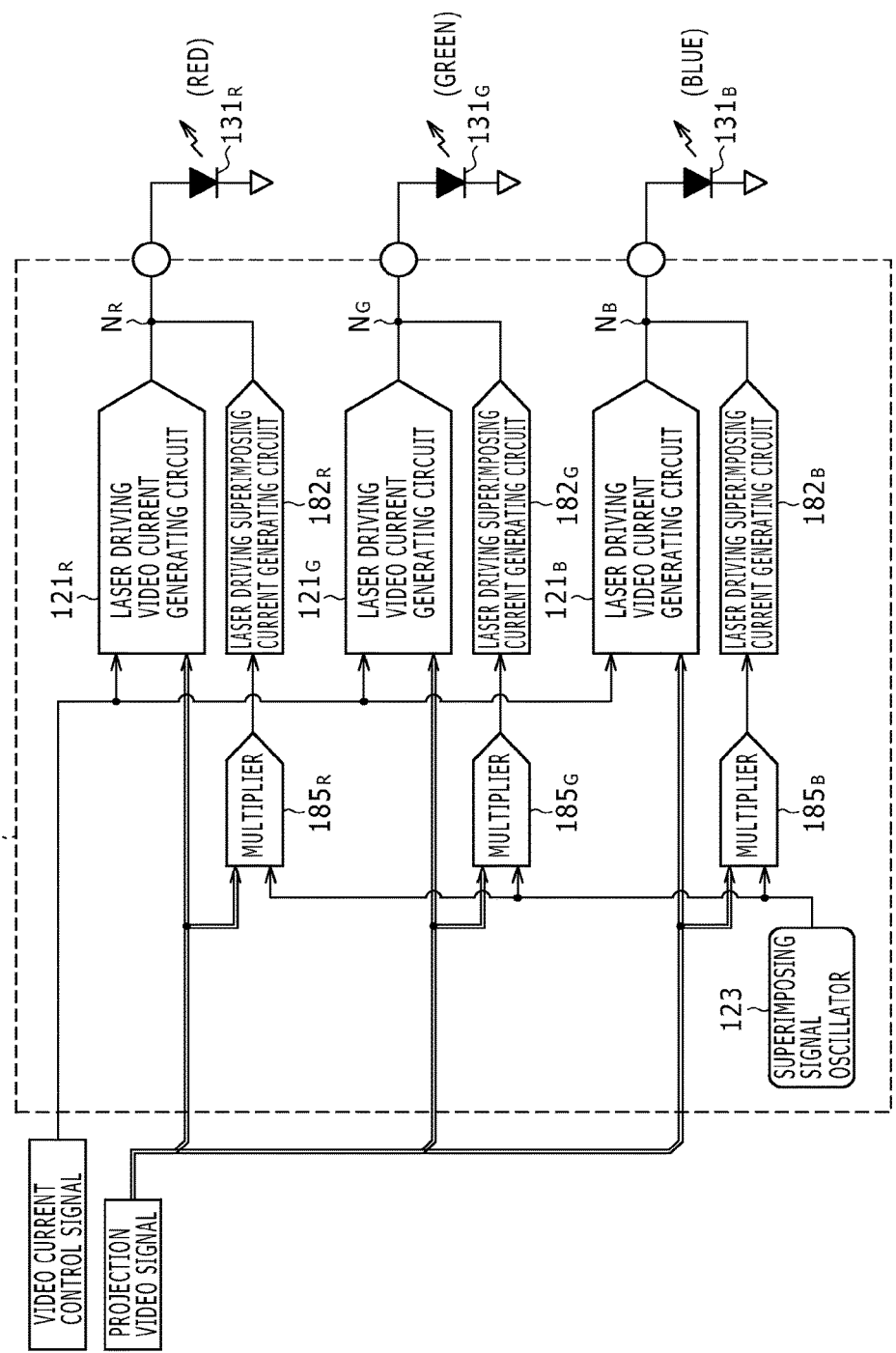

LASER DRIVING CIRCUIT, LASER DRIVING METHOD, AND DEVICE USING LASER LIGHT

CROSS REFERENCES TO RELATED APPLICATIONS

This is a Continuation application of U.S. patent application Ser. No. 14/349,592, filed Apr. 3, 2014, which is a National Stage Entry of Application No.: PCT/JP2012/075785 filed Oct. 4, 2012, which claims priority to Japanese Patent Application Nos.: 2012-078917 and 2011-233729 filed in the Japan Patent Office on Mar. 30, 2012 and Oct. 25, 2011, respectively, the entire contents of which being incorporated herein by reference.

TECHNICAL FIELD

The present disclosure relates to a laser driving circuit, a laser driving method, and a device using laser light (laser beam).

BACKGROUND ART

Devices using laser light (laser beam) include for example a laser display device that displays an image using laser light. This laser display device displays an image on a screen by driving a laser light source emitting laser light by a laser driving circuit, and scanning the laser light by a scanner under the driving of the laser driving circuit (see Patent Literature 1, for example).

CITATION LIST

Patent Literature

[PTL]
Japanese Patent Laid-Open No. 2010-66303

SUMMARY

Technical Problem

With the laser display device, minute projections and depressions of the screen randomly change the optical path length of the laser light from the laser light source through the screen to the eye of a viewer in which eye the image is formed. In a case of coherent light uniform in wavelength and phase such as laser light or the like, pieces of light different from each other in phase according to changes in the optical path length enter the eye, and these pieces of light interfere with each other, causing speckles appearing as innumerable interference fringes with a random distribution of intensity, that is, so-called speckle noise. This speckle noise is a problem concerning not only laser display devices but also devices in general that use laser light as coherent light.

It is accordingly an object of the present disclosure to provide a laser driving circuit, a laser driving method, and a device using laser light that can reduce speckle noise caused by laser light as coherent light.

Solution to Problem

In order to achieve the above object, the present disclosure adopts a constitution that generates laser driving current for driving a plurality of laser light sources emitting laser light of different wavelengths on a basis of an input video signal, and superimposes a high-frequency signal of a frequency exceeding a band of the video signal on the generated laser driving current.

When the high-frequency signal is superimposed on the laser driving current based on the video signal, and the laser light sources are driven by the laser driving current on which the high-frequency signal is superimposed, the wavelength spectrum of the laser light emitted from the laser light sources is widened, and thus coherence is decreased. When the coherence of the laser light is decreased, speckle noise caused by the laser light as coherent light can be reduced.

Advantageous Effect of Invention

According to the present disclosure, the high-frequency signal is superimposed on the laser driving current for driving the laser light sources, whereby the wavelength spectrum of the laser light emitted from the laser light sources is widened, and the coherence is decreased. It is thus possible to reduce speckle noise.

BRIEF DESCRIPTION OF DRAWINGS

FIG. 9 is a block diagram showing a configuration of a laser driving circuit according to a first example of a first embodiment.

FIG. 10 is a waveform chart (1) showing relation between the gains of two amplifiers/attenuators and the amplitude of a high-frequency signal in the first example.

FIG. 11 is a waveform chart (2) showing relation between the gains of the two amplifiers/attenuators and the amplitude of the high-frequency signal in the first example.

FIG. 12 is a block diagram showing a configuration of a laser driving circuit according to a second example.

FIG. 23 is a block diagram showing a configuration of a laser driving circuit according to an eighth example.

FIG. 24A is a waveform chart showing a projection video signal input to a multiplier in the laser driving circuit according to the eighth example, FIG. 24B is a waveform chart showing a high-frequency signal generated by a superimposing signal oscillator in the laser driving circuit according to the eighth example, FIG. 24C is a waveform chart showing the output signal of the multiplier, FIG. 24D is a waveform chart showing the output signal of a laser driving video current generating circuit in the laser driving circuit according to the eighth example, and FIG. 24E is a waveform chart showing the projection video signal superimposed on laser driving current.

FIG. 25 is a waveform chart showing relation between the projection video signal and the amplitude of the high-frequency signal when the respective gains of the multiplier and a laser driving superimposing current generating circuit are adjusted in the laser driving circuit according to the eighth example.

FIG. 50 is a block diagram showing a configuration of a laser driving circuit according to a twenty-second example.

DESCRIPTION OF EMBODIMENTS

Figure 1:
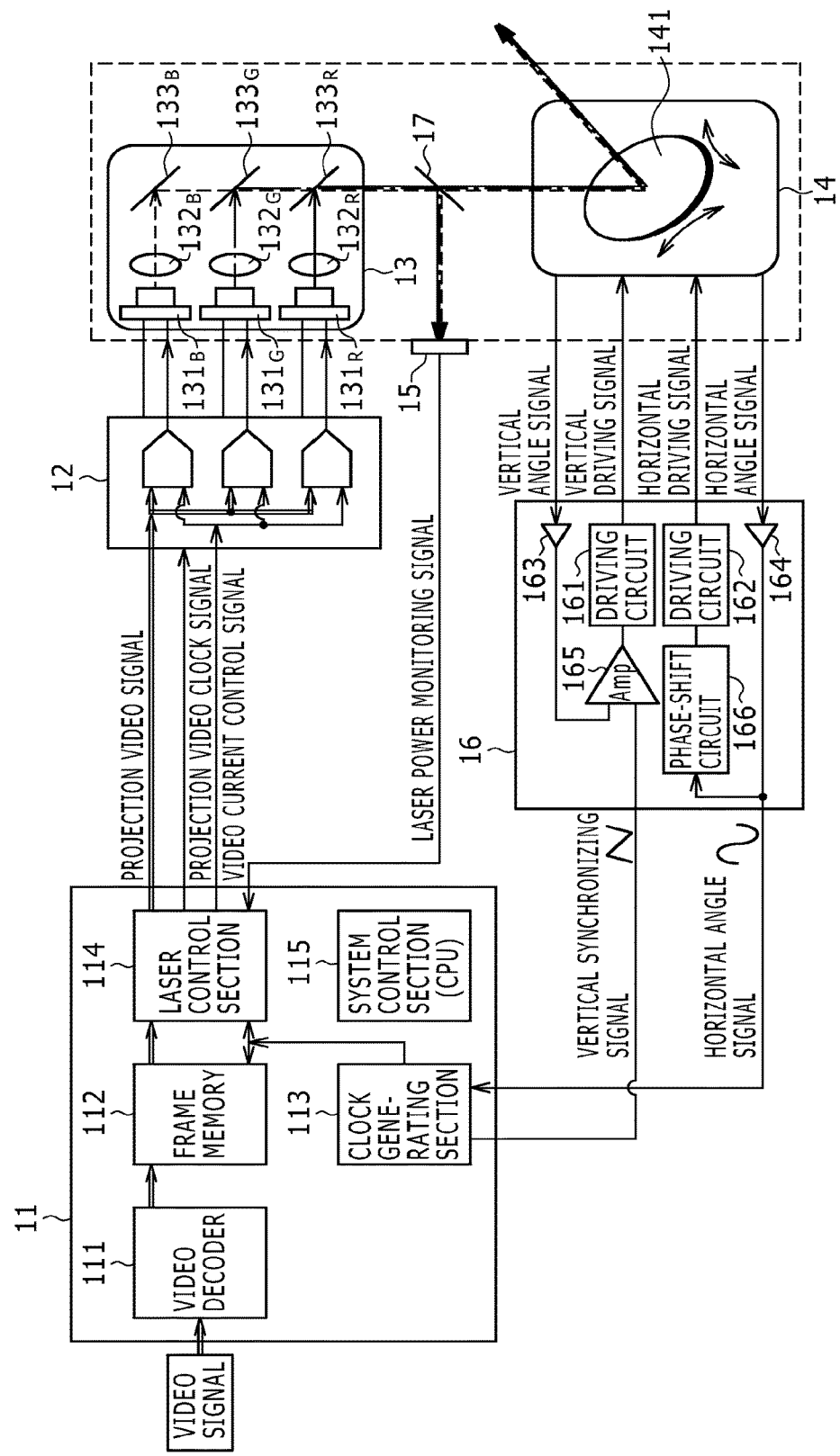
FIG. 1 is a system configuration diagram showing an example of configuration of a projector device of a laser beam scanning system.

A mode for carrying out technology according to the present disclosure (which mode will hereinafter be described as "embodiments") will hereinafter be described in detail with reference to the drawings. The present disclosure is not limited to the embodiments, and various numerical values and the like in the embodiments are for illustrative purposes. In the following description, the same elements or elements having the same functions are identified by the same reference numerals, and repeated description thereof will be omitted. Incidentally, description will be made in the following order.

1. Description of Laser Driving Circuit, Laser Driving Method, Projector Device, and Device Using Laser Light according to Present Disclosure, and Generals 2. System Configuration of Projector Device to which Present Disclosure is Applied 3. Basic Configuration of Laser Driving Circuit according to Present Disclosure
4. First Embodiment (Example in which Superimposing Process is Performed on Input Side of Laser Driving Video Current Generating Circuits)
4-1. First Example
4-2. Second Example
4-3. Third Example
4-4. Fourth Example
5. Second Embodiment (Example in which Superimposing Process is Performed on Output Side of Laser Driving Video Current Generating Circuits)
5-1. Fifth Example
5-2. Sixth Example
5-3. Seventh Example
5-4. Eighth Example
5-5. Ninth Example
6. Third Embodiment (Example in which Superimposing Process is Performed on Input Side of Laser Driving Video Current Generating Circuits)
6-1. Tenth Example
6-2. Eleventh Example
6-3. Twelfth Example
6-4. Thirteenth Example
6-5. Fourteenth Example
6-6. Fifteenth Example
6-7. Sixteenth Example
6-8. Seventeenth Example
6-9. Eighteenth Example
7. Fourth Embodiment (Example in which Superimposing Process is Performed on Output Side of Laser Driving Video Current Generating Circuits)
7-1. Nineteenth Example
7-2. Twentieth Example
7-3. Twenty-First Example
7-4. Twenty-Second Example
8. Constitutions according to Present Disclosure 1. Description of Laser Driving Circuit, Laser Driving Method, and Device Using Laser Light According to Present Disclosure, and Generals A laser driving circuit according to the present disclosure is to drive a plurality of laser light sources that emit laser light (that may hereinafter be described also as a "laser beam") of different wavelengths. As the plurality of laser light sources, in general, three RGB laser light sources emitting laser light of three kinds of wavelengths of red (R), green (G), and blue (B) can be used. It is desirable to use small and efficient semiconductor lasers as the laser light sources. However, semiconductor lasers are an example, and the laser light sources are not limited to semiconductor lasers.

The laser driving circuit according to the present disclosure has a video signal as input thereto, amplifies the video signal, and generates a laser driving current for driving each of the laser light sources. In generating the laser driving current, the technology according to the present disclosure relates to a laser driving circuit and a laser driving method using a so-called high-frequency superimposing technology, which superimposes a high-frequency signal of a frequency exceeding the band of the video signal on the laser driving current. The laser driving circuit and the laser driving method according to the present disclosure using the high-frequency superimposing technology can be applied to devices in general that use laser light.

Devices that use laser light, or especially devices using the laser driving circuit and the laser driving method according to the present disclosure include for example a laser display device, or especially a projector device of a laser beam scanning system, which is a kind of laser display device. However, the technology according to the present disclosure is not limited to application to projector devices, but is applicable to devices in general that use laser light. Laser displays other than projector devices include for example head-mounted displays, laser liquid crystal TVs, organic laser TVs, and stereoscopic (three-dimensional) displays.

The laser driving circuit according to the present disclosure has a plurality of laser driving video current generating circuits for generating laser driving current for driving the plurality of laser light sources emitting the laser light of the different wavelengths on the basis of the input video signal. The laser driving current generated by the laser driving video current generating circuits is subjected to a process of superimposing the high-frequency signal of the frequency exceeding the band of the video signal on the laser driving current. The process of superimposing the high-frequency signal on the laser driving current includes a process performed on the input side of the plurality of laser driving video current generating circuits and a process performed on the output side of the plurality of laser driving video current generating circuits. Either of the processes is performed by a high-frequency superimposing section.

(Superimposing Process on Input Side of Laser Driving Video Current Generating Circuits)

A method of switching the video signal input to the plurality of laser driving video current generating circuits according to the high-frequency signal can be adopted as a process of superimposing the high-frequency signal on the laser driving current on the input side of these laser driving video current generating circuits.

As an example, an amplifier/attenuator can be provided to each of the plurality of laser driving video current generating circuits. These amplifiers/attenuators have a function of generating a plurality of video signals of different amplitudes on the basis of the input video signal. Then, the plurality of video signals generated by the plurality of amplifiers/attenuators are selected (switched) according to the high-frequency signal. Thereby, the high-frequency signal having amplitudes corresponding to the levels of the plurality of video signals can be superimposed on the laser driving current.

In addition, the input video signal can be switched directly according to the high-frequency signal without the amplifiers/attenuators being provided. At this time, it suffices to perform switching according to the high-frequency signal between the input video signal and a predetermined potential (for example a ground level). In this case, when the amplitude of the high-frequency signal to be superimposed on the laser driving current needs to be the same level as in the case of the above-described example using the amplifiers/attenuators, it suffices to adjust the level of the input video signal in advance.

In either case, the high-frequency signal having the amplitude corresponding to the level of the input video signal can be superimposed on the laser driving current. Thereby, in a part of a zero level of the input video signal, the amplitude of the high-frequency signal to be superimposed on the video signal can be set to zero, so that luminance can be set to zero. In addition, the amplitude of the high-frequency signal to be superimposed can be made larger in a part of brighter video in which part speckle noise tends to be conspicuous, so that an effect of reducing speckle noise can be enhanced.

(Superimposing Process on Output Side of Laser Driving Video Current Generating Circuits)

In the process of superimposing the high-frequency signal on the laser driving current on the output side of the plurality of laser driving video current generating circuits, laser driving current switches can be provided which have a function of passing/interrupting the laser driving current generated by the plurality of laser driving video current generating circuits. The passage/interruption of the laser driving current switches is controlled according to the high-frequency signal. Thereby, the high-frequency signal can be superimposed on the laser driving current.

Alternatively, a method can be adopted in which laser driving superimposing current generating circuits for amplifying the high-frequency signal are provided, and the output currents of the laser driving superimposing current generating circuits are added to the laser driving current generated by the plurality of laser driving video current generating circuits. The high-frequency signal can be superimposed on the laser driving current also by this method.

When this method is adopted, it is preferable to provide superimposing current switches having a function of passing/interrupting the output currents of the laser driving superimposing current generating circuits and level comparators for determining the magnitude of the level of the video signal with respect to a predetermined threshold value. Then, when the level of the video signal is equal to or higher than the predetermined threshold value, the superimposing current switches are set in a conducting state to add the output currents of the laser driving superimposing current generating circuits to the laser driving current.

Thus, when the level of the video signal does not reach the predetermined threshold value, for example when the level of the video signal is zero, the superimposing current switches are set in a nonconducting (off) state, whereby the process of superimposing the high-frequency signal is not performed. Thereby, luminance can be dropped (lowered) to zero.

Alternatively, instead of providing the superimposing current switches and the level comparators, multipliers for multiplying together the video signal and the high-frequency signal are provided. The multipliers generate a high-frequency signal having amplitude corresponding to the level of the video signal by multiplying together the video signal and the high-frequency signal. By inputting the high-frequency signals generated by the multipliers to the laser driving superimposing current generating circuits, the high-frequency signal can be superimposed on the laser driving current. At this time, the gains of the multipliers and the laser driving superimposing current generating circuits can be made adjustable.

In each case, the high-frequency signal having the amplitude corresponding to the level of the input video signal can be superimposed on the laser driving current. Thereby, in a part of a zero level of the input video signal, the amplitude of the high-frequency signal to be superimposed on the video signal can be set to zero, so that luminance can be set to zero. In addition, the amplitude of the high-frequency signal to be superimposed can be made larger in a part of brighter video in which part speckle noise tends to be conspicuous, so that an effect of reducing speckle noise can be enhanced.

(Signal Source of High-Frequency Signal)

In each of the case where the process of superimposing the high-frequency signal on the laser driving current is performed on the input side of the plurality of laser driving video current generating circuits and the case where the process of superimposing the high-frequency signal on the laser driving current is performed on the output side of the plurality of laser driving video current generating circuits, an oscillator incorporated in the laser driving circuit can be used as a signal source of the high-frequency signal. Alternatively, a receiver for receiving a clock signal input from the outside of the laser driving circuit in a state of being synchronized with the input video signal can be used in place of the built-in oscillator.

As the clock signal input from the outside, a clock signal having a higher frequency than the frequency band of the input video signal and synchronized with periods of minimum units for repeating the brightness and darkness of the video signal, that is, synchronized with the video signal can be used. According to principles of display of a laser display device, an image is displayed by controlling the luminance (brightness and darkness) of laser light, and gradation representation is achieved by intensity modulation of the laser light. Hence, the "minimum units" for repeating the brightness and darkness of the video signal correspond to pixels in a flat panel display such as a liquid crystal display device, a plasma display device, an EL display device, or the like. In addition, the "periods of minimum units" are pixel periods in the flat panel display.

In addition to superimposing the clock signal received by the receiver and synchronized with the video signal as it is as the high-frequency signal on the laser driving current, it is possible to multiply the frequency of the clock signal received by the receiver by a frequency multiplier, and superimpose the multiplied clock signal on the laser driving current. At this time, the frequency multiplier desirably generates a high-frequency signal that has a frequency that is an integral multiple of the clock signal received by the receiver and which high-frequency signal is synchronized with the clock signal.

When the signal source of the high-frequency signal is the receiver for receiving the clock signal synchronized with the video signal from the outside, and the clock signal is used as the high-frequency signal, the video signal and the high-frequency signal to be superimposed on the laser driving current can be synchronized with each other. It is thereby possible to avoid degradation in image quality due to an aliasing component attendant on cross modulation between the video signal and the high-frequency signal.

When the video signal and the high-frequency signal are not synchronized with each other, an aliasing component attendant on cross modulation between the video signal and the high-frequency signal may occur, and impair image quality. Accordingly, the high-frequency superimposing section in the laser driving circuit according to the present disclosure uses an oscillator for oscillating the high-frequency signal to be superimposed on the laser driving current on the basis of the signal synchronized with the video signal as a signal source of the high-frequency signal of the frequency exceeding the band of the video signal.

Thus, the video signal and the high-frequency signal can be synchronized with each other by generating the high-frequency signal to be superimposed on the laser driving current on the basis of the signal synchronized with the video signal. It is thereby possible to suppress an aliasing component attendant on cross modulation between the video signal and the high-frequency signal, and thus avoid degradation in image quality due to the aliasing component.

In the laser driving circuit, the laser driving method, and the device using laser light according to the present disclosure including the preferable constitutions described above, the oscillator for oscillating the high-frequency signal to be superimposed on the laser driving current can have a constitution including an oscillation phase synchronizing circuit for controlling an oscillation stop/oscillation start of the oscillator according to the signal synchronized with the video signal. In addition, a pixel period synchronizing signal indicating a start of a pixel as a minimum unit for repeating the brightness and darkness of the video signal can be used as the signal synchronized with the video signal.

Alternatively, in the laser driving circuit, the laser driving method, and the device using laser light according to the present disclosure including the preferable constitutions described above, the high-frequency superimposing section can have a constitution including a pixel period extracting circuit for extracting the pixel period synchronizing signal from the video signal. The pixel period extracting circuit supplies the oscillator with the pixel period synchronizing signal extracted from the video signal as the signal synchronized with the video signal.

Alternatively, in the laser driving circuit, the laser driving method, and the device using laser light according to the present disclosure including the preferable constitutions described above, the high-frequency superimposing section can have a constitution including a level variation detecting circuit for determining the level information of the video signal for each pixel, and detecting level variation. When the level variation detecting circuit detects level variation for each pixel of the video signal, the level variation detecting circuit supplies the oscillator with the signal synchronized with the level variation as the signal synchronized with the video signal.

Alternatively, in the laser driving circuit, the laser driving method, and the device using laser light according to the present disclosure including the preferable constitutions described above, the high-frequency superimposing section can have a constitution including an oscillation stop period setting circuit for setting an arbitrary oscillation stop period or an oscillation stop period interlocked with the frequency (superimposed frequency) of the high-frequency signal. At this time, the oscillator starts oscillation after stopping oscillation during the oscillation stop period set by the oscillation stop period setting circuit.

Alternatively, in the laser driving circuit, the laser driving method, and the device using laser light according to the present disclosure including the preferable constitutions described above, the high-frequency superimposing section can have a constitution including a plurality of oscillators. At this time, oscillation phase synchronizing circuits perform an operation of using the oscillation output of another oscillator during the oscillation stop period of one oscillator as the high-frequency signal to be superimposed on the laser driving current by switching between the oscillation outputs of the plurality of oscillators.

Alternatively, in the laser driving circuit, the laser driving method, and the device using laser light according to the present disclosure including the preferable constitutions described above, the high-frequency superimposing section can have a constitution including amplifiers/attenuators for adjusting the amplitude of the input video signal so as to correspond to a plurality of laser driving video current generating circuits. At this time, the high-frequency superimposing section adjusts luminance by selecting the output of the amplifiers/attenuators during an oscillation stop period.

Alternatively, in the laser driving circuit, the laser driving method, and the device using laser light according to the present disclosure including the preferable constitutions described above, the high-frequency superimposing section can have a constitution including a counter for counting the output of an oscillator. At this time, the oscillator stops oscillation by receiving the output of the counter when the count value of the counter has become a predetermined set value.

2. System Configuration of Projector Device to which Present Disclosure is Applied A projector device to which the present disclosure is applied, more specifically a projector device of the laser beam scanning system will be illustrated as a device using laser light according to the present disclosure. A constitution of the projector device will be described in the following.

FIG. 1 is a system configuration diagram showing an example of configuration of a projector device of the laser beam scanning system. The projector device 10 according to the present example includes a video signal processing circuit 11, a laser driving circuit 12, a light source section 13, a scanner section 14, a light receiving element 15, and a scanner driving circuit 16.

The video signal processing circuit 11 includes a video decoder 111, a frame memory 112, a clock generating section 113, a laser control section 114, and a system control section 115. The video signal processing circuit 11 generates a video signal according to characteristics such as the wavelength of laser light and the like from an input video signal in synchronism with the scanner operation of the scanner section 14. Such a video signal for driving lasers will be referred to as a "projection video signal" in the present specification.

The video signal processing circuit 11 will be described more concretely. In the video signal processing circuit 11, the video decoder 111 in an input stage converts the input video signal into a video signal according to the wavelength of each light source of the light source section 13 (color gamut conversion). The frame memory 112 temporarily stores the video signal after the color gamut conversion which video signal is supplied from the video decoder 111. The clock generating section 113 generates a projection video clock signal synchronized with the scanner operation of the scanner section 14. This projection video clock signal is supplied to the frame memory 112 and the laser control section 114.

The frame memory 112 receives the projection video clock signal, and reads out the video signal stored therein in synchronism with the projection video clock signal. Thereby, the video signal read out from the frame memory 112 is the video signal synchronized with the scanner operation of the scanner section 14. The laser control section 114 monitors the light emission power of each light source of the light source section 13 on the basis of a laser power monitoring signal supplied from the light receiving element 15, and thereby generates a projection video signal that makes laser light emitted according to the input video signal. The system control section 115 is formed by a CPU and the like, and controls the whole of the present system.

The projection video signal generated by the laser control section 114 is supplied to the laser driving circuit 12. The laser driving circuit 12 is supplied with not only the projection video signal but also a current control signal to be described later from the video signal processing circuit 11. In addition, the laser driving circuit 12 is supplied with the projection video clock signal generated by the clock generating section 113 from the video signal processing circuit 11 as required. "As required" refers to for example cases where the projection video clock signal is used to synchronize a signal source of a high-frequency signal with the video signal, as will be described later.

The laser driving circuit 12 drives each light source of the light source section 13 according to the projection video signal corresponding to each wavelength. This laser driving circuit 12 is a part characteristic of the present disclosure. Basic configurations and concrete embodiments of the laser driving circuit 12 will be described later.

The light source section 13 has a plurality of light sources, for example three light sources. Laser light sources $131_R$, $131_G$, and $131_B$ for emitting laser light of wavelengths of red (R), green (G), and blue (B) are used as these light sources. In FIG. 1, red laser light is represented by a solid line, green laser light is represented by alternate long and short dashed lines, and blue laser light is represented by a broken line. A small and efficient semiconductor laser, in particular, is desirably used as the laser light sources $131_R$, $131_G$, and $131_B$.

The respective pieces of light emitted from the laser light sources $131_R$, $131_G$, and $131_B$ are modulated by the projection video signal corresponding to the respective wavelengths of the laser light sources $131_R$, $131_G$, and $131_B$. Specifically, the luminance (brightness and darkness) of the laser light is controlled to display an image according to the input video signal, and the intensity of the laser light is modulated to achieve gradation representation. The respective pieces of laser light emitted from the laser light sources $131_R$, $131_G$, and $131_B$ are converted into substantially collimated light by collimating lenses $132_R$, $132_G$, and $132_B$, and thereafter bundled into one piece of laser light by beam splitters $133_R$, $133_G$, and $133_B$ or the like.

The one piece of bundled laser light is partially reflected by a beam splitter 17 disposed at a midpoint of an optical path leading to the scanner section 14. This reflected laser beam enters the light receiving element 15. The light receiving element 15 outputs a laser power monitoring signal indicating the light emission power of each of the laser light sources $131_R$, $131_G$, and $131_B$ of the light source section 13 on the basis of the incident laser light, and supplies the laser power monitoring signal to the laser control section 114 in the video signal processing circuit 11.

The laser light that has passed through the beam splitter 17 enters the scanner section 14. The scanner section 14 is formed with one biaxial scanner 141, for example. The incident laser light is modulated in irradiation angle in a horizontal direction and a vertical direction by the biaxial scanner 141, and then projected onto a screen (not shown). Incidentally, in this case, an example is shown in which scanning is performed in both of the horizontal direction and the vertical direction by one biaxial scanner 141 as the scanner section 14. However, scanning may be performed in the horizontal direction and the vertical direction by using two uniaxial scanners.

The scanner section 14 generally includes a sensor for detecting the irradiation angle of the biaxial scanner 141 or the like, and a horizontal angle signal and a vertical angle signal are output from the sensor. These angle signals are input to the scanner driving circuit 16.

Figure 2:
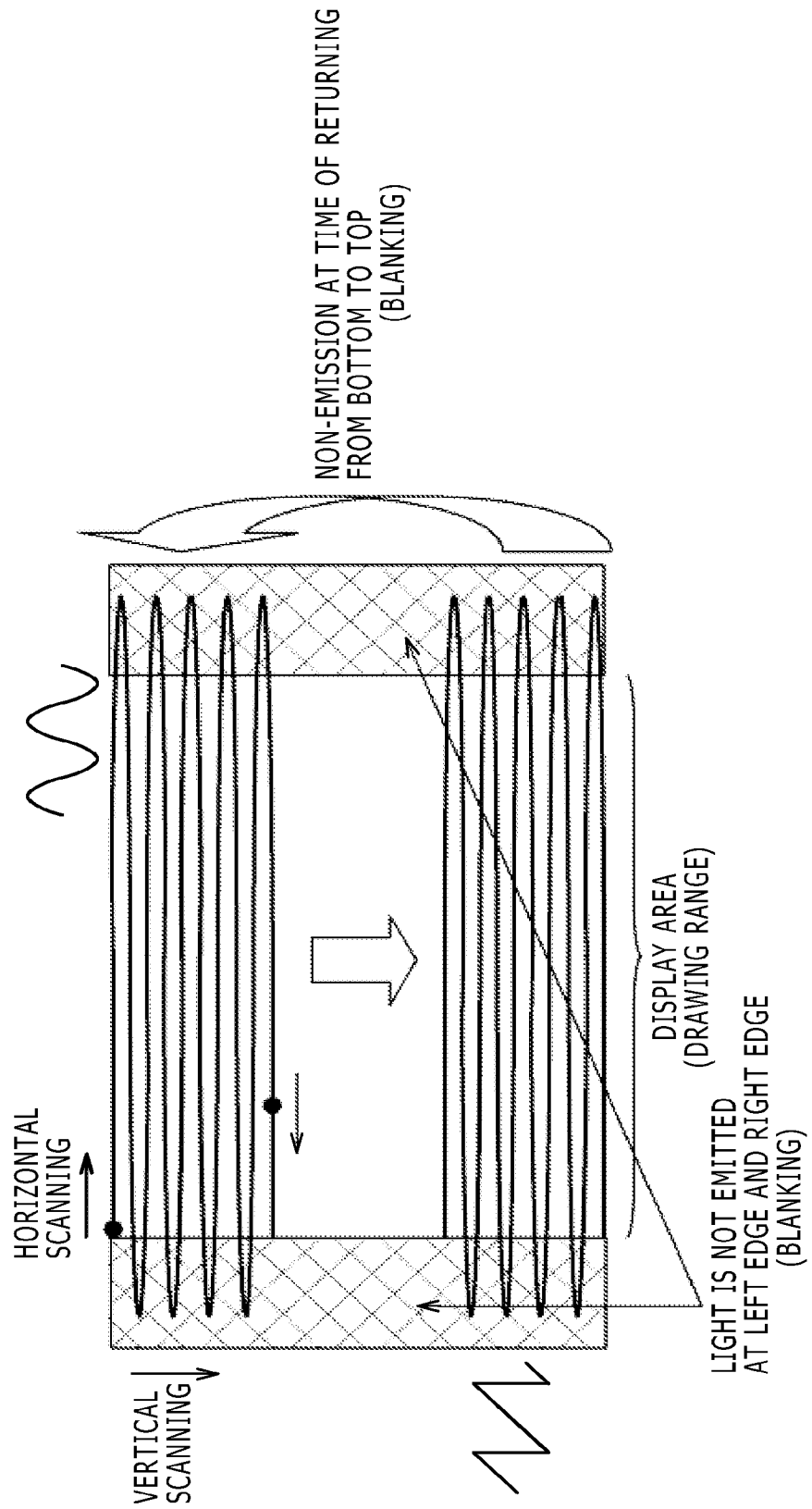
FIG. 2 is a diagram showing an example of a method of scanning on a screen by the laser beam scanning system.

The scanner driving circuit 16 includes driving circuits 161 and 162, buffers 163 and 164, an amplifier 165, a phase-shift circuit 166, and the like. The scanner driving circuit 16 drives the biaxial scanner 141 so as to form a desired irradiation angle while referring to the horizontal angle signal and the vertical angle signal. For example, when scanning as shown in FIG. 2 (so-called raster scanning) is performed, the biaxial scanner 141 is driven in a sinusoidal manner in the horizontal direction, while the biaxial scanner 141 is driven with a sawtooth waveform synchronized with the frame rate of the video signal in the vertical direction.

(Video Signal Interface)

An example of a video signal interface between the video signal processing circuit 11 and the laser driving circuit 12 will be described in the following with reference to FIG. 3.

In a case of 10-bit gradation video signals, 10 video signals are necessary for each of the wavelengths of red, green, and blue. Thus, when the video signals are transmitted as they are, the number of signal transmission lines is increased between the video signal processing circuit 11 and the laser driving circuit 12. Accordingly, data is multiplexed by parallel/serial conversion in order to reduce the number of signal transmission lines.

Figure 3:
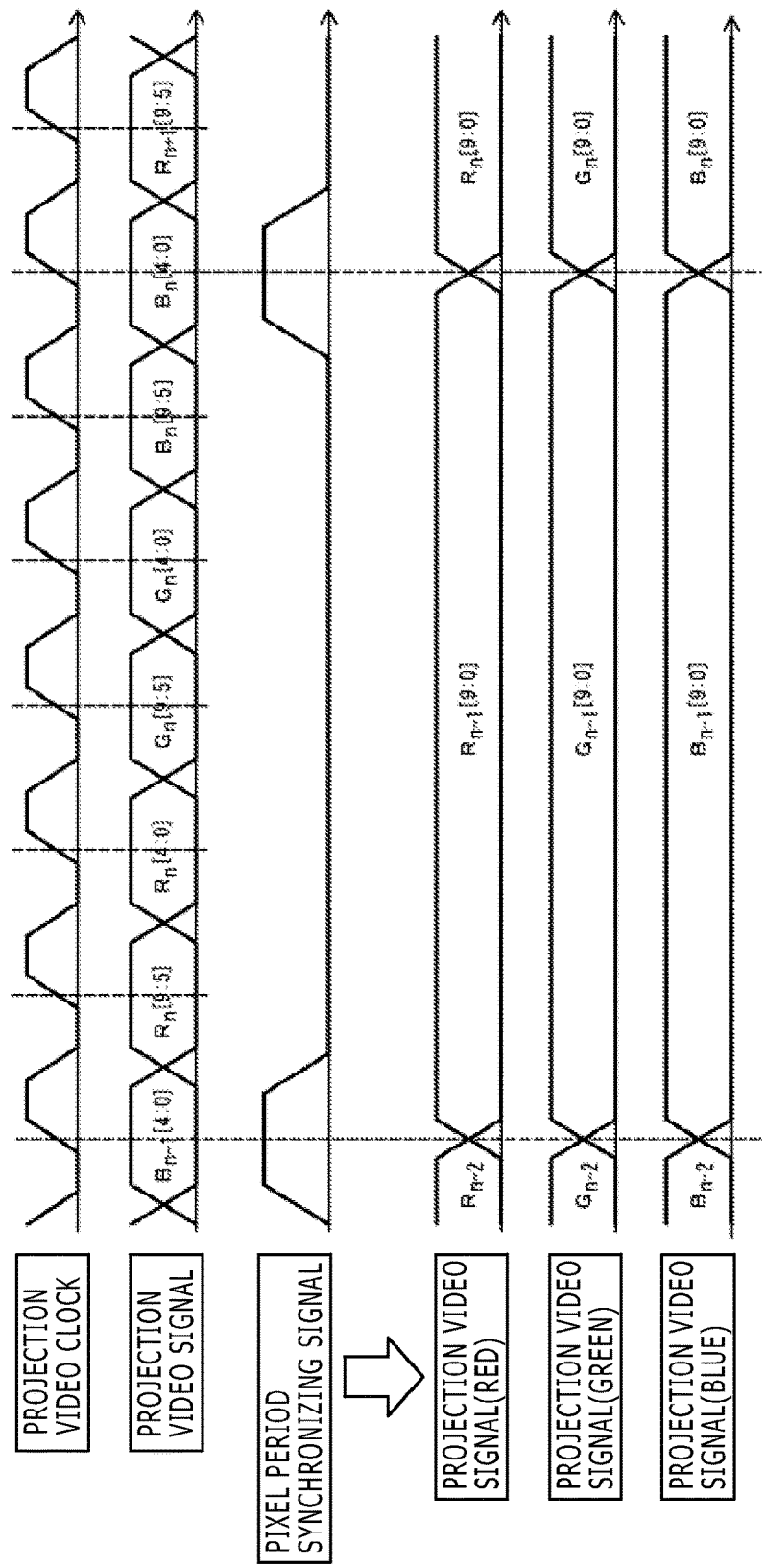
FIG. 3 is a diagram showing an example of a video signal interface between a video signal processing circuit and a laser driving circuit.

FIG. 3 shows an example in which 30 video signals are multiplexed into five video signals. In FIG. 3, a projection video signal is a signal output from the video signal processing circuit 11, and is obtained by subjecting the video signal of each pixel to parallel/serial conversion in ⅙ of a period of one pixel. One signal includes signals of 2 bits of each of red, green, and blue, and therefore 10-bit gradation signals for the three wavelengths can be transmitted by five video signals.

Meanwhile, on the side of the laser driving circuit 12, the multiplexed video signals are subjected to serial/parallel conversion to be separated into the video signal of each pixel, so that projection video signals (red, green, and blue) shown in FIG. 3 are generated. At this time, the laser driving circuit 12 needs a video signal clock having ⅙ of a period of one pixel and a pixel period synchronizing signal indicating a start of a pixel. The projection video clock signal and the pixel period synchronizing signal are therefore transmitted together with the projection video signal.

Incidentally, a parallel/serial conversion circuit on the side of the laser driving circuit 12 does not directly relate to the technology according to the present disclosure. Thus, the parallel/serial conversion circuit will be omitted in the following description, and suppose that the projection video signal is in a state after separation into each pixel of each wavelength as in the projection video signals (red, green, and blue) shown in FIG. 3.

(Speckle Noise)

Figure 4:
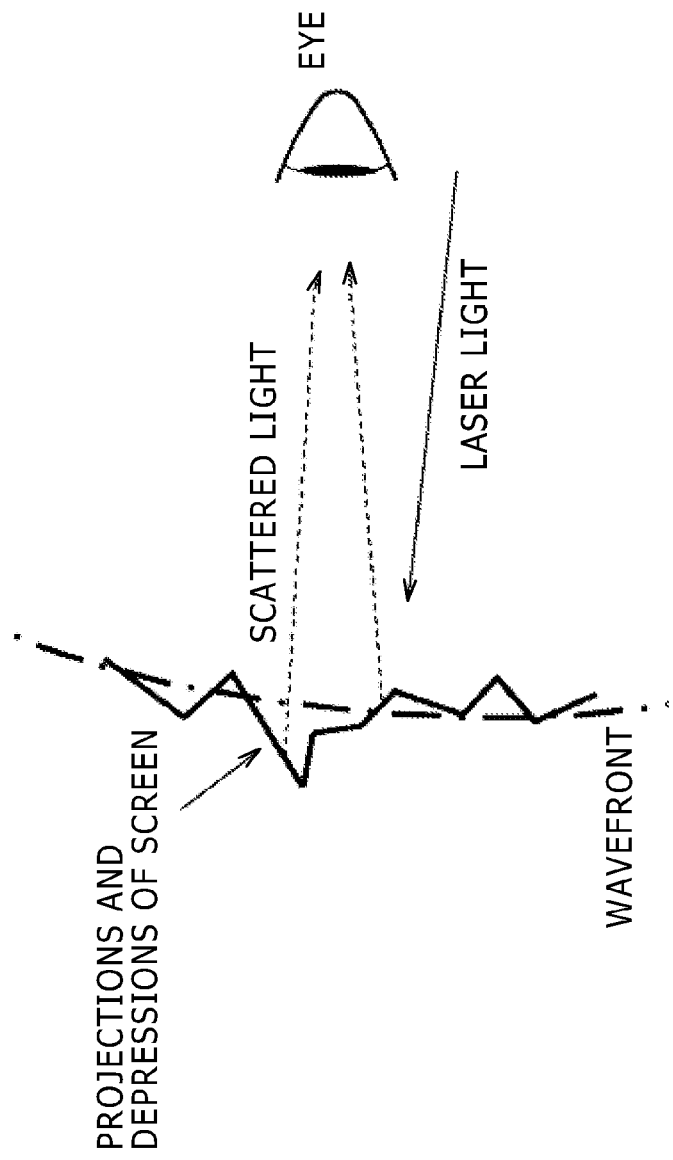
FIG. 4 is a model diagram of assistance in explaining speckle noise.

Problems in projector devices having a laser as a light source include speckle noise as innumerable speckles appearing in video on a screen. Speckle noise is explained by a model of FIG. 4. Specifically, laser light emitted from a projector device is reflected by a screen, and then enters an eye to form an image on a retina. At this time, minute projections and depressions of the screen randomly change optical path length from the laser light source to the retina on which the image is formed.

When coherent light uniform in wavelength and phase such as laser light or the like is emitted from a light source, a plurality of pieces of light different from each other in phase according to changes in optical path length enter the eye, and these pieces of light interfere with each other, causing interference fringes with a random distribution of intensity. The interference fringes are speckles appearing innumerably, that is, speckle noise. The technology according to the present disclosure is created to reduce the speckle noise caused by laser light as coherent light.

Figure 5:
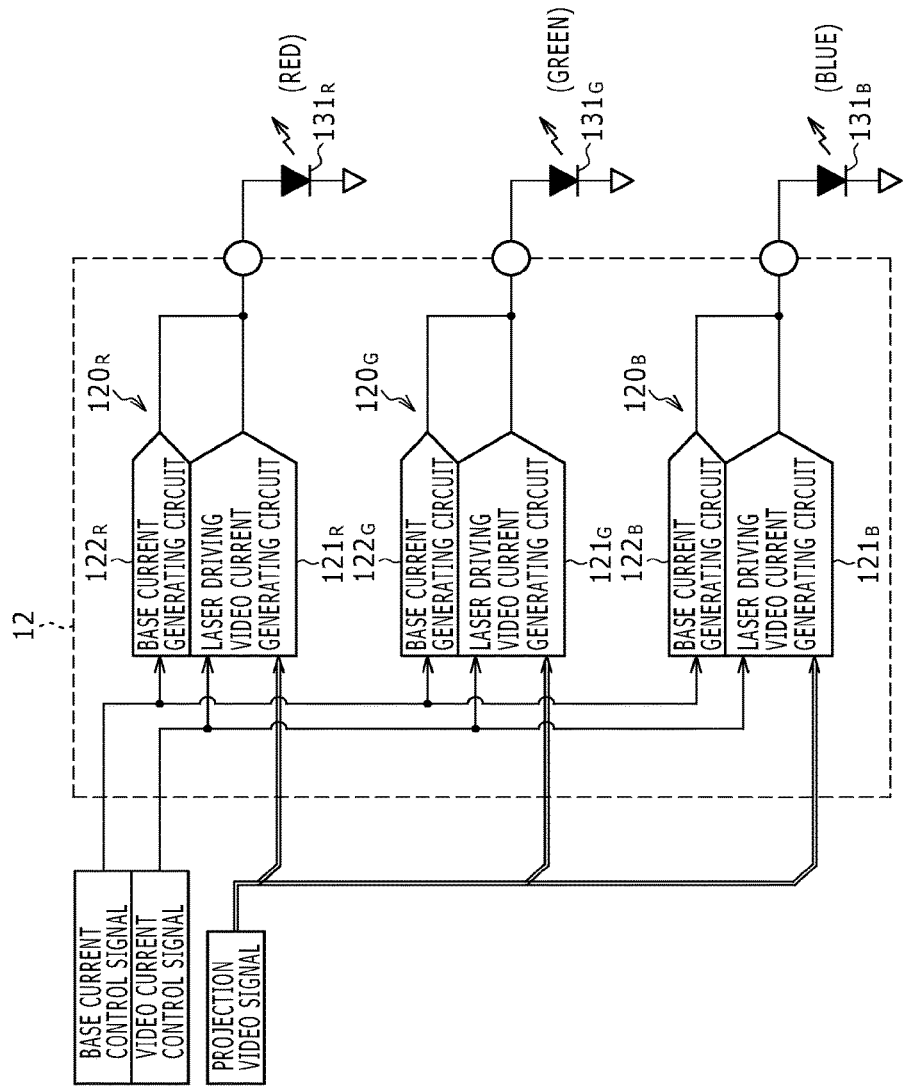
FIG. 5 is a block diagram showing a basic configuration of a laser driving circuit according to the present disclosure.

3. Basic Configuration of Laser Driving Circuit According to Present Disclosure A basic configuration of the laser driving circuit according to the present disclosure will next be described. FIG. 5 is a block diagram showing a basic configuration of the laser driving circuit 12 used in the projector device 10 of the laser beam scanning system as shown in FIG. 1, that is, the laser driving circuit according to the present disclosure.

As described above, three kinds of laser light sources $131_R$, $131_G$, and $131_B$ for red, green, and blue are generally used as light sources. In correspondence with this, the laser driving circuit 12 includes driving sections $120_R$, $120_G$, and $120_B$ corresponding in number to the number of light sources. In addition, as described earlier, the projection video signal corresponding to the respective wavelengths of the three kinds of laser light, which projection video signal is synchronized with the movement of the biaxial scanner 141 of the scanner section 14, is input to the laser driving circuit 12.

The driving sections $120_R$, $120_G$, and $120_B$ include laser driving video current generating circuits $121_R$, $121_G$, and $121_B$ and base current generating circuits $122_R$, $122_G$, and $122_B$. In the following, a configuration of the laser driving video current generating circuit $121_R$ and the base current generating circuit $122_R$ for red will be described concretely. However, the laser driving video current generating circuits $121_G$ and $121_B$ and the base current generating circuits $122_G$ and $122_B$ for green and blue each have a similar configuration.

The laser driving video current generating circuit $121_R$ amplifies the input projection video signal to a current value necessary for the emission of laser light, and outputs the current value as a laser driving current for driving the red laser light source $131_R$. In this case, the projection video signal input to the laser driving circuit 12 may be an analog signal, or may be a digital signal.

When the projection video signal is input as a digital signal, a circuit having a digital/analog converting function for converting the digital signal into an analog signal is used as the laser driving video current generating circuit $121_R$. At this time, a video current control signal supplied from the video signal processing circuit 11 to the laser driving circuit 12 controls full scale current in the digital/analog conversion.

Incidentally, FIG. 5 shows a circuit configuration in which a current is fed into the anodes of semiconductor lasers, for example, as the laser light sources $131_R$, $131_G$, and $131_B$. However, there may be a circuit configuration in which a current is pulled in from cathodes. Either of the circuit configurations is adopted arbitrarily.

Figure 6:
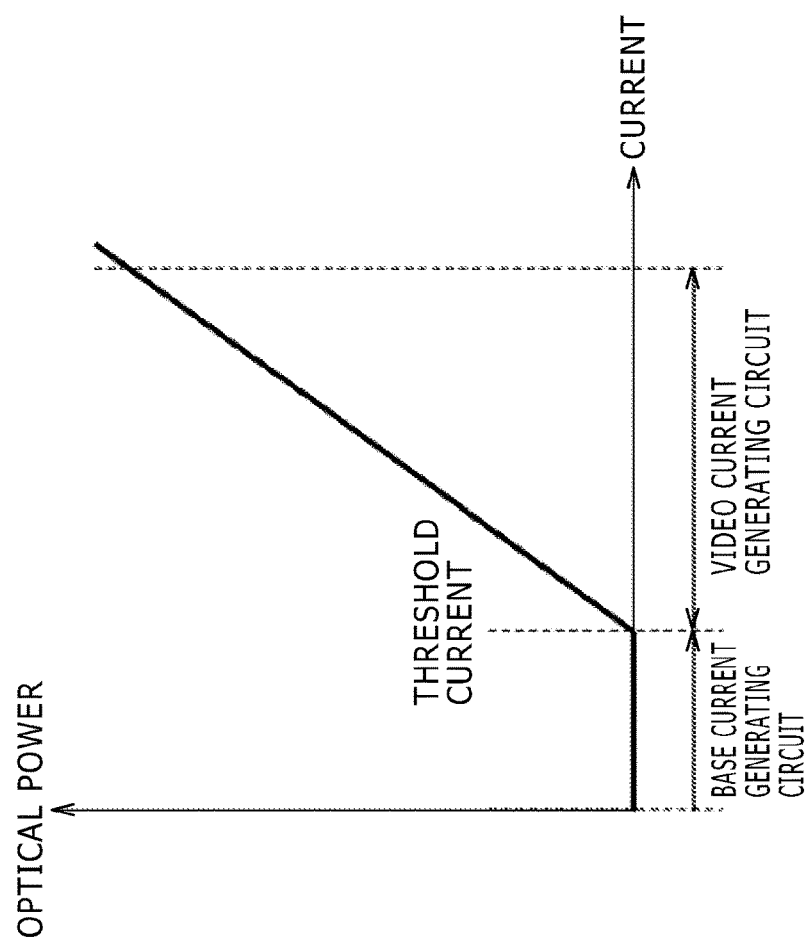
FIG. 6 is a diagram showing current-optical output characteristics of a semiconductor laser.

Semiconductor lasers have current-optical output characteristics as shown in FIG. 6, and do not output optical power in a range up to a threshold current. As shown in FIG. 6, the base current generating circuit $122_R$ is used to supply a threshold current component to the laser light source $131_R$. Thus supplying the threshold current component from the base current generating circuit $122_R$ to the laser light source $131_R$ enables effective use of a dynamic range of the laser driving video current generating circuit $121_R$.

Incidentally, the presence or absence of the base current generating circuit $122_R$ does not directly relate to the technology according to the present disclosure. Thus, in order to simplify the drawings and the like, the base current generating circuit $122_R$ will hereinafter be omitted in the description of embodiments and drawings.

The laser driving circuit 12 having the above-described configuration in the present disclosure is characterized by superimposing a high-frequency signal of a frequency exceeding the band of the video signal on the laser driving currents generated by the laser driving video current generating circuits $121_R$, $121_G$, and $121_B$.

Figure 7:
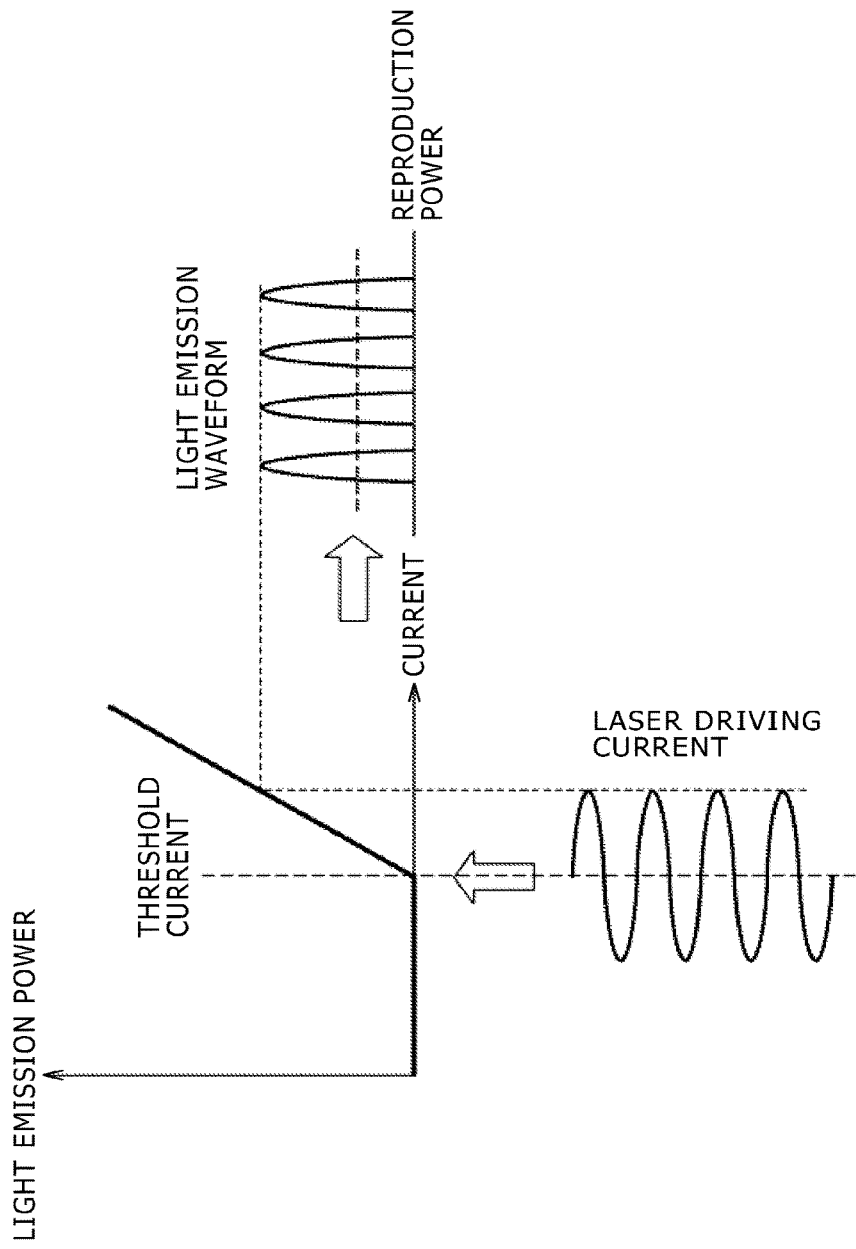
FIG. 7 is a conceptual diagram of superimposition of a high-frequency signal on laser driving current.
Figure 8A:
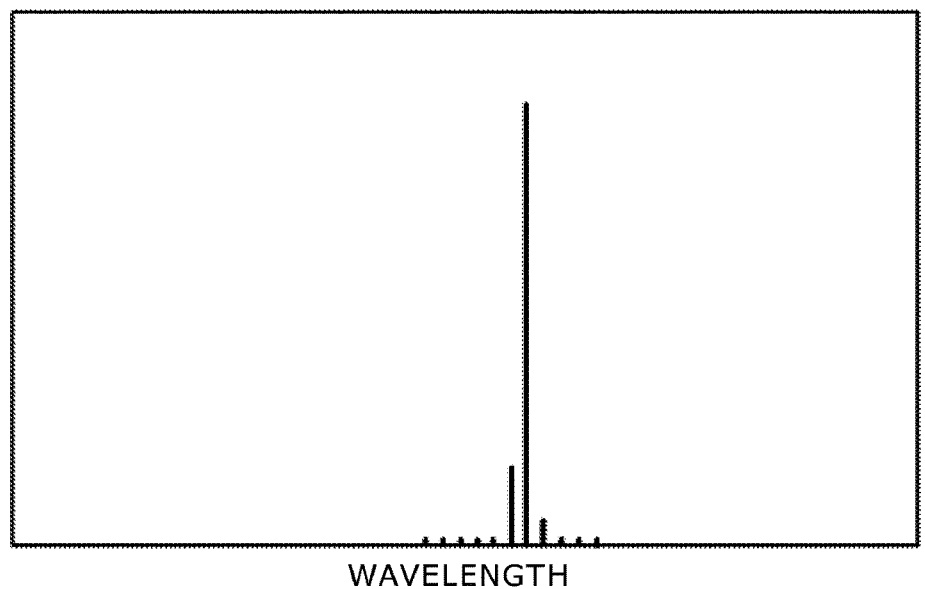
FIG. 8A is a diagram showing changes in wavelength spectrum of laser output light resulting from the superimposition of the high-frequency signal on the laser driving current in a case of single-mode oscillation (single mode)
Figure 8B:
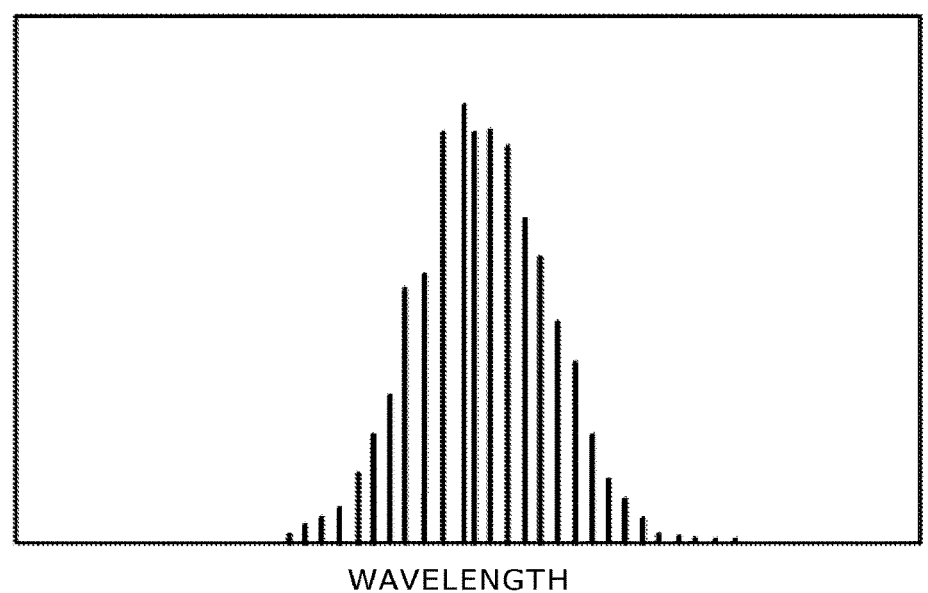
FIG. 8B is a diagram showing changes in wavelength spectrum of laser output light resulting from the superimposition of the high-frequency signal on the laser driving current in a case of multi-mode oscillation (multi mode).

When the high-frequency signal is superimposed, as shown in FIG. 7, modulation is applied with such amplitude as to straddle the threshold current of the semiconductor laser. FIG. 8A shows changes in wavelength spectrum of laser output light resulting from the superimposition of the high-frequency signal on the laser driving current in a case of single-mode oscillation (single mode). FIG. 8B shows changes in wavelength spectrum of laser output light resulting from the superimposition of the high-frequency signal on the laser driving current in a case of multi-mode oscillation (multi mode). A semiconductor laser inherently oscillates in a single mode (single mode), as shown in FIG. 8A. In this case, the coherence of laser light is strong (high).

On the other hand, when the high-frequency signal is superimposed on the laser driving current, the laser oscillates in a multi-mode (multi mode) including many wavelength components, as shown in FIG. 8B. In this case, the coherence of laser light is weak (decreased). In general, the larger the amplitude of the high-frequency signal superimposed on the laser driving current becomes, the wider the wavelength spectrum tends to be.

As described above, when the high-frequency signal is superimposed on the laser driving current based on the input video signal, and the laser light source is driven by the laser driving current on which the high-frequency signal is superimposed, the wavelength spectrum of the laser light emitted from the laser light source is widened, and thus the coherence is decreased. As a result, speckle noise caused by laser light as coherent light can be reduced.

The process of superimposing the high-frequency signal on laser driving current includes a process performed on the input side of the laser driving video current generating circuits $121_R$, $121_G$, and $121_B$ and a process performed on the output side of the plurality of laser driving video current generating circuits. Concrete description will be made below of a configuration in which the process is performed on the input side as a first embodiment, and of a configuration in which the process is performed on the output side as a second embodiment.

4. First Embodiment

In the first embodiment, the process of superimposing the high-frequency signal on the laser driving current is performed on the input side of the plurality of laser driving video current generating circuits $121_R$, $121_G$, and $121_B$. Specifically, the video signal (projection video signal) to be input to these laser driving video current generating circuits $121_R$, $121_G$, and $121_B$ are switched according to the high-frequency signal. Concrete examples for switching the projection video signal according to the high-frequency signal will be described in the following.

4-1. First Example

FIG. 9 is a block diagram showing a configuration of a laser driving circuit according to a first example. The laser driving circuit $12_A$ according to the first example uses an oscillator (hereinafter described as a "superimposing signal oscillator") 123 incorporated in the laser driving circuit $12_A$ as a signal source of a high-frequency signal of a frequency exceeding the band of a video signal. In addition, the laser driving circuit $12_A$ according to the first example includes a plurality of amplifiers/attenuators (two in the present example) $124_A$ and $124_B$ and a two-input one-output switch (video signal switch) 125 for each of the laser driving video current generating circuits $121_R$, $121_G$, and $121_B$ on the input side thereof.

The superimposing signal oscillator 123, the amplifiers/attenuators $124_A$ and $124_B$, and the video signal switch 125 form a high-frequency superimposing section configured to superimpose the high-frequency signal on laser driving currents generated by the laser driving video current generating circuits $121_R$, $121_G$, and $121_B$. The laser driving video current generating circuits and the high-frequency superimposing section in the laser driving circuit correspond to a laser driving video current generating step and a high-frequency superimposing step in a laser driving method according to the present disclosure. The same is true for each of examples to be described below.

The functions of the amplifiers/attenuators $124_{A\_R}$ and $124_{B\_R}$ and the video signal switch $125_R$ on the red side will be concretely described in the following. However, the amplifiers/attenuators $124_{A\_G}$ and $124_{B\_G}$ and the video signal switch $125_G$ on the green side and the amplifiers/attenuators $124_{A\_B}$ and $124_{B\_B}$ and the video signal switch $125_B$ on the blue side have similar functions.

The two amplifiers/attenuators $124_{A\_R}$ and $124_{B\_R}$ have respective different gains, and generate two projection video signals of different amplitudes on the basis of an input projection video signal. The two projection video signals are two inputs to the video signal switch $125_R$. The video signal switch $125_R$ selects (switches) the two projection video signals generated by the two amplifiers/attenuators $124_{A\_R}$ and $124_{B\_R}$ according to the high-frequency signal supplied from the superimposing signal oscillator 123.

With the above configuration, the video signal switch $125_R$ can select the two projection video signals of different amplitudes according to the H/L of the high-frequency signal output by the superimposing signal oscillator 123. Here, H denotes a high level of the high-frequency signal, and L denotes a low level of the high-frequency signal. For example, when the gain of one of the two amplifiers/attenuators $124_{A\_R}$ and $124_{B\_R}$ is two, and the gain of the other of the amplifiers/attenuators $124_{A\_R}$ and $124_{B\_R}$ is zero, a projection video signal on which the high-frequency signal is superimposed as shown in FIG. 10 is generated, and input to the laser driving video current generating circuit $121_R$.

The laser driving video current generating circuit $121_R$ amplifies the projection video signal on which the high-frequency signal is superimposed to a current value necessary for driving the laser light source $131_R$, and supplies the current value as laser driving current to the laser light source $131_R$. At this time, the laser driving current is supplied to the laser light source $131_R$ and drives the laser light source $131_R$ as the current on which the high-frequency signal is superimposed.

The amplitude of the high-frequency signal superimposed on the laser driving current can be set arbitrarily by the gains of the two amplifiers/attenuators $124_{A\_R}$ and $124_{B\_R}$. As another example, when the gain of one of the two amplifiers/attenuators $124_{A\_R}$ and $124_{B\_R}$ is 1.75, and the gain of the other of the amplifiers/attenuators $124_{A\_R}$ and $124_{B\_R}$ is 0.25, a projection video signal, or in turn a laser driving current, on which the high-frequency signal of smaller amplitude than in FIG. 10 is superimposed, as shown in FIG. 11, can be generated.

As described above, according to the laser driving circuit $12_A$ according to the first example, the high-frequency signal whose amplitude is proportional to the level of the projection video signal can be superimposed on the laser driving current, as shown in FIG. 10 and FIG. 11. Thereby, in a part of a zero level of the projection video signal, the amplitude of the high-frequency signal superimposed on the laser driving current is also zero, so that a problem of emission of laser light in the part where luminance should be zero can be avoided. In addition, in a state in which the level of the projection video signal is zero, the laser light is not emitted, and thus the problem of speckle noise does not occur. Therefore the process of superimposing the high-frequency signal on the laser driving current is not necessary.

On the other hand, the higher the level of the projection video signal, the more conspicuous the speckle noise. For this, the higher the level of the projection video signal, the larger the amplitude of the high-frequency signal superimposed on the laser driving current, thus acting to strengthen (enhance) an effect of reducing the speckle noise.

Incidentally, in the present circuit example, one superimposing signal oscillator 123 is provided so as to be common to the laser driving video current generating circuits $121_R$, $121_G$, and $121_B$ for the respective wavelengths. However, superimposing signal oscillators 123 can be provided for the laser driving video current generating circuits $121_R$, $121_G$, and $121_B$, respectively.

Though the superimposed high-frequency signal is drawn in a sinusoidal form in the waveform of the laser driving current of FIG. 10, the superimposing signal oscillator 123 inherently oscillates the high-frequency signal as a rectangular wave. When there is no limitation to the frequency band of each circuit part of the laser driving circuit 12, the high-frequency signal superimposed on the laser driving current becomes a rectangular wave. However, the frequency used for high-frequency superimposition is generally a high frequency of about 300 [MHz], and the high-frequency signal as a rectangular wave is often blunted into a sinusoidal form due to the band limitation of the laser driving video current generating circuits 121 and the like. The same is true for each of the examples to be described below.

4-2. Second Example

FIG. 12 is a block diagram showing a configuration of a laser driving circuit according to a second example. The laser driving circuit $12_B$ according to the second example is obtained by omitting the two amplifiers/attenuators $124_A$ and $124_B$ in the laser driving circuit $12_A$ according to the first example, and has a circuit configuration that switches an input projection video signal directly according to a high-frequency signal.

In this case, a video signal switch 125 ($125_R$, $125_G$, and $125_B$) has the input projection video signal directly as one input thereto, and has a predetermined potential, for example a ground (GND) level as another input thereto. The video signal switch 125 thereby performs switching between the projection video signal and the ground level according to the high-frequency signal supplied from a superimposing signal oscillator 123. As a result, as shown in FIG. 13, the high-frequency signal of ½ of amplitude as compared with FIG. 10, for example, is superimposed on the projection video signal, or in turn laser driving current.

According to the laser driving circuit $12_B$ according to the second example, the circuit configuration can be simplified by the omission of the two amplifiers/attenuators $124_A$ and $124_B$ as compared with the laser driving circuit $12_A$ according to the first example. Even when the two amplifiers/attenuators $124_A$ and $124_B$ are not present, similar action and effect to those of the laser driving circuit $12_A$ according to the first example can be basically obtained.

Figure 13:
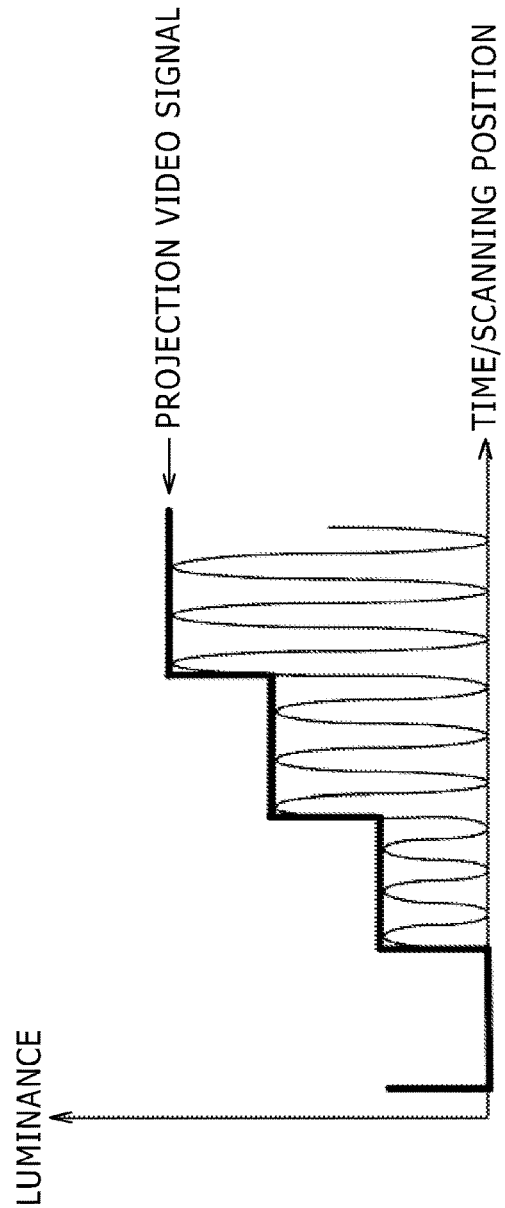
FIG. 13 is a waveform chart showing relation between a projection video signal and the amplitude of a high-frequency signal in the second example.

However, as is clear from comparison between FIG. 13 and FIG. 10, the amplitude of the high-frequency signal superimposed on the laser driving current is halved. When the high-frequency signal of amplitude equal to that in the case of FIG. 10 needs to be superimposed, it suffices to adjust the level of the projection video signal, that is, the level of the video signal input to the video signal processing circuit 11 in FIG. 1 to twice the level in advance.

4-3. Third Example

Figure 14:
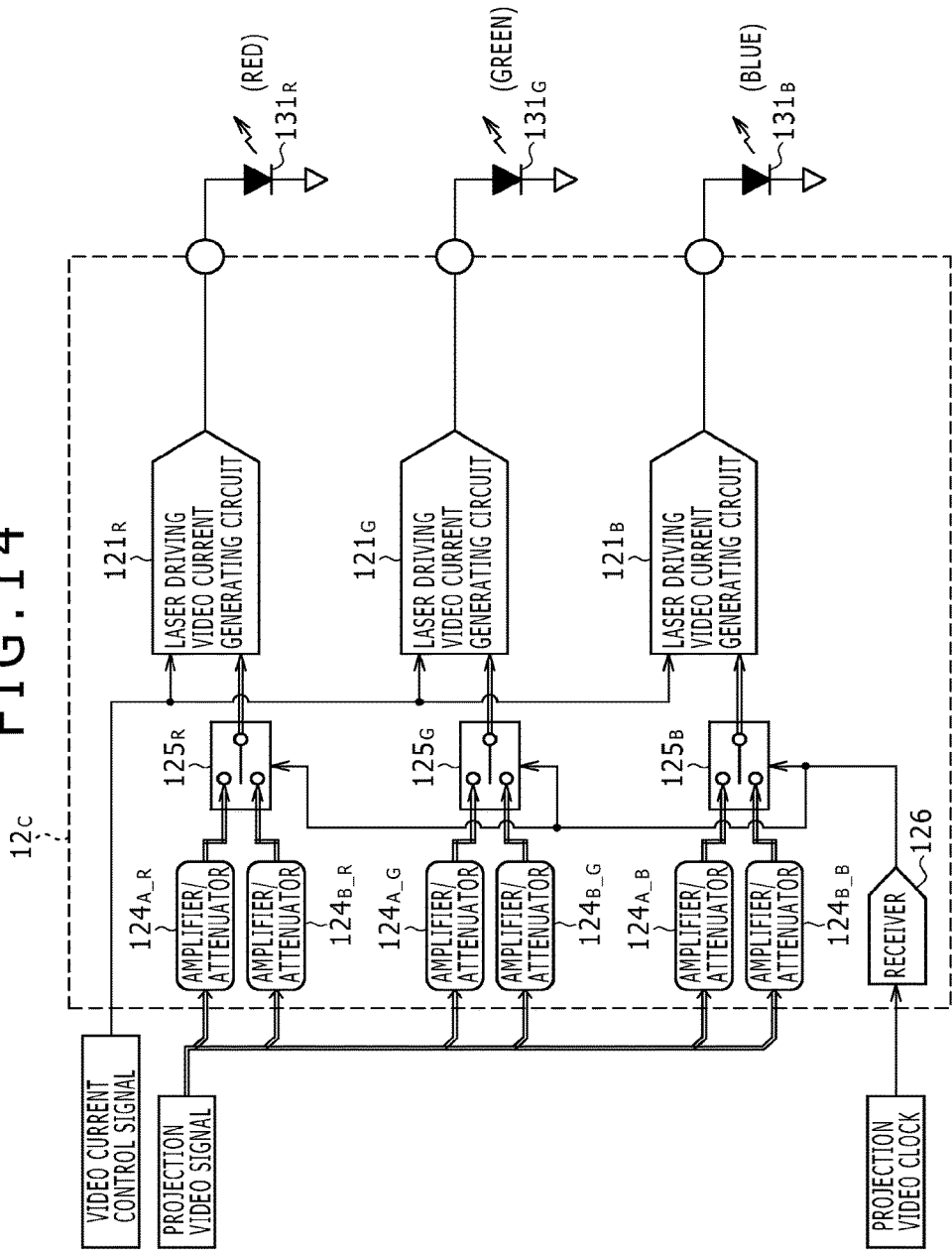
FIG. 14 is a block diagram showing a configuration of a laser driving circuit according to a third example.

FIG. 14 is a block diagram showing a configuration of a laser driving circuit according to a third example. The laser driving circuit $12_C$ according to the third example uses a receiver 126 in place of the built-in superimposing signal oscillator 123 in the laser driving circuit $12_A$ according to the first example. The receiver 126 receives an externally input projection video clock, specifically a projection video clock supplied from the video signal processing circuit 11 in FIG. 1.

The projection video clock is a clock signal having a higher frequency than the frequency band of the projection video signal and synchronized with periods of minimum units for repeating the brightness and darkness of the video signal, that is, synchronized with the video signal. As described above, the "minimum units" for repeating the brightness and darkness of the video signal correspond to pixels in a flat panel display such as a liquid crystal display, a plasma display device, an EL display device, or the like. In addition, the "periods of minimum units" are pixel periods in the flat panel display.

The receiver 126 receives the externally input projection video clock, and supplies the projection video clock as a high-frequency signal to be superimposed on laser driving current to a video signal switch 125 ($125_R$, $125_G$, and $125_B$). That is, the receiver 126 is a signal source of the high-frequency signal having a higher frequency than the frequency band of the projection video signal.

In the above configuration, the video signal switch 125 ($125_R$, $125_G$, and $125_B$) selects two projection video signals of different amplitudes by performing on (closing) operation/off (opening) operation according to the H/L of the projection video clock supplied from the receiver 126. Thereby, as in the case of the first example, the high-frequency signal whose amplitude is proportional to the level of the projection video signal can be superimposed on the laser driving current.

As a result, similar action and effect to those of the first example can be obtained. Specifically, in a part of a zero level of the projection video signal, the amplitude of the high-frequency signal superimposed on the laser driving current is also zero. In addition, the higher the level of the projection video signal, the larger the amplitude of the high-frequency signal superimposed on the laser driving current. Therefore an effect of reducing speckle noise can be strengthened.

In the cases of the first example and the second example, the built-in superimposing signal oscillator 123 is used as the signal source of the high-frequency signal, and the superimposing signal oscillator 123 is independent of the projection video signal. The high-frequency signal generated by the superimposing signal oscillator 123 is asynchronous to the projection video signal.

Figure 15:
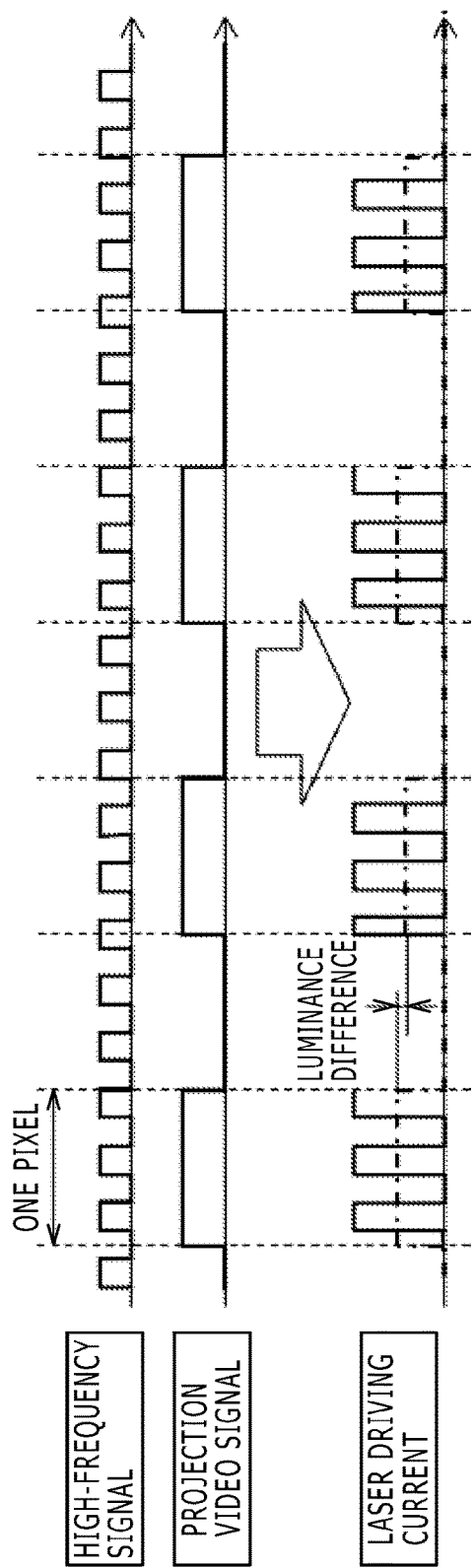
FIG. 15 is a waveform chart showing an example of laser driving current when a high-frequency signal asynchronous to a projection video signal is superimposed on the laser driving current.

The minimum units for repeating the brightness and darkness of the projection video signal will hereinafter be referred to as "pixel units" in order to facilitate understanding. FIG. 15 shows an example of laser driving current when the high-frequency signal generated by the built-in superimposing signal oscillator 123 is superimposed on the projection video signal repeating brightness and darkness in pixel units. In this example, the high-frequency signal has 2.75 periods for one pixel interval.

The input projection video signal has a same level during all of brightness intervals. The light emission of laser light according to the high-frequency signal is performed 3 times and 2.5 times repeatedly, and a change in luminance occurs in every other brightness interval. Alternate long and short dashed lines in the waveform of the laser driving current of FIG. 15 represent an average current, and a difference between average currents is a difference in luminance.

This, in the example in which letting $f_v$ be a pixel frequency, the frequency $f_h$ of the high-frequency signal is $f_h=5.5 \times f_v$, can be regarded as a difference between a harmonic of five times the pixel frequency: $5 \times f_v$ and the frequency of the high-frequency signal: $5.5 \times f_v$.

Figure 16:
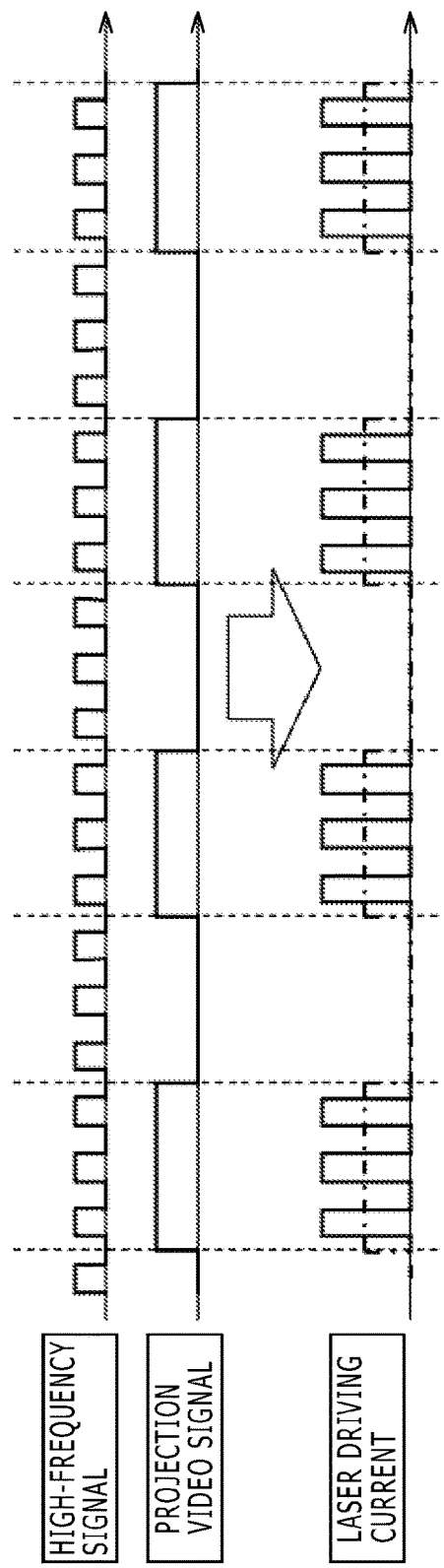
FIG. 16 is a waveform chart showing an example of the laser driving current when the high-frequency signal synchronized with the projection video signal is superimposed on the laser driving current.

On the other hand, according to the laser driving circuit $12_C$ according to the third example, the projection video clock synchronized with the projection video signal can be superimposed as high-frequency signal on the laser driving current. FIG. 16 shows an example in which the high-frequency signal has 3.0 periods for one pixel interval. As is clear from FIG. 16, because the high-frequency signal synchronized with the projection video signal is superimposed on the laser driving current, the number of times of light emission of laser light according to the high-frequency signal during one pixel interval is always constant, and thus there is no fear of luminance variation as observed in the case of asynchronism.

The technique using the receiver 126 for receiving the externally input projection video clock is applied to the first example. However, the technique can be not only applied to the first example but also applied similarly to the second example.

4-4. Fourth Example

Figure 17:
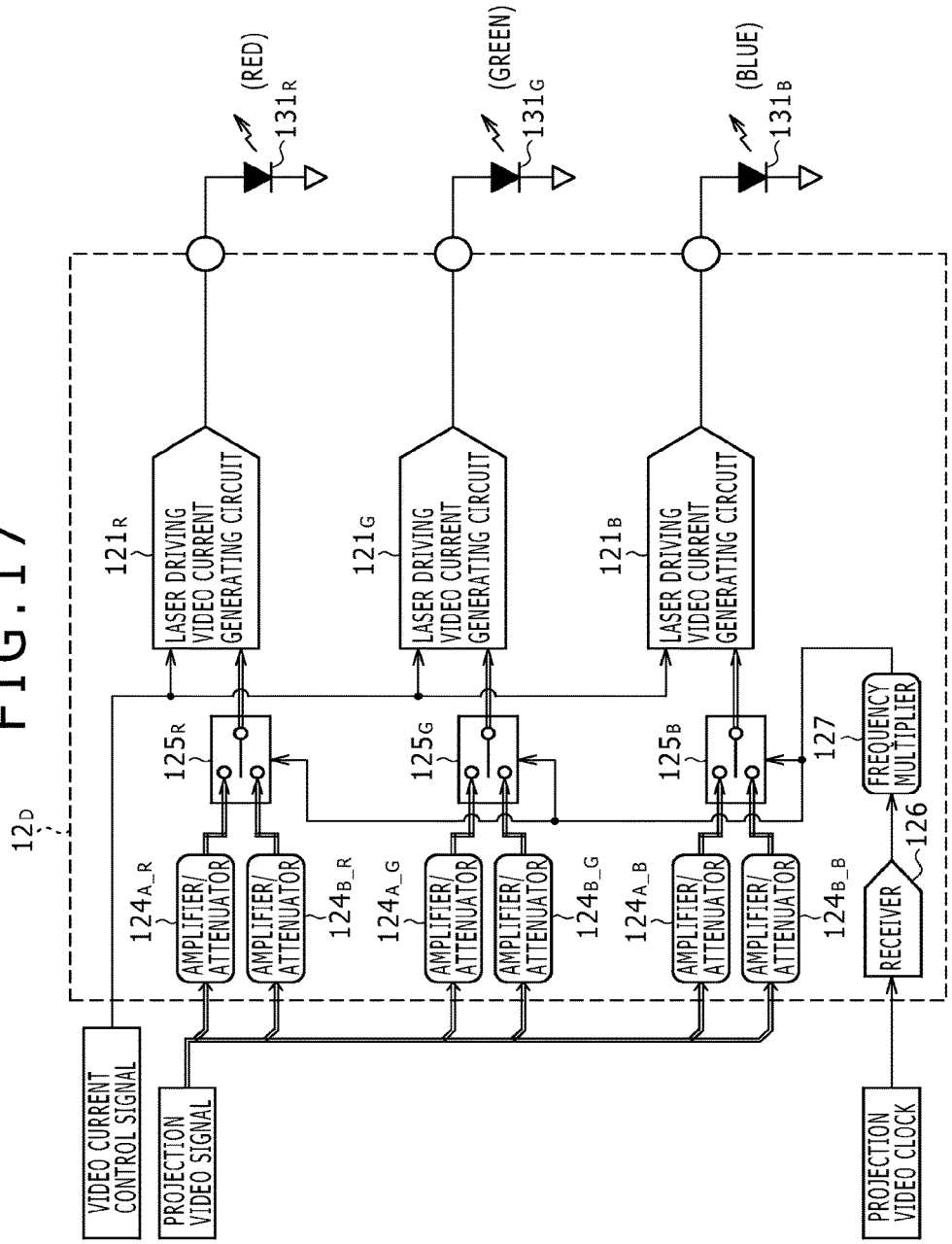
FIG. 17 is a block diagram showing a configuration of a laser driving circuit according to a fourth example.

FIG. 17 is a block diagram showing a configuration of a laser driving circuit according to a fourth example. The laser driving circuit $12_D$ according to the fourth example includes a frequency multiplier 127 in a stage subsequent to the receiver 126 in the laser driving circuit $12_C$ according to the third example. The frequency multiplier 127 is formed by a PLL circuit or the like, and generates, as a high-frequency signal, a clock signal having a frequency that is an integral multiple of that of the projection video clock received by the receiver 126 and which clock signal is synchronized with the projection video clock.

In the above configuration, a video signal switch 125 ($125_R$, $125_G$, and $125_B$) selects two projection video signals of different amplitudes by performing on/off operation according to the H/L of the clock signal supplied from the frequency multiplier 127. Thereby, as in the case of the first example, the high-frequency signal whose amplitude is proportional to the level of the projection video signal can be superimposed on laser driving current.

As a result, similar action and effect to those of the first example can be obtained. Specifically, in a part of a zero level of the projection video signal, the amplitude of the high-frequency signal superimposed on the laser driving current is also zero. In addition, the higher the level of the projection video signal, the larger the amplitude of the high-frequency signal superimposed on the laser driving current. Therefore an effect of reducing speckle noise can be strengthened.

The action and effect of disposing the frequency multiplier 127 in the stage subsequent to the receiver 126 will be described by comparison with the third example.

In the third example, the video signal processing circuit 11 in FIG. 1 needs to generate the projection video clock synchronized with the pixel frequency of the projection video signal and having a frequency highly effective in reducing speckle noise. On the other hand, according to the laser driving circuit $12_D$ according to the fourth example, it suffices for the projection video clock to be synchronized with the pixel frequency of the projection video signal, and due to the action of the frequency multiplier 127, the high-frequency signal of a frequency highly effective in reducing speckle noise can be generated within the laser driving circuit $12_D$. It is therefore rendered unnecessary to generate the projection video clock having a frequency highly effective in reducing speckle noise in the video signal processing circuit 11, and transmit the projection video clock from the video signal processing circuit 11 to the laser driving circuit $12_D$.

5. Second Embodiment

In a second embodiment, a process of superimposing a high-frequency signal on laser driving current is performed on the output side of a plurality of laser driving video current generating circuits $121_R$, $121_G$, and $121_B$. Concrete examples for superimposing a high-frequency signal on laser driving current will be described in the following.

5-1. Fifth Example

Figure 18:
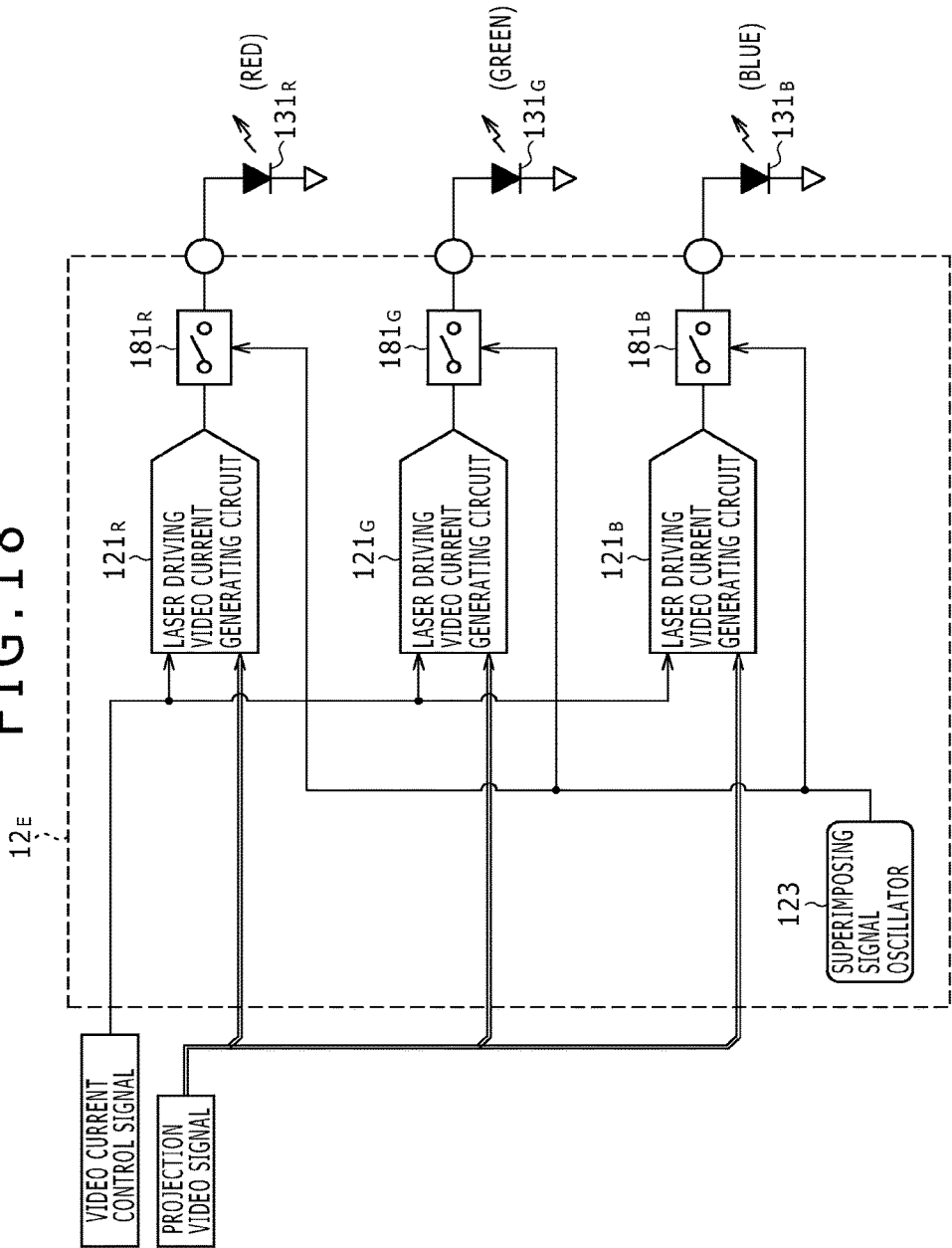
FIG. 18 is a block diagram showing a configuration of a laser driving circuit according to a fifth example.

FIG. 18 is a block diagram showing a configuration of a laser driving circuit according to a fifth example. The laser driving circuit $12_E$ according to the fifth example includes, as a high-frequency superimposing section, a laser driving current switch 181 ($181_R$, $181_G$, and $181_B$) for each of laser driving video current generating circuits $121_R$, $121_G$, and $121_B$ on the output side of the laser driving video current generating circuits $121_R$, $121_G$, and $121_B$ in addition to a built-in superimposing signal oscillator 123. The laser driving current switches $181_R$, $181_G$, and $181_B$ have a function of passing/interrupting laser driving currents generated by the laser driving video current generating circuits $121_R$, $121_G$, and $121_B$.

In the laser driving circuit $12_E$ according to the fifth example having the above configuration, the passage/interruption of the laser driving current switch 181 is controlled according to a high-frequency signal supplied from the superimposing signal oscillator 123, whereby the high-frequency signal can be superimposed on the laser driving currents generated by the laser driving video current generating circuits $121_R$, $121_G$, and $121_B$.

Also in this case, as in the first example, the high-frequency signal whose amplitude is proportional to the level of a projection video signal can be superimposed on the laser driving currents (see FIG. 10). As a result, similar action and effect to those of the first example can be obtained. Specifically, in a part of a zero level of the projection video signal, the amplitude of the high-frequency signal superimposed on the laser driving currents is also zero. In addition, the higher the level of the projection video signal, the larger the amplitude of the high-frequency signal superimposed on the laser driving currents. Therefore an effect of reducing speckle noise can be strengthened.

5-2. Sixth Example

Figure 19:
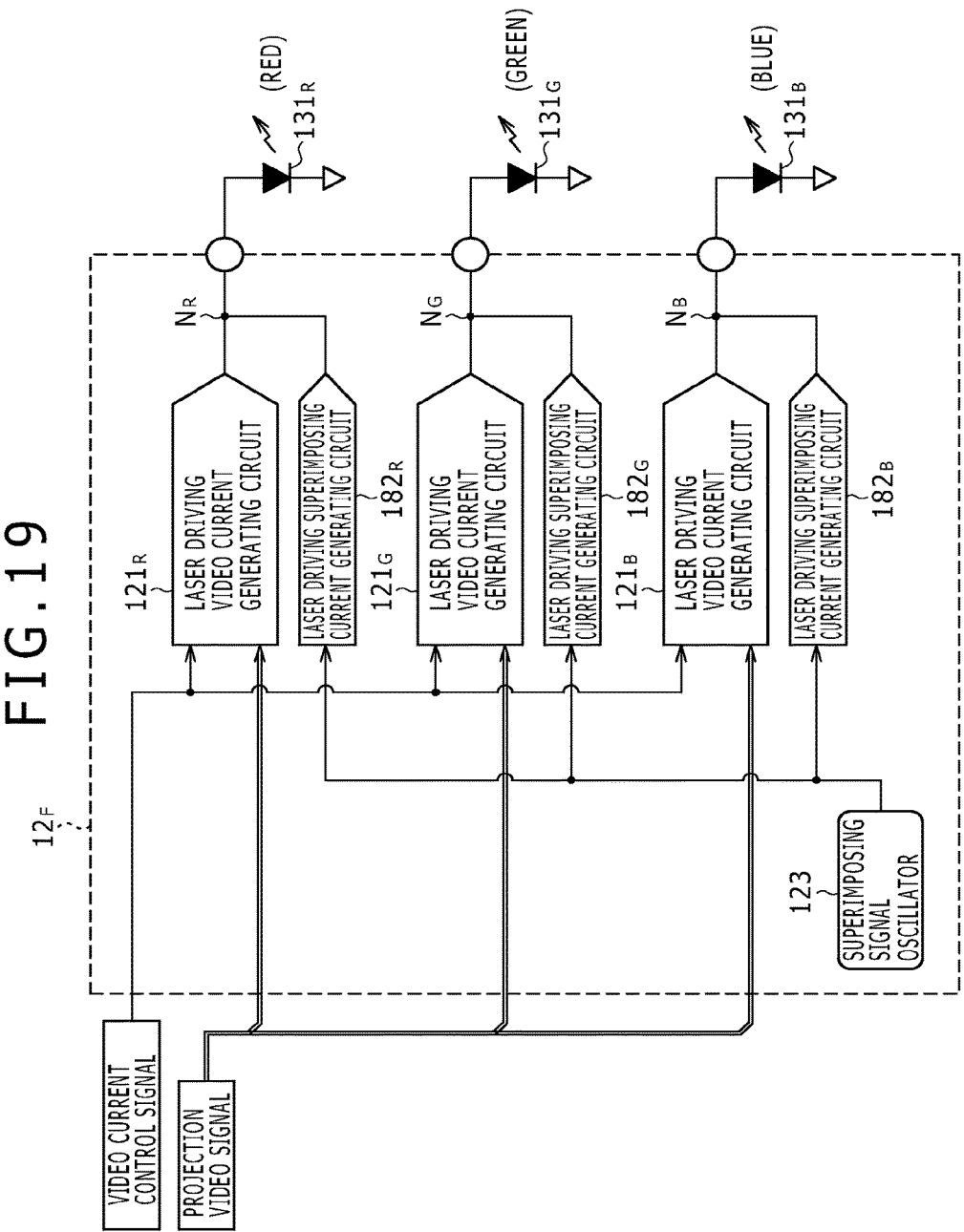
FIG. 19 is a block diagram showing a configuration of a laser driving circuit according to a sixth example.

FIG. 19 is a block diagram showing a configuration of a laser driving circuit according to a sixth example. The laser driving circuit $12_F$ according to the sixth example includes, as a high-frequency superimposing section, a laser driving superimposing current generating circuit 182 ($182_R$, $182_G$, and $182_B$) for amplifying a high-frequency signal supplied from a built-in superimposing signal oscillator 123, in addition to the superimposing signal oscillator 123. The laser driving superimposing current generating circuits $182_R$, $182_G$, and $182_B$ have output terminals thereof connected to connection nodes $N_R$, $N_G$, and $N_B$ on the output side of laser driving video current generating circuits $121_R$, $121_G$, and $121_B$.

In the laser driving circuit $12_F$ according to the sixth example having the above configuration, the laser driving superimposing current generating circuits $182_R$, $182_G$, and $182_B$ amplify the high-frequency signal output from the superimposing signal oscillator 123 to a level necessary for driving laser light sources $131_R$, $131_G$, and $131_B$. Then, high-frequency currents output from the laser driving superimposing current generating circuits $182_R$, $182_G$, and $182_B$ are added to the output currents of the laser driving video current generating circuits $121_R$, $121_G$, and $121_B$, that is, the laser driving currents at the connection nodes $N_R$, $N_G$, and $N_B$, and then supplied to the laser light sources $131_R$, $131_G$, and $131_B$.

Figure 20:
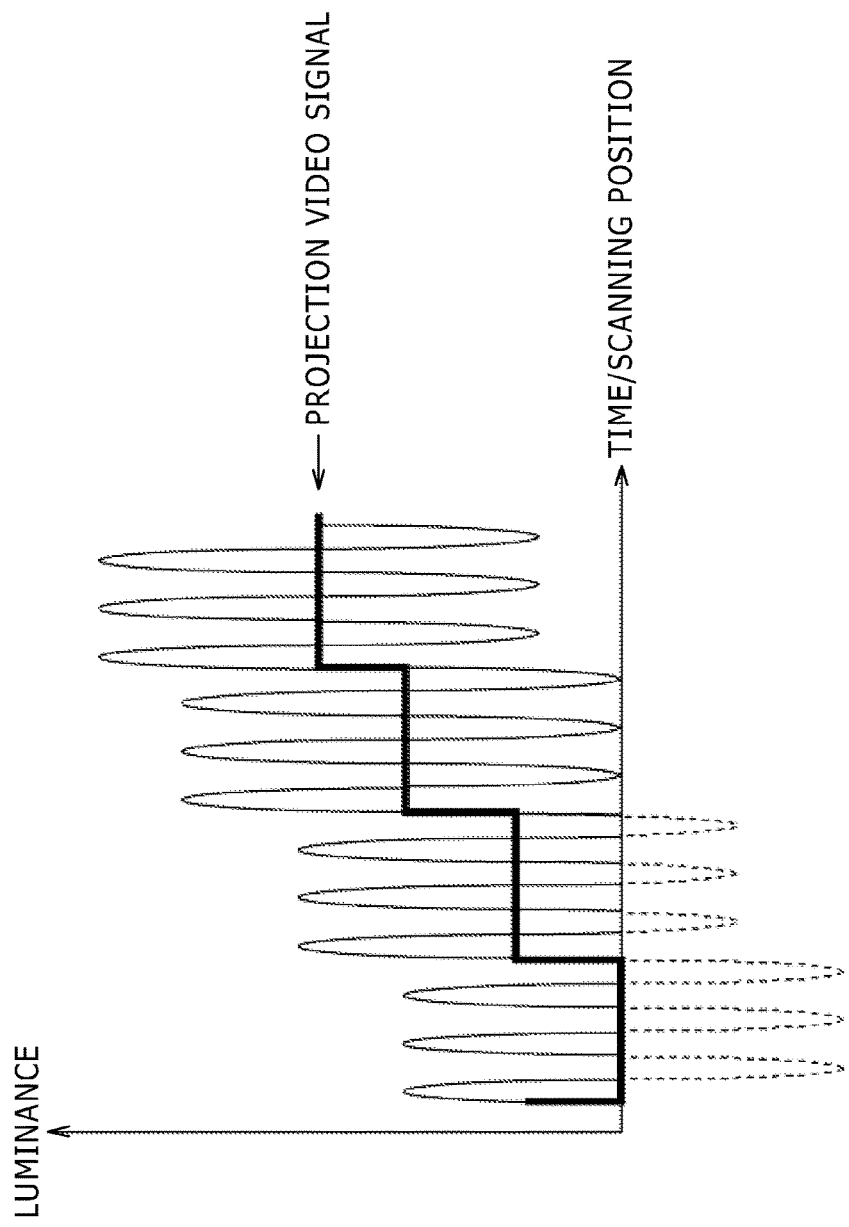
FIG. 20 is a waveform chart showing relation between a projection video signal and the amplitude of a high-frequency signal in the sixth example.

In the case of the laser driving circuit $12_F$ according to the sixth example, as shown in FIG. 20, the high-frequency currents of a fixed amplitude are superimposed on the laser driving currents irrespective of the level of a projection video signal. Thereby, though an effect as in the case of the superimposition such that the amplitude of the high-frequency signal is proportional to the level of the projection video signal cannot be obtained, an effect of high-frequency superimposition, that is, an effect of reducing speckle noise as a result of widening the wavelength spectrum of laser light and decreasing coherence can be obtained.

However, when the high-frequency currents of a fixed amplitude are superimposed on the laser driving currents, because negative current cannot be fed, a wavelength such that negative current is cut off is obtained as the laser driving currents, as indicated by broken lines in FIG. 20. In this case, even when the level of the projection video signal is zero, the amplitude on the positive side of the high-frequency signal is superimposed, so that laser light is emitted. Thus, luminance is not lowered to zero, which may impair the contrast of video.

5-3. Seventh Example

Figure 21:
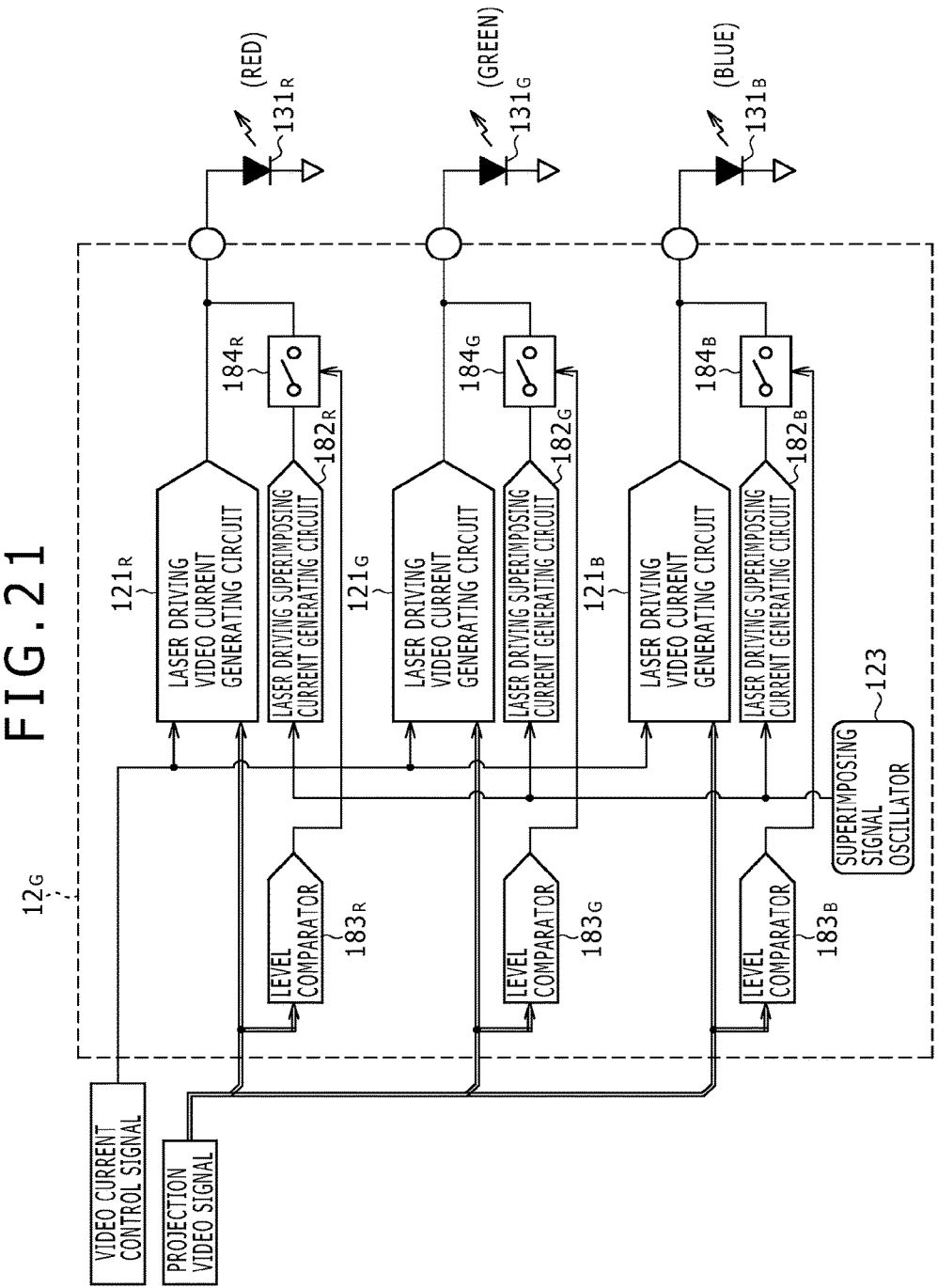
FIG. 21 is a block diagram showing a configuration of a laser driving circuit according to a seventh example.

FIG. 21 is a block diagram showing a configuration of a laser driving circuit according to a seventh example. The laser driving circuit $12_G$ according to the seventh example includes, as a high-frequency superimposing section, a level comparator 183 and a superimposing current switch 184 for each of laser driving video current generating circuits $121_R$, $121_G$, and $121_B$ in addition to a built-in superimposing signal oscillator 123 and a laser driving superimposing current generating circuit 182.

The level comparator 183 ($183_R$, $183_G$, and $183_B$) has a function of determining the magnitude of the level of an input projection video signal with respect to a predetermined threshold value. The predetermined threshold value is a threshold value for determining the level of the projection video signal, and is set at a value in the vicinity of a zero level of the projection video signal. Here, "the vicinity of a zero level" includes not only levels somewhat higher or lower than the zero level but also the zero level. In detecting the zero level of the projection video signal, various variations in the predetermined threshold value which variations occur in design or in manufacturing are tolerated.

The superimposing current switches $184_R$, $184_G$, and $184_B$ are connected between the output terminals of the laser driving superimposing current generating circuits $182_R$, $182_G$, and $182_B$ and the output terminals of the laser driving video current generating circuits $121_R$, $121_G$, and $121_B$. The superimposing current switches $184_R$, $184_G$, and $184_B$ perform on (closing)/off (opening) operation according to comparison results (determination results) of the level comparators $183_R$, $183_G$, and $183_B$.

In the laser driving circuit $12_G$ according to the seventh example having the above configuration, when the level comparator 183 determines that the level of the video signal exceeds the predetermined threshold value, the level comparator 183 sets the superimposing current switch 184 in a conducting (on) state on the basis of the result of the determination. Thereby, the high-frequency current output from the laser driving superimposing current generating circuit 182 passes through the superimposing current switch 184, and is added to (superimposed on) the laser driving current output from the laser driving video current generating circuit 121.

Figure 22:
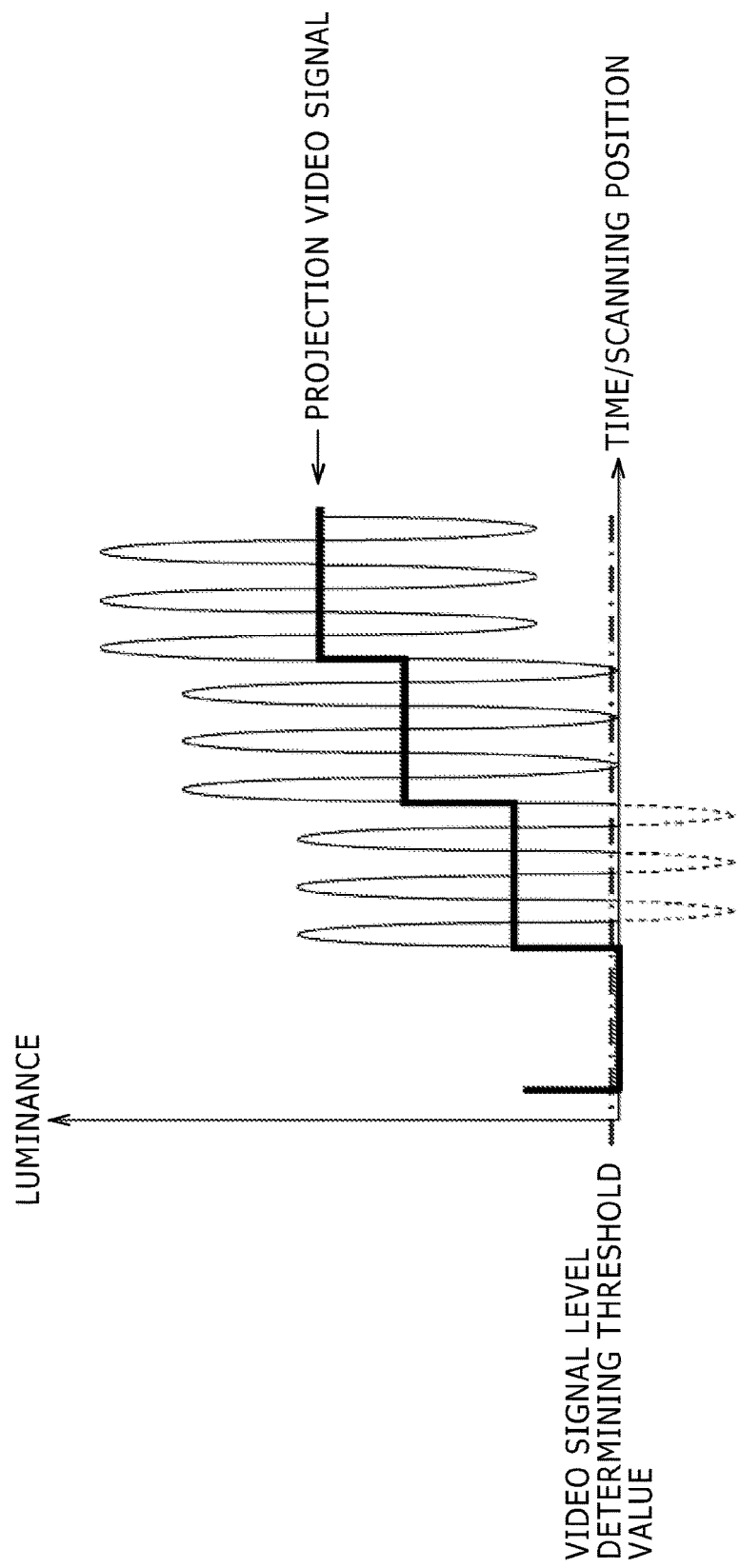
FIG. 22 is a waveform chart showing relation between a projection video signal and the amplitude of a high-frequency signal in the seventh example.

According to the laser driving circuit $12_G$ according to the present seventh example, in addition to the effect of high-frequency superimposition, the level comparator 183 can act to prevent the high-frequency signal from being superimposed on the laser driving current when detecting that the level of the projection video signal is zero (equal to or lower than the predetermined threshold value), as shown in FIG. 22. As a result, when the level of the projection video signal is zero, laser light is not emitted, and therefore luminance can be lowered to zero.

5-4. Eighth Example

FIG. 23 is a block diagram showing a configuration of a laser driving circuit according to an eighth example. The laser driving circuit $12_H$ according to the eighth example includes a multiplier 185 ($185_R$, $185_G$, and $185_B$) for each of laser driving video current generating circuits $121_R$, $121_G$, and $121_B$ in place of the level comparator 183 and the superimposing current switch 184 in the laser driving circuit $12_G$ according to the third example.

The multipliers $185_R$, $185_G$, and $185_B$ are supplied with a high-frequency signal output from a superimposing signal oscillator 123 and projection video signals of respective wavelengths, and multiply together the high-frequency signal and the projection video signals. The respective output signals of the multipliers $185_R$, $185_G$, and $185_B$ are input to laser driving superimposing current generating circuits $182_R$, $182_G$, and $182_B$. The laser driving superimposing current generating circuits $182_R$, $182_G$, and $182_B$ amplify the respective output signals of the multipliers $185_R$, $185_G$, and $185_B$ to a level necessary for laser driving. The respective output currents of the laser driving superimposing current generating circuits $182_R$, $182_G$, and $182_B$ are added to the respective output currents of the laser driving video current generating circuits $121_R$, $121_G$, and $121_B$ at connection nodes $N_R$, $N_G$, and $N_B$.

A process of superimposing the high-frequency signal on the laser driving current in the laser driving circuit $12_H$ according to the eighth example having the above configuration will be described with reference to waveform charts of FIGS. 24A to 24E.

The multiplier 185 is supplied with the projection video signal shown in FIG. 24A and the high-frequency signal generated by the superimposing signal oscillator 123 as shown in FIG. 24B. As a result of the two signals being multiplied together by the multiplier 185, as shown in FIG. 24C, the output signal of the multiplier 185 is a high-frequency signal that changes in amplitude according to the level of the projection video signal.

Meanwhile, the laser driving current based on the projection video signal which laser driving current is shown in FIG. 24D is output from the laser driving video current generating circuit 121. Then, at the connection nodes $N_R$, $N_G$, and $N_B$, the output signal of the multiplier 185, that is, the output current of the laser driving superimposing current generating circuit 182 and the laser driving current are added together. Thereby, as in the case of the first example in the first embodiment (see FIG. 10), as shown in FIG. 24E, the high-frequency signal that changes in amplitude according to the level of the projection video signal can be superimposed on the laser driving current.

As a result, similar action and effect to those of the first example can be obtained. Specifically, in a part of a zero level of the projection video signal, the amplitude of the high-frequency signal superimposed on the laser driving current is also zero. In addition, the higher the level of the projection video signal, the larger the amplitude of the high-frequency signal superimposed on the laser driving current. Therefore an effect of reducing speckle noise can be strengthened.

Here, respective gains of the multipliers $185_R$, $185_G$, and $185_B$ and the laser driving superimposing current generating circuits $182_R$, $182_G$, and $182_B$ can be made adjustable, and the amplitude of the high-frequency signal to be superimposed on the laser driving current can be changed by adjusting these gains. For example, as shown in FIG. 25, the high-frequency signal of a somewhat smaller amplitude than in the case shown in FIG. 24E can be superimposed on the laser driving current by setting the amplitude of the high-frequency signal to be added relatively somewhat small.

In this case, in addition to making adjustable the gains of both of the multipliers $185_R$, $185_G$, and $185_B$ and the laser driving superimposing current generating circuits $182_R$, $182_G$, and $182_B$, it is also possible to make adjustable the gains of either the multipliers $185_R$, $185_G$, and $185_B$ or the laser driving superimposing current generating circuits $182_R$, $182_G$, and $182_B$.

5-5. Ninth Example

Each of the fifth to eighth examples described above has a configuration using the oscillator 123 incorporated in the laser driving circuit 12 as the signal source of the high-frequency signal. However, as a ninth example, a configuration as in the third example (see FIG. 14) may be adopted. Specifically, though the ninth example is not shown, a receiver 126 for receiving an externally input projection video clock may be used as a signal source of a high-frequency signal, and a projection video clock synchronized with a projection video signal may be superimposed as a high-frequency signal on laser driving current.

(Aliasing Attendant on Cross Modulation Between High-Frequency Signal and Projection Video Signal)

When the high-frequency signal to be superimposed on the laser driving circuit and the projection video signal are asynchronous to each other, an aliasing component attendant on cross modulation between the high-frequency signal and the projection video signal may occur, and impair image quality. This aliasing will be described more concretely.

Figure 26:
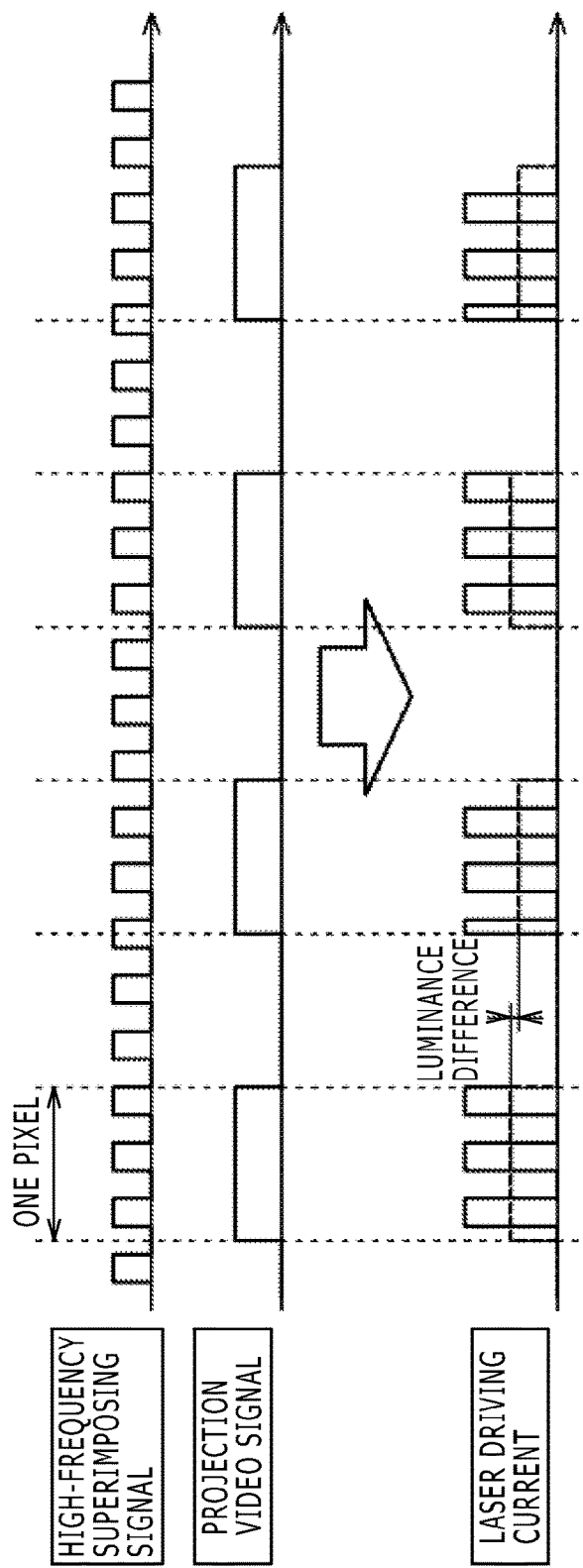
FIG. 26 is a waveform chart showing an example of laser driving current when a high-frequency signal asynchronous to a projection video signal is superimposed on the laser driving current.

FIG. 26 shows an example of laser driving current when a high-frequency signal asynchronous to a projection video signal repeating brightness and darkness in pixel units is superimposed on the projection video signal. In this example, the high-frequency signal has 2.75 periods for one pixel interval.

The input projection video signal has a same level during all of brightness intervals. The light emission of laser light according to the high-frequency signal is performed 3 times and 2.5 times repeatedly, and a change in luminance occurs in every other brightness interval. Broken lines in the waveform of the laser driving current of FIG. 26 represent an average current, and a difference between average currents is a difference in luminance.

This, in the example in which letting $f_v$ be a pixel frequency, the frequency $f_h$ of the high-frequency signal is $f_h=5.5\times f_v$, can be regarded as the aliasing of a difference component between a harmonic of five times the pixel frequency: $5\times f_v$ and the frequency of the high-frequency signal: $5.5\times f_v$.

The aliasing occurring as a change in luminance is caused by a change in the number of times of light emission during one pixel interval. Thus, the change in luminance can be reduced by synchronizing the frequency of the high-frequency signal with the pixel frequency or making the phase of the high-frequency signal within one pixel coincide with the pixel frequency. A laser driving circuit according to the present disclosure has been made in view of such a point.

As in the first embodiment and the second embodiment described earlier, the process of superimposing the high-frequency signal on laser driving current includes a process performed on the input side of the laser driving video current generating circuits $121_R$, $121_G$, and $121_B$ and a process performed on the output side of the plurality of laser driving video current generating circuits $121_R$, $121_G$, and $121_B$.

Description will be made below of a configuration in which the process is performed on the input side as a third embodiment, and of a configuration in which the process is performed on the output as a fourth embodiment. In addition, concrete examples for synchronizing the high-frequency signal to be superimposed on the laser driving current with the projection video signal will be described as examples of the third embodiment.

6. Third Embodiment

In the third embodiment, the process of superimposing the high-frequency signal on the laser driving current is performed on the input side of the laser driving video current generating circuits $121_R$, $121_G$, and $121_B$. Specifically, the video signal (projection video signal) input to these laser driving video current generating circuits $121_R$, $121_G$, and $121_B$ is switched according to the high-frequency signal.

Incidentally, the third embodiment uses a superimposing signal oscillator incorporated in a corresponding laser driving circuit $12_I$ as a signal source of the high-frequency signal of a frequency exceeding the band of the video signal, which high-frequency signal is to be superimposed on the laser driving current. The same is true for a fourth embodiment.

6-1. Tenth Example

Figure 27:
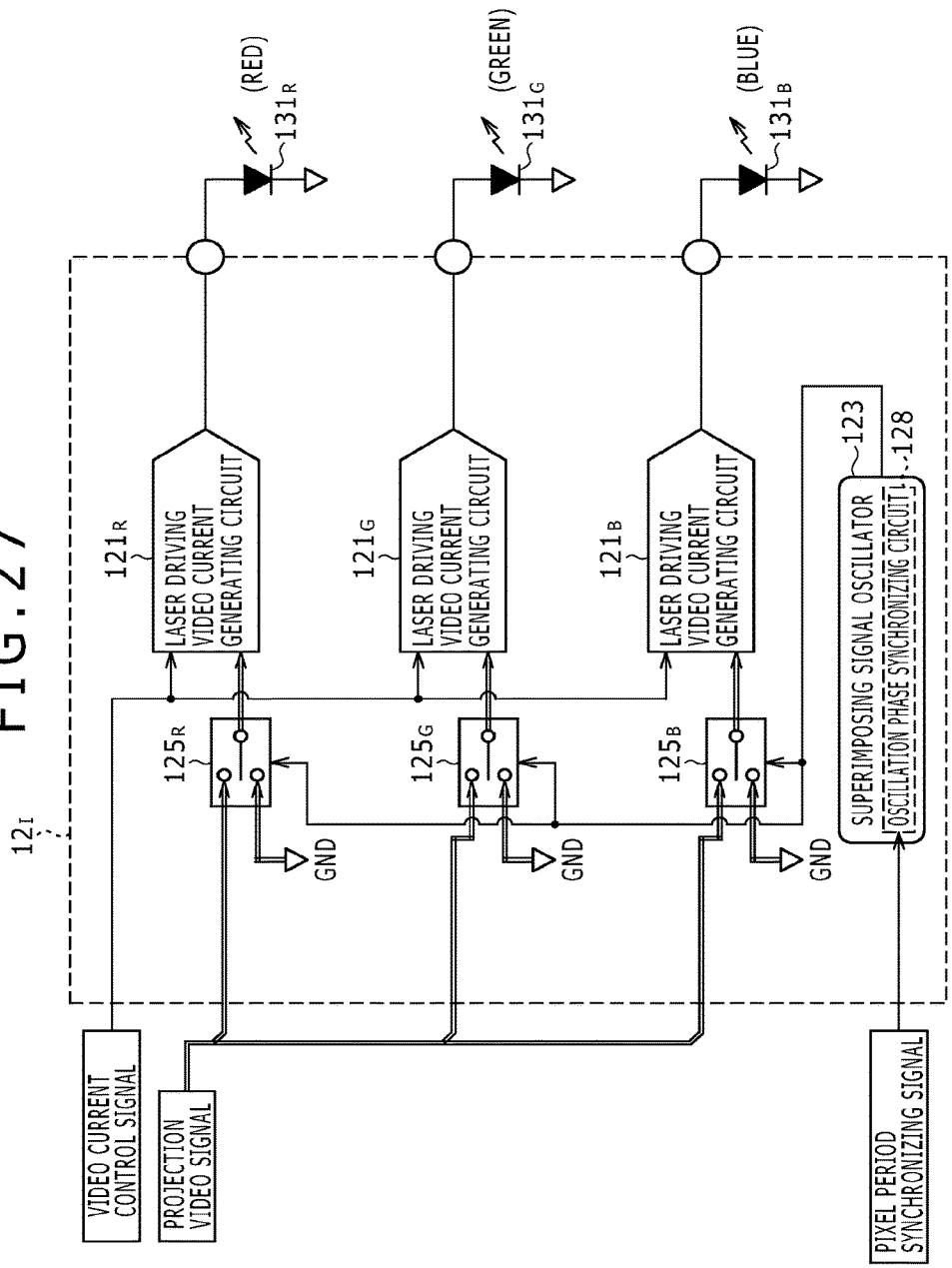
FIG. 27 is a block diagram showing a configuration of a laser driving circuit according to a tenth example.

FIG. 27 is a block diagram showing a configuration of a laser driving circuit according to a tenth example. The laser driving circuit $12_4$ according to the tenth example includes a superimposing signal oscillator 123 and two-input one-output switches (hereinafter described as "video signal switches") $125_R$, $125_G$, and $125_B$ in addition to laser driving video current generating circuits $121_R$, $121_G$, and $121_B$.

The superimposing signal oscillator 123 and the video signal switches $125_R$, $125_G$, and $125_B$ form a high-frequency superimposing section configured to superimpose a high-frequency signal on laser driving currents generated by the laser driving video current generating circuits $121_R$, $121_G$, and $121_B$. The laser driving video current generating circuits, the oscillator (superimposing signal oscillator), and the high-frequency superimposing section in the laser driving circuit correspond to a laser driving video current generating step, an oscillating step, and a high-frequency superimposing step in a laser driving method according to the present disclosure. The same is true for each of examples to be described below.

The superimposing signal oscillator 123 has an oscillation phase synchronizing circuit 128 for controlling an oscillation stop/oscillation start of the oscillator 123 according to a signal synchronized with an input projection video signal. A pixel period synchronizing signal indicating a start of a pixel is used as the signal synchronized with the input projection video signal.

The pixel period synchronizing signal is a signal transmitted from the video signal processing circuit 11 to the laser driving circuit 12 through the video signal interface described earlier (see FIG. 3) together with the projection video signal and the projection video clock signal.

The oscillation phase synchronizing circuit 128 controls an oscillation stop/oscillation start of the superimposing signal oscillator 123 according to the input pixel period synchronizing signal, whereby an oscillation stop/oscillation start of the high-frequency signal (high-frequency superimposing signal) to be superimposed on the laser driving currents is synchronized with a pixel period.

Figure 28:
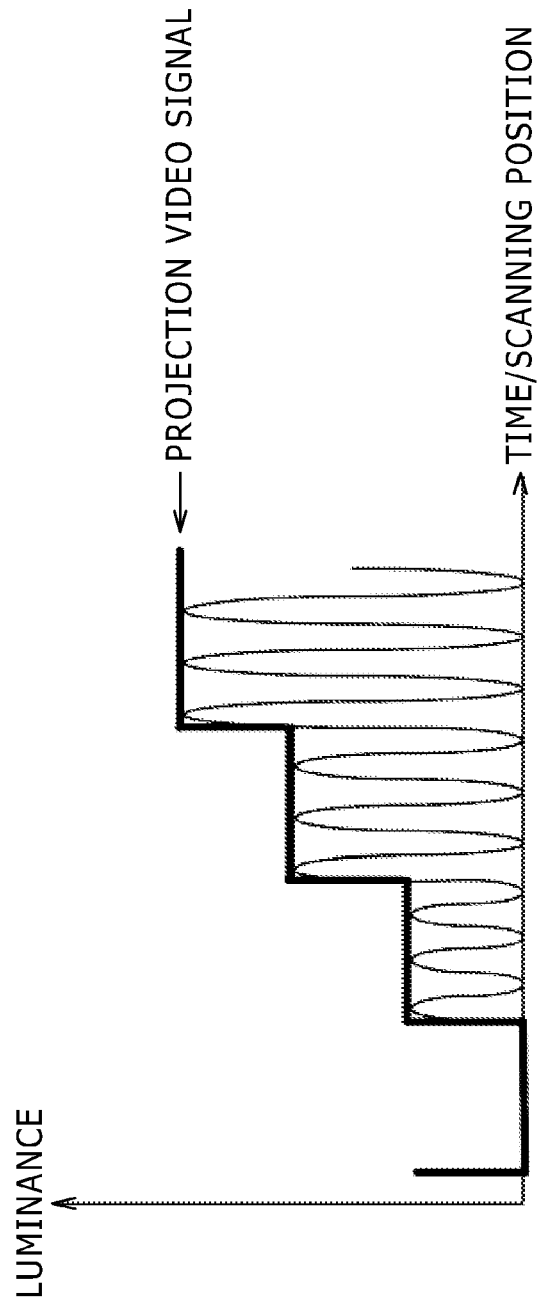
FIG. 28 is a waveform chart showing relation between a projection video signal and the amplitude of a high-frequency signal in the tenth example.

The video signal switches $125_R$, $125_G$, and $125_B$ have the input projection video signal as one input thereto, and has a predetermined potential, for example a ground (GND) level as another input thereto. The video signal switches $125_R$, $125_G$, and $125_B$ thereby perform switching between the projection video signal and the ground level according to the high-frequency signal supplied from the superimposing signal oscillator 123. As a result, as shown in FIG. 28, the high-frequency signal having amplitude that is the signal level of the projection video signal is superimposed on the projection video signal, or in turn the laser driving currents.

Figure 29:
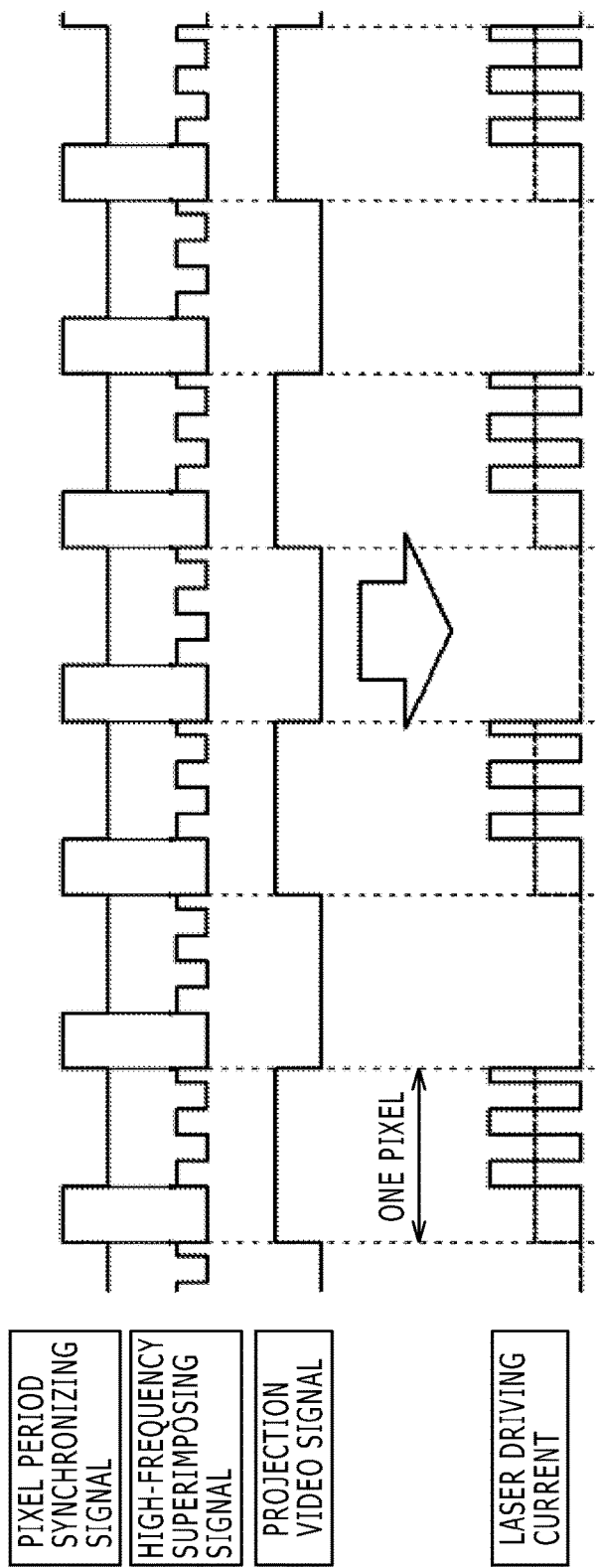
FIG. 29 is a timing waveform chart showing an example of laser driving current on which the high-frequency signal whose oscillation stop/oscillation start is synchronized with the pixel periods of the projection video signal is superimposed in the tenth example.

FIG. 29 is a timing waveform chart of an example of laser driving current on which the high-frequency signal whose oscillation stop/oscillation start is synchronized with the pixel periods of the projection video signal is superimposed in the tenth example. In this example, the projection video signal repeats brightness and darkness for each pixel. Though the pixel periods and superimposing periods are not synchronized with each other, the oscillation stop/oscillation start of the high-frequency superimposing signal is synchronized with the pixel periods, so that the average current of the laser driving current is identical for each pixel.

Thereby, a difference in luminance as a difference between average currents of the laser driving current does not occur, which difference is observed in the case where the high-frequency signal to be superimposed on the laser driving circuit and the projection video signal are asynchronous to each other. Thus, an aliasing component attendant on cross modulation between the projection video signal and the high-frequency signal, which aliasing component occurs as a change in luminance, can be suppressed. It is therefore possible to reduce speckle noise caused by laser light as coherent light while avoiding degradation in image quality due to the aliasing component.

(Superimposing Signal Oscillator Having Oscillation Phase Synchronizing Circuit)

Figure 30:
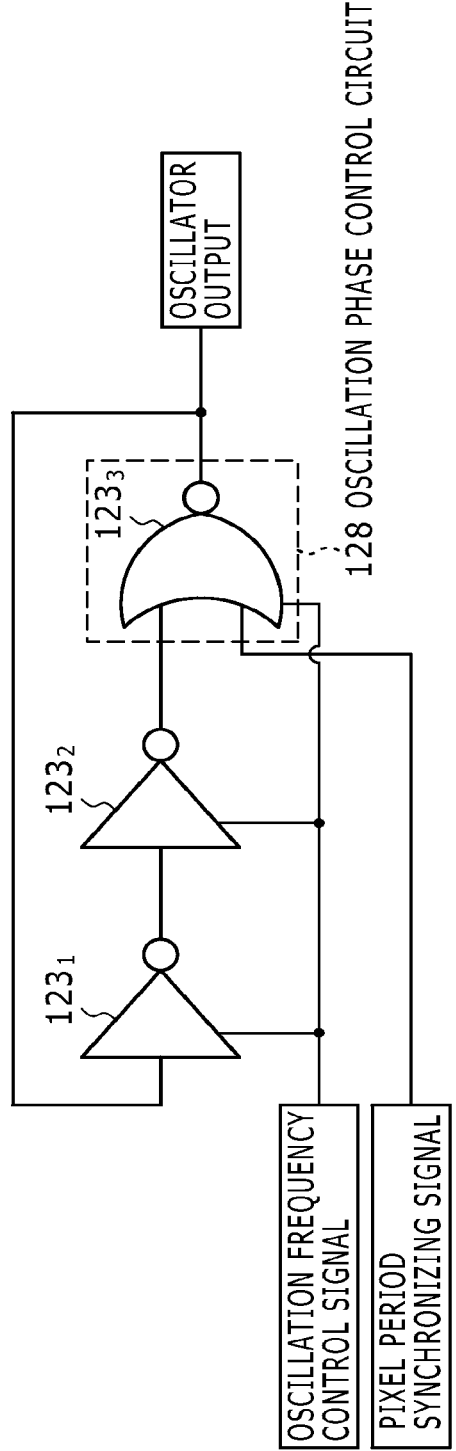
FIG. 30 is a block diagram showing an example of configuration of a superimposing signal oscillator having an oscillation phase synchronizing circuit.

FIG. 30 shows an example of configuration of the superimposing signal oscillator 123 having the oscillation phase synchronizing circuit 128. As shown in FIG. 30, the superimposing signal oscillator 123 is a gated ring oscillator of a configuration with three delay circuit stages in which an inverter $123_1$, an inverter $123_2$, and a NOR gate $123_3$ are connected in the form of a ring, and an amount of delay can be controlled by an oscillation frequency control signal.

The NOR gate $123_3$ in the superimposing signal oscillator 123 has the functions of the oscillation phase synchronizing circuit 128. The pixel period synchronizing signal is input as oscillation phase synchronizing signal to the NOR gate $123_3$. Thereby, during an active period (high-level interval) of the pixel period synchronizing signal, oscillation output is at a low level, and the superimposing signal oscillator 123 stops oscillating. When the pixel period synchronizing signal becomes inactive (low level), the superimposing signal oscillator 123 starts oscillating.

6-2. Eleventh Example

Figure 31:
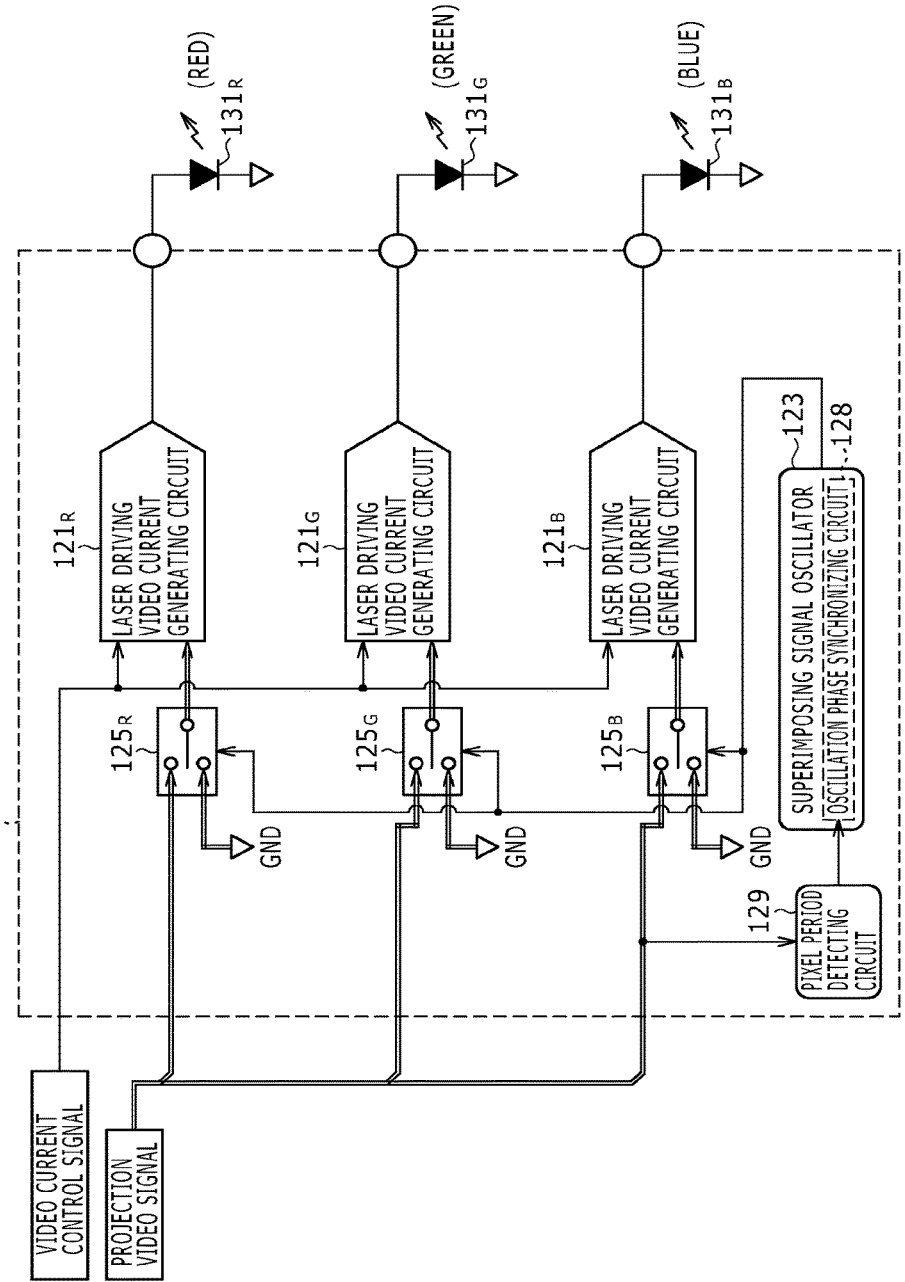
FIG. 31 is a block diagram showing a configuration of a laser driving circuit according to an eleventh example.

FIG. 31 is a block diagram showing a configuration of a laser driving circuit according to an eleventh example. The laser driving circuit $12_J$ according to the eleventh example includes a pixel period extracting circuit 129 in addition to laser driving video current generating circuits $121_R$, $121_G$, and $121_B$, a superimposing signal oscillator 123, and video signal switches $125_R$, $125_G$, and $125_B$.

The pixel period extracting circuit 129 extracts a signal synchronized with pixel periods, that is, a pixel period synchronizing signal from a projection video signal input to the laser driving circuit $12_J$, and supplies the pixel period synchronizing signal as the signal synchronized with the projection video signal to the superimposing signal oscillator 123, or specifically an oscillation phase synchronizing circuit 128. The pixel period extracting circuit 129 can be formed by using a well known clock recovery circuit or the like.

According to the configuration of the eleventh example, when the projection video signal includes some signal synchronized with pixel periods, the pixel period extracting circuit 129 can extract the pixel period synchronizing signal. Specifically, when the projection video signal includes some signal switching for each pixel, the pixel period synchronizing signal can be extracted by extracting the information and synchronizing a reference clock within the clock recovery circuit on the basis of the information.

When the pixel period synchronizing signal extracted by the pixel period extracting circuit 129 is supplied to the oscillation phase synchronizing circuit 128 within the superimposing signal oscillator 123, a high-frequency signal whose oscillation stop/oscillation start is synchronized with the pixel periods of the projection video signal can be superimposed on laser driving current.

Figure 32:
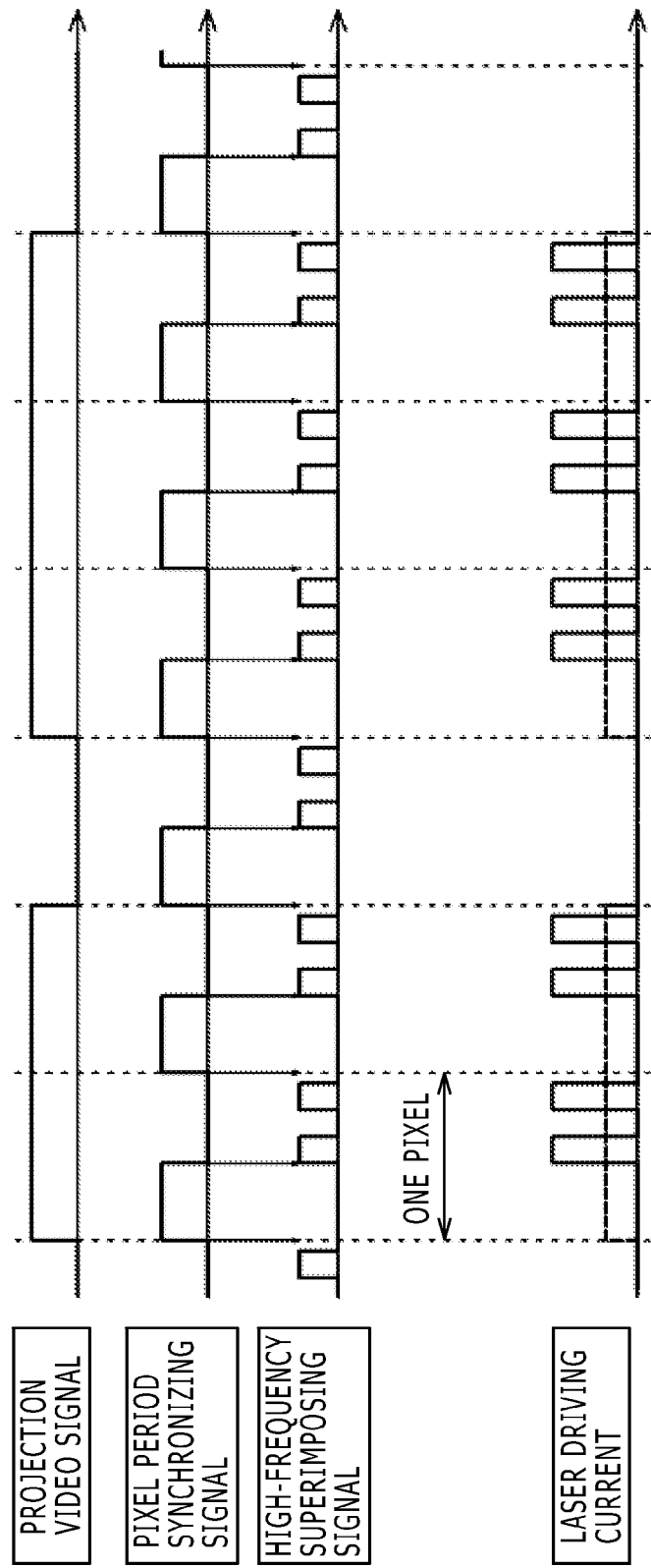
FIG. 32 is a timing waveform chart showing an example of laser driving current on which a high-frequency signal whose oscillation stop/oscillation start is synchronized with the pixel periods of a projection video signal is superimposed in the eleventh example.

FIG. 32 is a timing waveform chart of an example of laser driving current on which the high-frequency signal whose oscillation stop/oscillation start is synchronized with the pixel periods of the projection video signal is superimposed in the eleventh example. Also in the eleventh example, as in the tenth example, the average current of the laser driving current is identical for each pixel. Thus, a difference in luminance as a difference between average currents of the laser driving current does not occur. It is therefore possible to reduce speckle noise caused by laser light as coherent light while avoiding degradation in image quality due to an aliasing component.

6-3. Twelfth Example

Aliasing is caused by asynchronism between pixel periods and the periods of the high-frequency signal. In the projector device, a minimum unit for repeating the brightness and darkness of the video signal, that is, one pixel is recognized as pixel only when luminance changes with respect to an adjacent picture, and is not recognized as one pixel when luminance does not change. Therefore, aliasing may occur when periods of changes in luminance, rather than pixel periods, and the periods of the high-frequency signal are asynchronous to each other. A laser driving circuit according to a third example to be described later has been made in view of this point.

Figure 33:
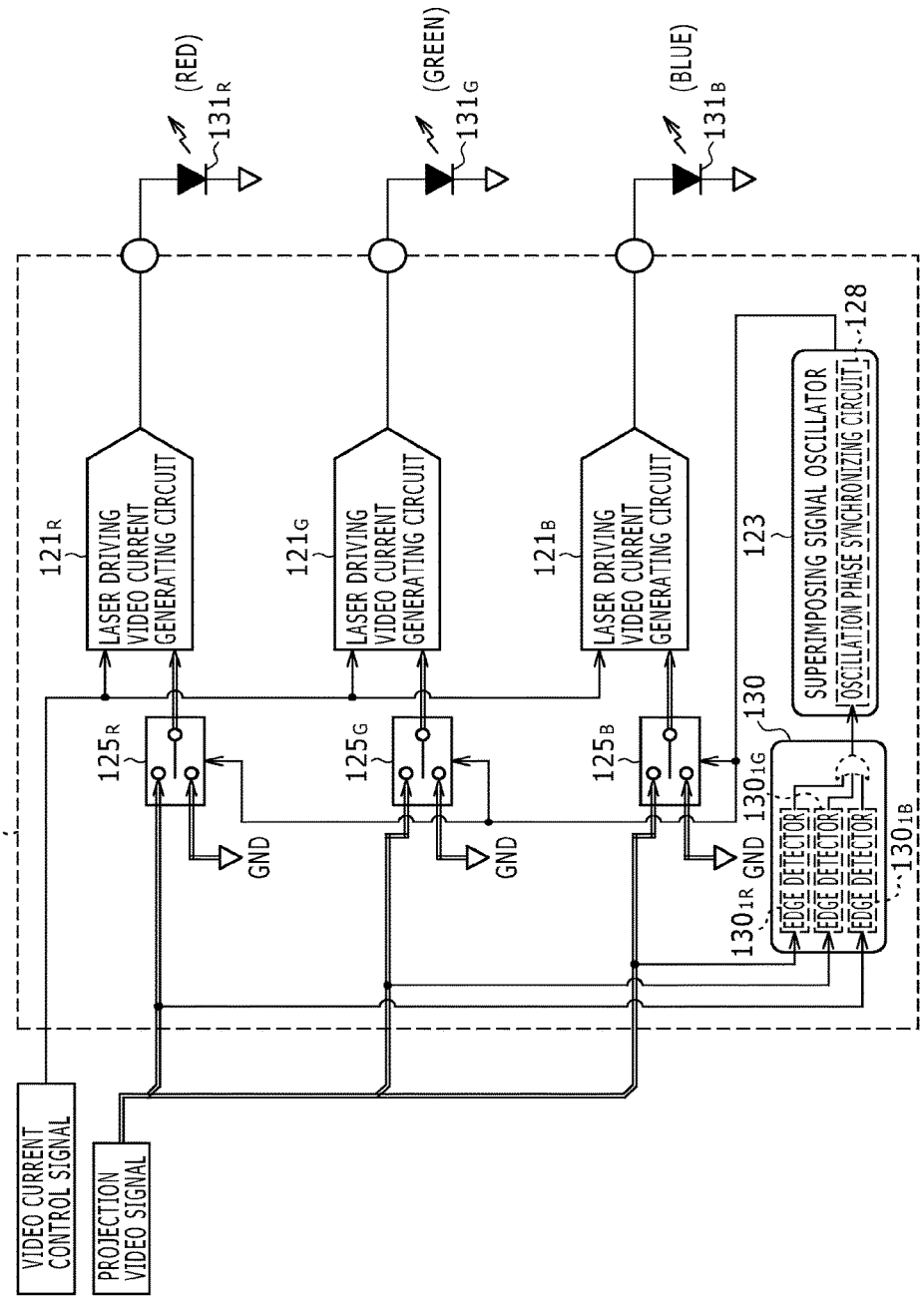
FIG. 33 is a block diagram showing a configuration of a laser driving circuit according to a twelfth example.

FIG. 33 is a block diagram showing a configuration of a laser driving circuit according to a twelfth example. The laser driving circuit $12_K$ according to the twelfth example includes a level change detecting circuit 130 in addition to laser driving video current generating circuits $121_R$, $121_G$, and $121_B$, a superimposing signal oscillator 123, and video signal switches $125_R$, $125_G$, and $125_B$.

The level change detecting circuit 130 determines the level information of a projection video signal for each pixel, detects a level change, and supplies a signal synchronized with the level change as a signal synchronized with the video signal to the superimposing signal oscillator 123, or specifically an oscillation phase synchronizing circuit 128.

As shown in FIG. 33, the level change detecting circuit 130 is for example composed of edge detectors $130_{1R}$, $130_{1G}$, and $130_{1B}$ corresponding to RGB projection video signals and an OR gate $130_2$, and has a configuration of an edge detecting circuit for detecting a change in luminance for each wavelength as an edge. The level change detecting circuit 130 detects a change in luminance for each wavelength by the edge detectors $130_{1R}$, $130_{1G}$, and $130_{1B}$, and obtains a logical sum of detection results for the respective wavelengths by the OR gate $130_2$.

When the signal synchronized with the change in level (change in luminance) of the projection video signal is thus supplied to the oscillation phase synchronizing circuit 128 within the superimposing signal oscillator 123, a high-frequency signal whose oscillation stop/oscillation start is synchronized with the period in which luminance changes can be superimposed on laser driving current. It is thereby possible to suppress aliasing as in the case where the periods of changes in luminance and the periods of the high-frequency signal are asynchronous to each other.

Figure 34:
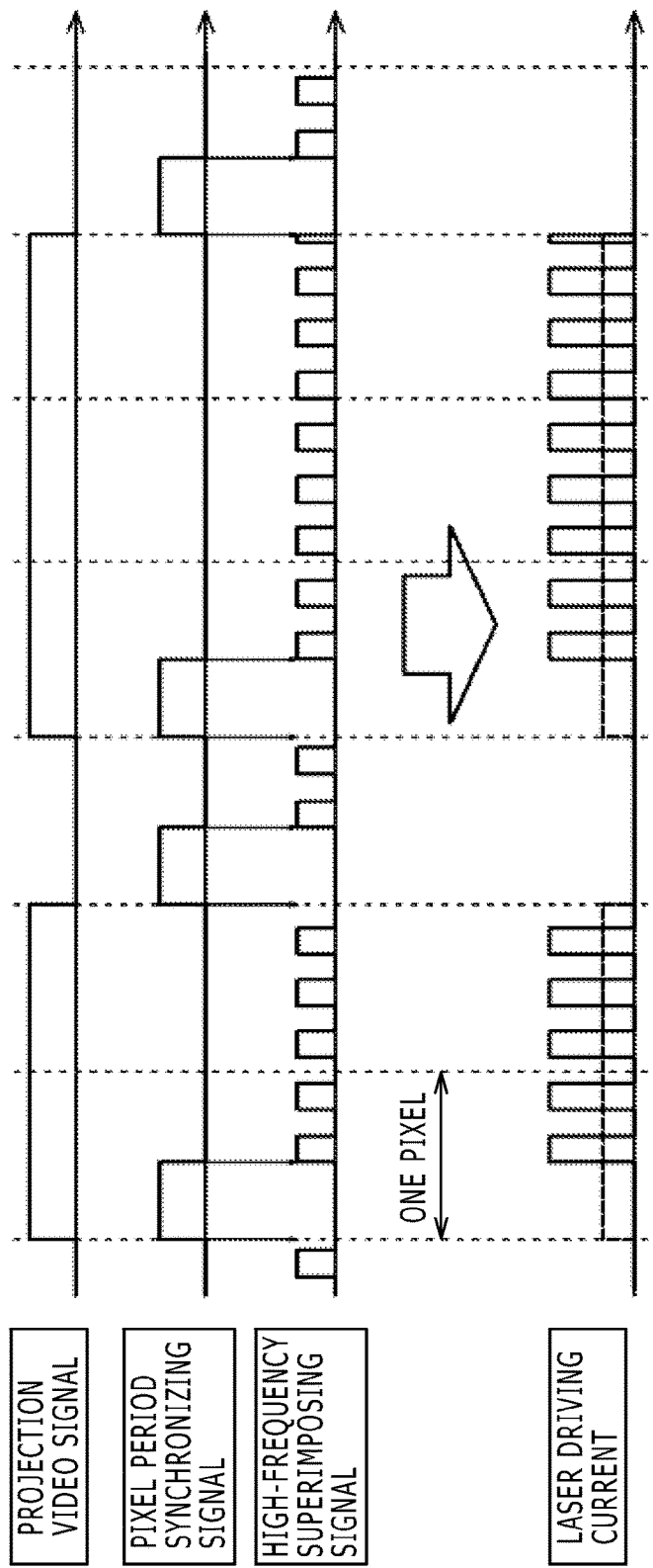
FIG. 34 is a timing waveform chart showing an example of laser driving current on which a high-frequency signal whose oscillation stop/oscillation start is synchronized with the pixel periods of a projection video signal is superimposed in the twelfth example.

FIG. 34 is a timing waveform chart of an example of laser driving current on which the high-frequency signal whose oscillation stop/oscillation start is synchronized with the pixel periods of the projection video signal is superimposed in the twelfth example. Unlike the eleventh example, edges of change points of the projection video signal are detected.

Here, the average luminance of one pixel is dependent on luminance during the periods of stops of superimposition of the high-frequency signal. Thus, the number of times of the stop periods is desirably smaller. Therefore, stopping the oscillation of the superimposing signal oscillator 123 only when changes in luminance occur as in the twelfth example can reduce the number of times of the stop periods as compared with a case in which such a limitation is not imposed. In addition, according to the twelfth example, the pixel period extracting circuit 129 formed by a clock recovery circuit or the like as in the eleventh example is not necessary, and there is thus another advantage in that a desired object can be achieved with a simple circuit configuration.

6-4. Thirteenth Example

Figure 35:
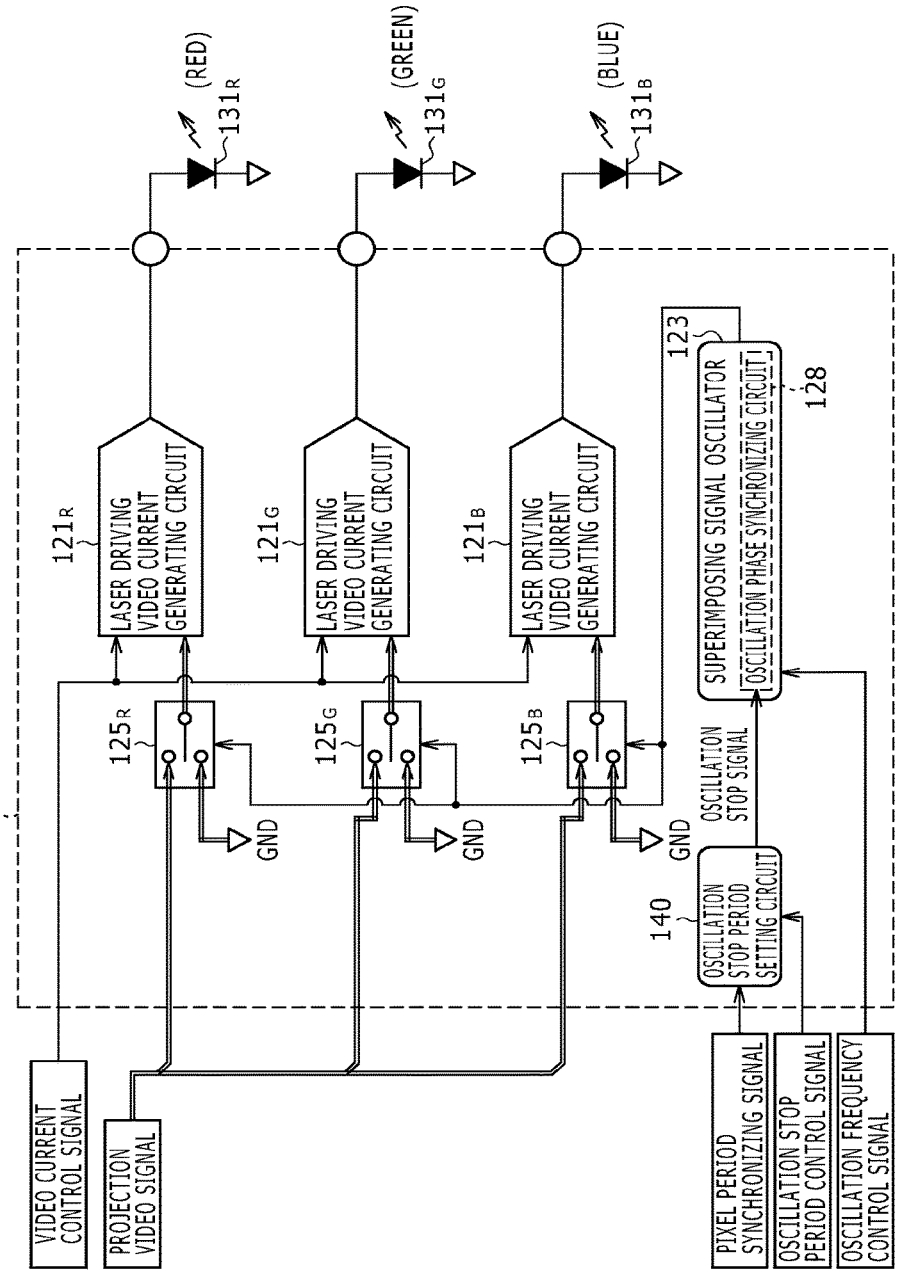
FIG. 35 is a block diagram showing a configuration of a laser driving circuit according to a thirteenth example.

FIG. 35 is a block diagram showing a configuration of a laser driving circuit according to a thirteenth example. The laser driving circuit $12_L$ according to the thirteenth example includes an oscillation stop period setting circuit 140 in addition to laser driving video current generating circuits $121_R$, $121_G$, and $121_B$, a superimposing signal oscillator 123, and video signal switches $125_R$, $125_G$, and $125_B$.

The oscillation stop period setting circuit 140 arbitrarily sets an oscillation stop period in synchronism with a pixel period synchronizing signal according to an externally supplied oscillation stop period control signal, and supplies an oscillation stop signal to the superimposing signal oscillator 123 during the set oscillation stop period. That is, the oscillation stop period setting circuit 140 according to the present example is configured to set the oscillation stop period arbitrarily according to the externally supplied oscillation stop period control signal. When the superimposing signal oscillator 123 is supplied with the oscillation stop signal from the oscillation stop period setting circuit 140, the superimposing signal oscillator 123 stops oscillating during the period.

Here, the average luminance of one pixel is dependent on luminance during the periods of stops of superimposition of a high-frequency signal. Thus, the stop periods are desirably shorter. However, a time necessary for the superimposing signal oscillator 123 to stop oscillating varies according to the frequency of the high-frequency signal, process variations, and the like, and thus adjustment of oscillation stop periods is necessary.

6-5. Fourteenth Example

Figure 36:
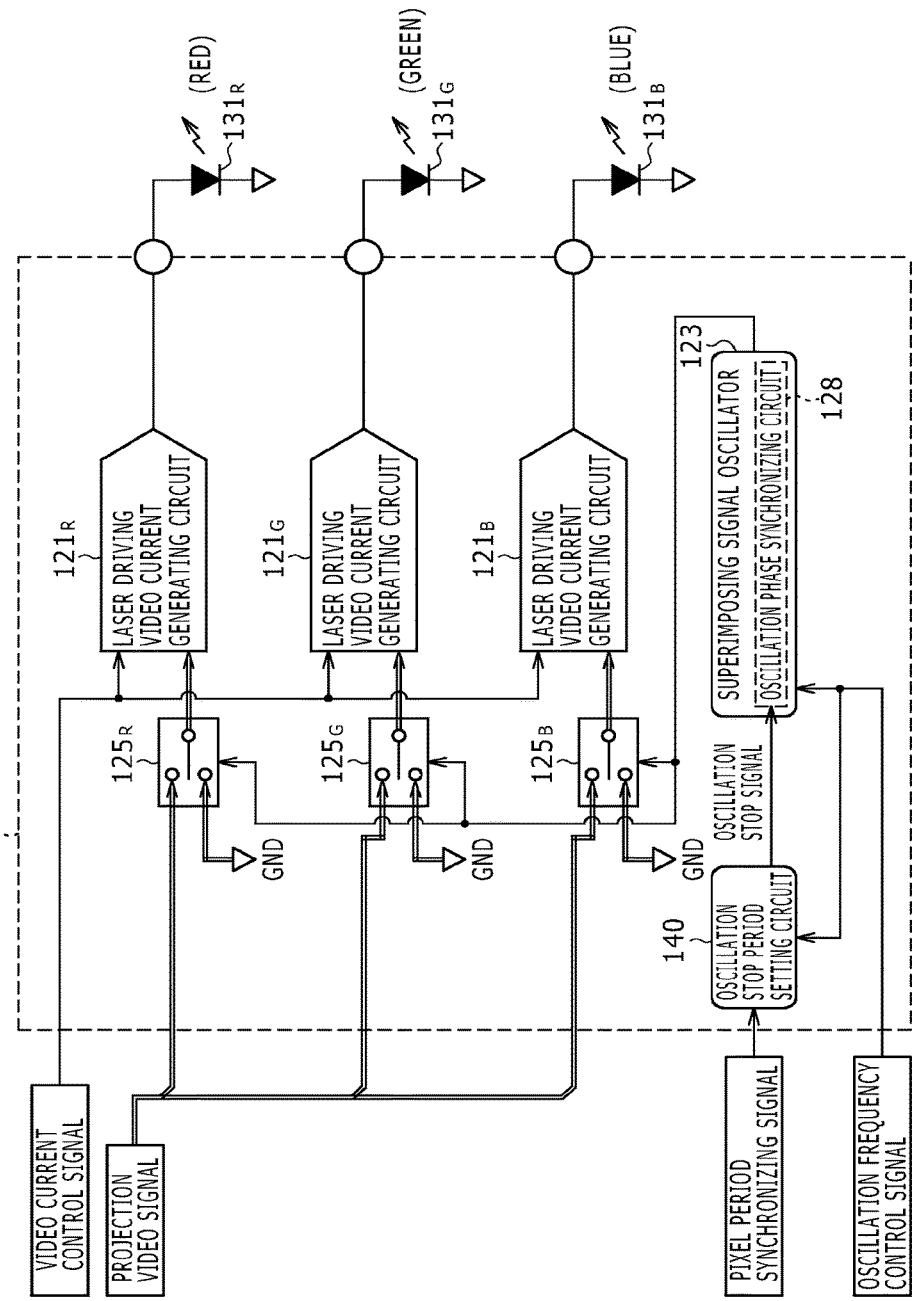
FIG. 36 is a block diagram showing a configuration of a laser driving circuit according to a fourteenth example.

FIG. 36 is a block diagram showing a configuration of a laser driving circuit according to a fourteenth example. The laser driving circuit $12_M$ according to the fourteen example is basically of a similar configuration to that of the laser driving circuit $12_L$ according to the thirteenth example.

There is a difference from the laser driving circuit $12_L$ according to the thirteenth example in that oscillation stop periods set by an oscillation stop period setting circuit 140 are interlocked with the frequency of a high-frequency signal. Specifically, the oscillation stop period setting circuit 140 is configured to set the oscillation stop periods in synchronism with a pixel period synchronizing signal according to an oscillation frequency control signal externally supplied to a superimposing signal oscillator 123 to control oscillation frequency.

Figure 37:
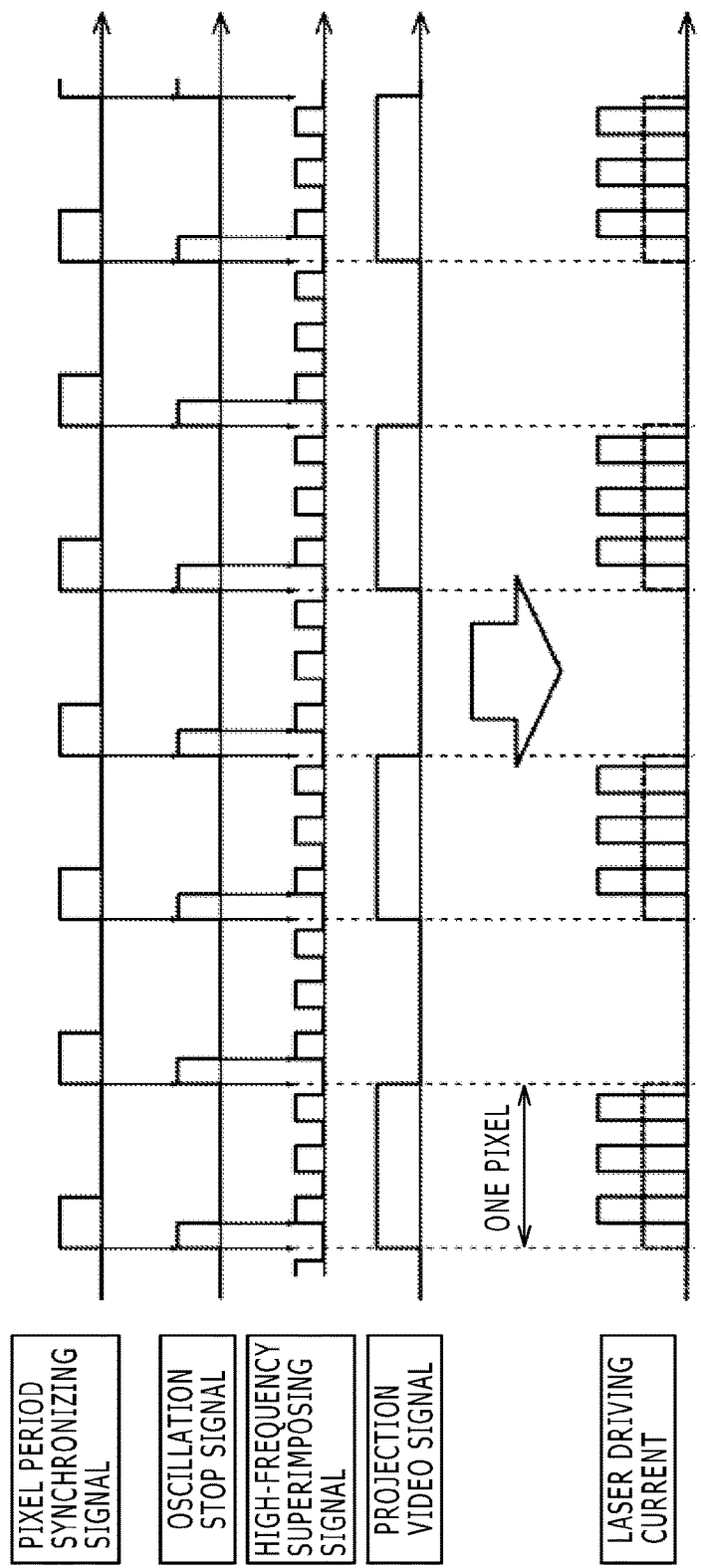
FIG. 37 is a timing waveform chart showing an example of laser driving current on which a high-frequency signal whose oscillation stop/oscillation start is synchronized with the pixel periods of a projection video signal is superimposed in the fourteenth example.

FIG. 37 is a timing waveform chart of an example of laser driving current on which the high-frequency signal whose oscillation stop/oscillation start is synchronized with the pixel periods of a projection video signal is superimposed in the fourteenth example. In this example, the oscillation stop periods are equal to the low-level intervals of the high-frequency superimposing signal. When the oscillation stop periods are made equal to the low-level intervals of the high-frequency superimposing signal as in FIG. 37, times during which the superimposing signal oscillator 123 is surely set in a stop state can be ensured without depending on frequency or processes.

In addition, the laser driving current waveform shown in FIG. 37 is equal to the high-frequency superimposing waveform that starts oscillating at a low level at a time of pixel switching. Here, the low level and the high level of the high-frequency signal can be readily inverted, and the waveform after level inversion has no oscillation stop period and is equal to the high-frequency superimposing waveform that starts oscillating at a high level.

6-6. Fifteenth Example

Figure 38:
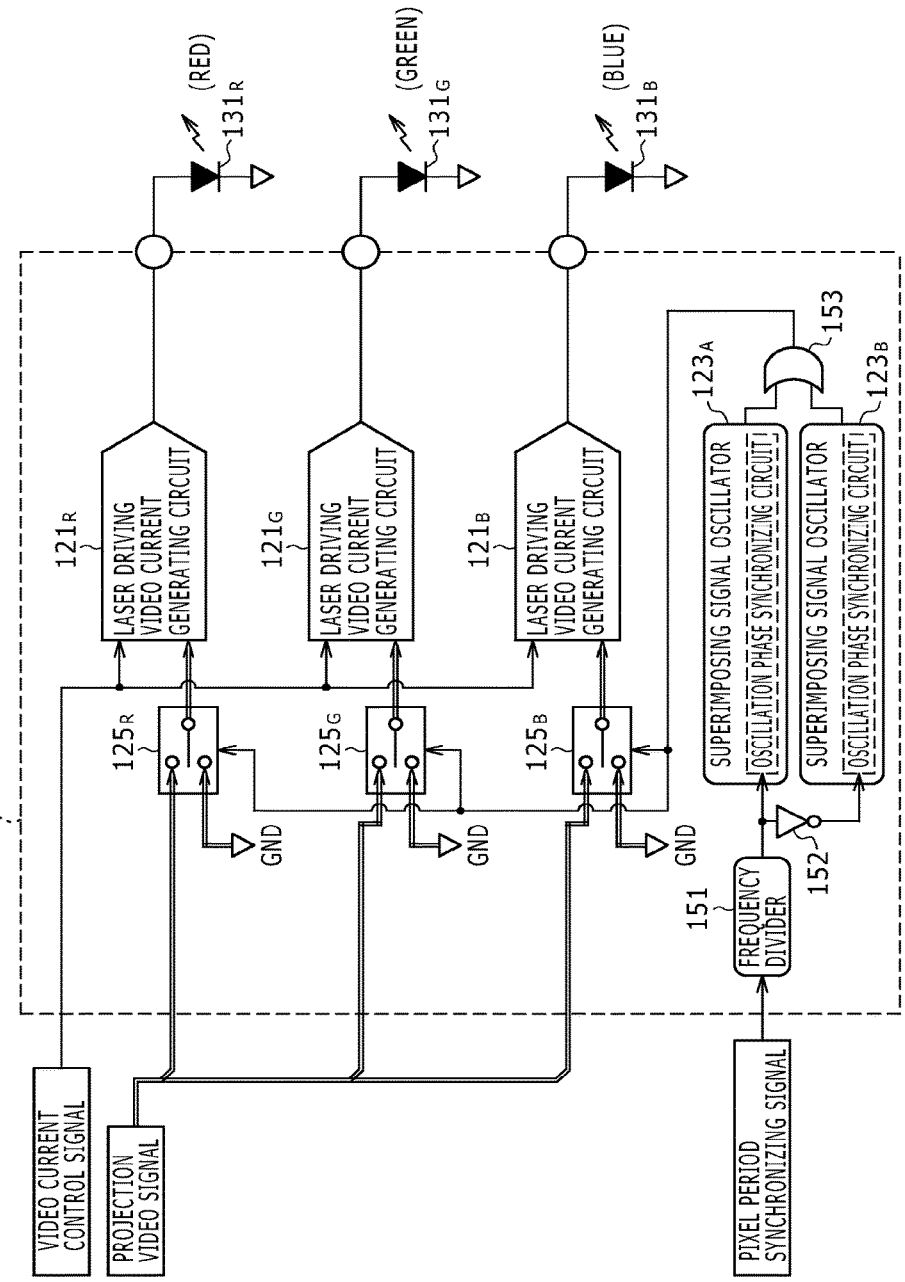
FIG. 38 is a block diagram showing a configuration of a laser driving circuit according to a fifteenth example.

FIG. 38 is a block diagram showing a configuration of a laser driving circuit according to a fifteenth example. The laser driving circuit $12_N$ according to the fifteenth example, which is based on the configuration of the laser driving circuit $12_I$ according to the tenth example, includes a plurality of superimposing signal oscillators 123, for example two superimposing signal oscillators $123_A$ and $123_B$.

The laser driving circuit $12_N$ further includes a frequency divider 151 and an inverter 152 on the input side of the two superimposing signal oscillators $123_A$ and $123_B$ and includes an OR gate 153 on the output side of the two superimposing signal oscillators $123_A$ and $123_B$. The frequency divider 151 divides the frequency of an externally supplied pixel period synchronizing signal into ½, for example, and then directly supplies the pixel period synchronizing signal to one superimposing signal oscillator $123_A$ and supplies the pixel period synchronizing signal to the other superimposing signal oscillator $123_B$ via the inverter 152. The OR gate 153 synthesizes a first high-frequency superimposing signal and a second high-frequency superimposing signal output from the two superimposing signal oscillators $123_A$ and $123_B$, and supplies the result to video signal switches $125_R$, $125_G$, and $125_B$.

That is, the laser driving circuit $12_N$ according to the fifteenth example has a plurality of oscillators, and uses, during the oscillation stop period of one oscillator, the oscillation output of another oscillator as a high-frequency signal to be superimposed on laser driving current, by switching the oscillation outputs of the plurality of oscillators. In the present example, the oscillations of the two superimposing signal oscillators $123_A$ and $123_B$ are stopped alternately on the basis of the signal obtained by frequency-dividing the pixel period synchronizing signal.

Figure 39:
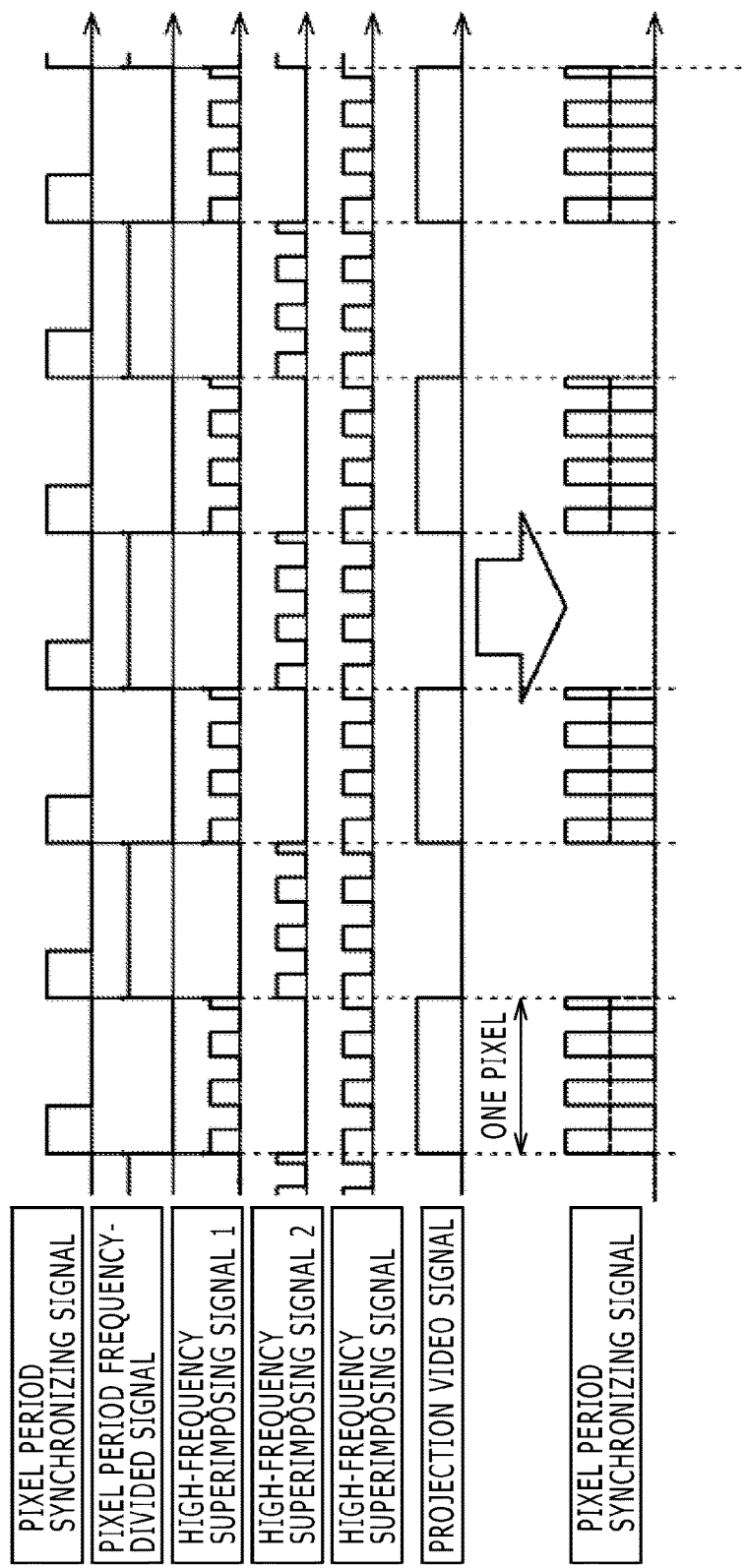
FIG. 39 is a timing waveform chart showing an example of laser driving current on which a high-frequency signal whose oscillation stop/oscillation start is synchronized with the pixel periods of a projection video signal is superimposed in the fifteenth example.

FIG. 39 is a timing waveform chart of an example of laser driving current on which the high-frequency signal whose oscillation stop/oscillation start is synchronized with the pixel periods of a projection video signal is superimposed in the fifteenth example. In the present example, the high-frequency superimposing signal as the composite signal of the high-frequency superimposing signal 1 and the high-frequency superimposing signal 2 have a waveform without oscillation stop periods.

6-7. Sixteenth Example

In the foregoing tenth to fifteenth examples, the laser driving current during the periods of stops of superimposition of the high-frequency signal is OFF, or fixed to an ON state even when the high-frequency superimposing signal is logically inverted. In this case, average luminance varies depending on the periods of stops of superimposition of the high-frequency signal, that is, the oscillation stop periods of the superimposing signal oscillator 123. There is thus a fear of image quality being degraded. A laser driving circuit according to a sixteenth example to be described later has been made in view of this point.

Figure 40:
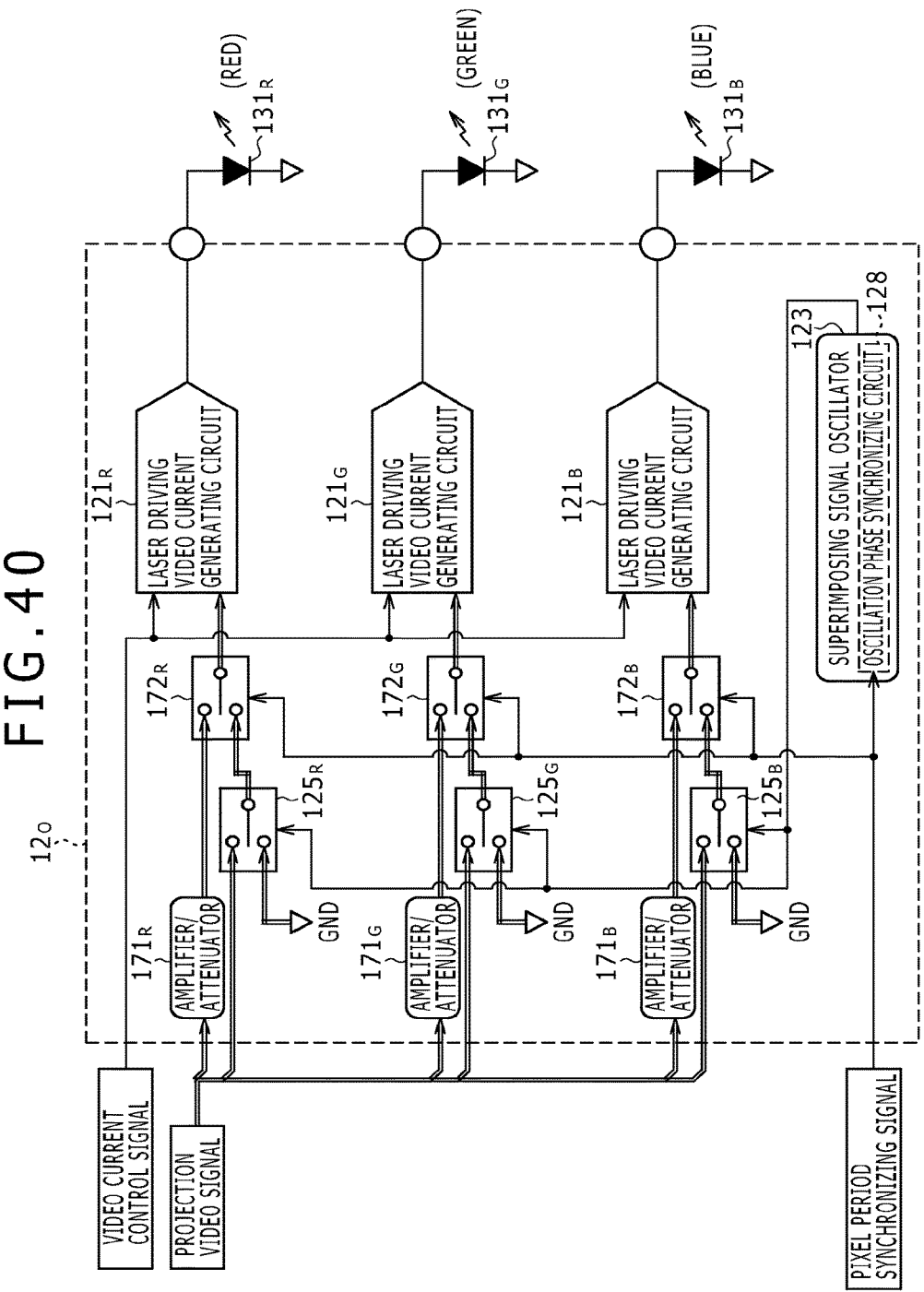
FIG. 40 is a block diagram showing a configuration of a laser driving circuit according to a sixteenth example.

FIG. 40 is a block diagram showing a configuration of the laser driving circuit according to the sixteenth example. The laser driving circuit $12_O$ according to the sixteenth example, which is based on the configuration of the laser driving circuit $12_I$ according to the tenth example, includes a plurality of amplifiers/attenuators $171_R$, $171_G$, and $171_B$ for adjusting the amplitude of an input projection video signal, the amplifiers/attenuators $171_R$, $171_G$, and $171_B$ corresponding to respective wavelengths.

The laser driving circuit $12_O$ further includes video signal switches $172_R$, $172_G$, and $172_B$ in a stage subsequent to video signal switches $125_R$, $125_G$, and $125_B$, so that two stages of video signal switches are formed. The video signal switches $172_R$, $172_G$, and $172_B$ have, as two inputs thereto, the projection video signal adjusted in amplitude by the amplifiers/attenuators $171_R$, $171_G$, and $171_B$ and the output signals of the video signal switches $125_R$, $125_G$, and $125_B$. The video signal switches $172_R$, $172_G$, and $172_B$ select the projection video signal adjusted in amplitude by the amplifiers/attenuators $171_R$, $171_G$, and $171_B$ during the oscillation stop periods of a superimposing signal oscillator 123 according to a pixel period synchronizing signal.

Variations in average luminance dependent on the oscillation stop periods can be suppressed by thus outputting the projection video signal adjusted in amplitude (adjusted in luminance) by the amplifiers/attenuators $171_R$, $171_G$, and $171_B$ during the periods of stops of superimposition of the high-frequency signal, that is, the oscillation stop periods of the superimposing signal oscillator 123.

Figure 41:
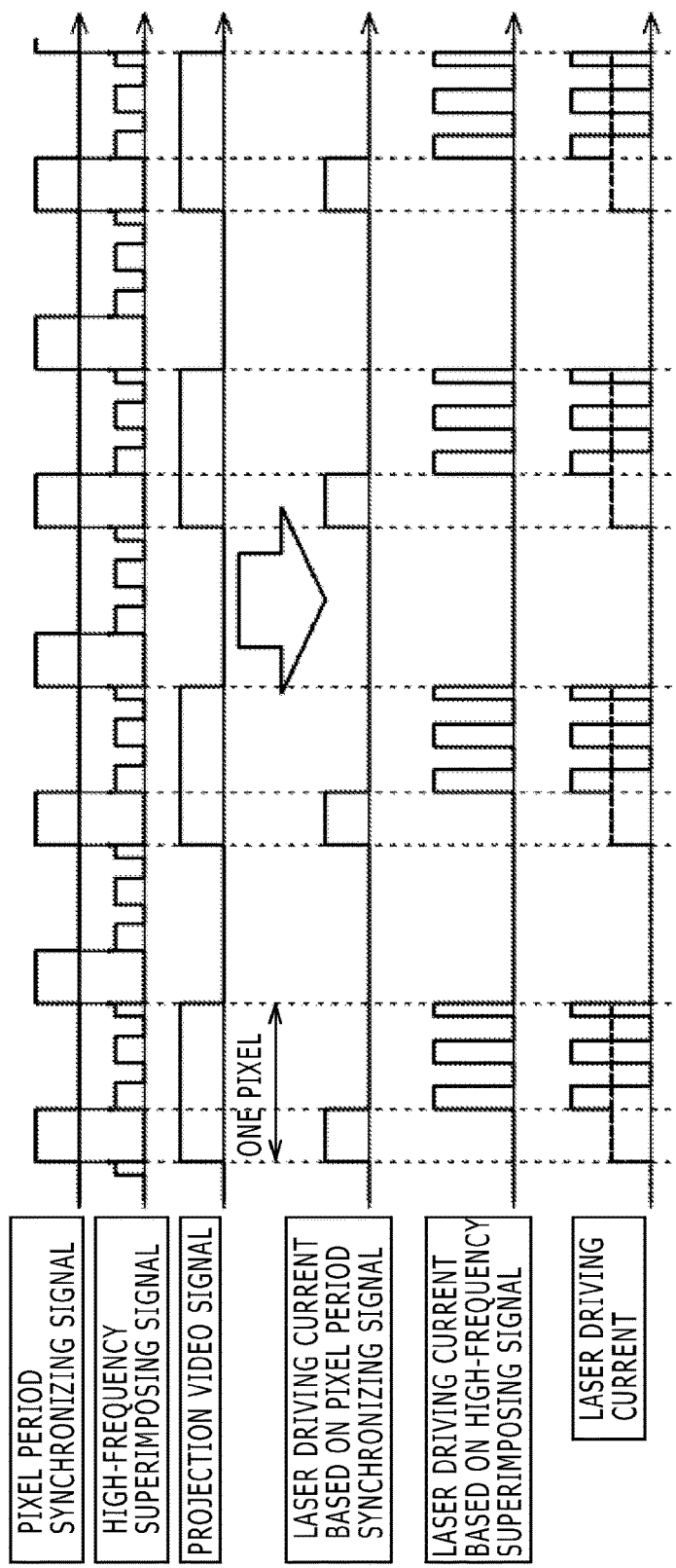
FIG. 41 is a timing waveform chart showing an example of laser driving current on which a high-frequency signal whose oscillation stop/oscillation start is synchronized with the pixel periods of a projection video signal is superimposed in the sixteenth example.

FIG. 41 is a timing waveform chart of an example of laser driving current on which the high-frequency signal whose oscillation stop/oscillation start is synchronized with the pixel periods of the projection video signal is superimposed in the sixteenth example. Variations in average luminance of one pixel can be reduced by outputting current as ½ of the projection video signal during the periods of stops of superimposition of the high-frequency signal (oscillation stop periods).

6-8. Seventeenth Example

In the foregoing tenth to sixteenth examples, the timing of stops of superimposition of the high-frequency signal is not synchronized with the periods of the high-frequency signal. There is thus a fear of the waveform of the high-frequency signal during the oscillation stops being deformed. When the waveform of the oscillation output of the superimposing signal oscillator 123 is extremely thin (narrow), in particular, the waveform of the oscillation output of the superimposing signal oscillator 123 is susceptible to the jitter of the input signal or the like, and the waveform output is unstable, which may lead to video degradation. A laser driving circuit according to a seventeenth example to be described later has been made in view of this point.

Figure 42:
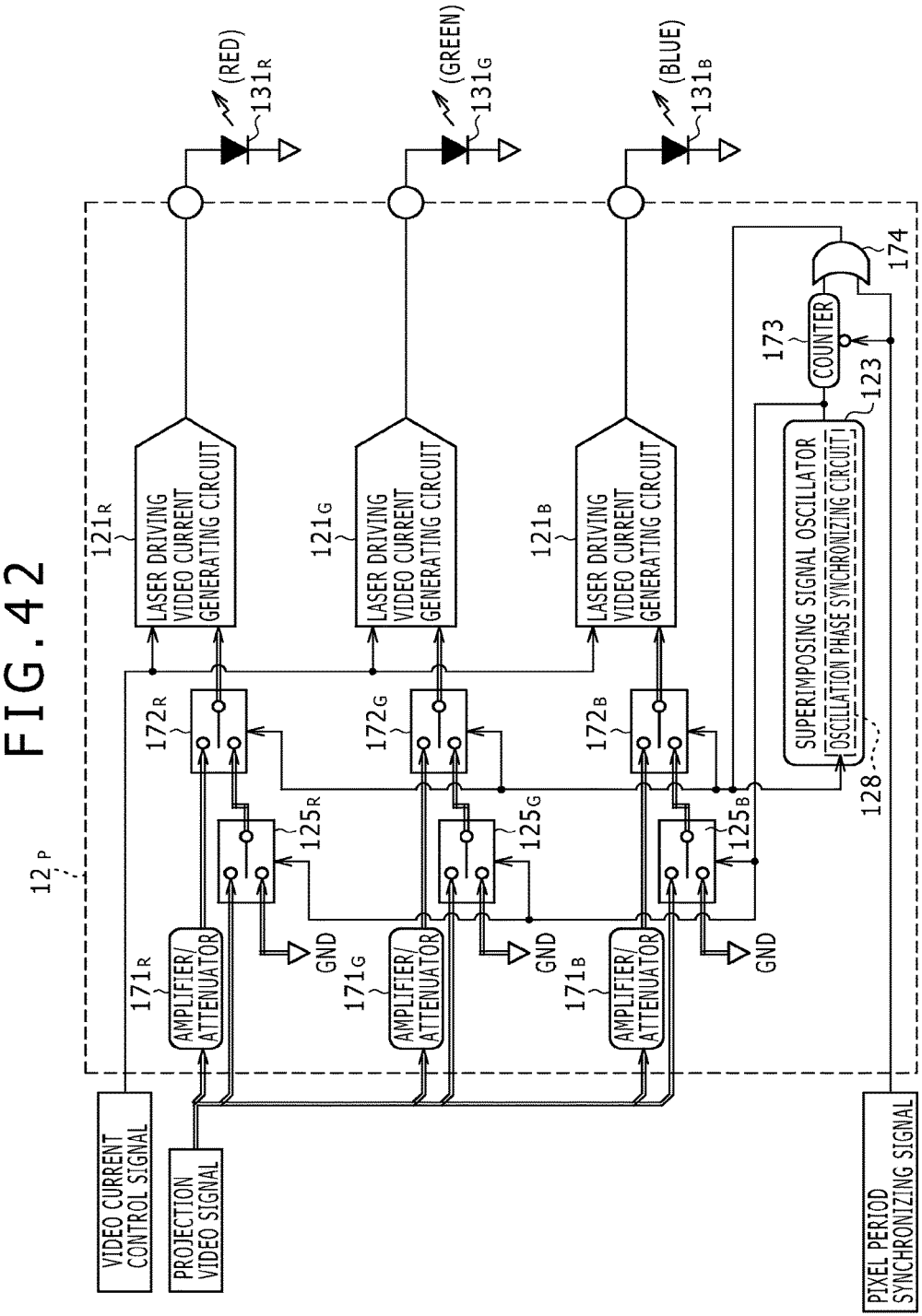
FIG. 42 is a block diagram showing a configuration of a laser driving circuit according to a seventeenth example.

FIG. 42 is a block diagram showing a configuration of the laser driving circuit according to the seventeenth example. The laser driving circuit $12_P$ according to the seventeenth example, which is based on the configuration of the laser driving circuit $12_O$ according to the sixteenth example, includes a counter 173 and an OR gate 174 in a stage subsequent to a superimposing signal oscillator 123.

The counter 173 counts the output of the superimposing signal oscillator 123 in synchronism with a pixel period synchronizing signal, that is, performs counting operation at the frequency of a high-frequency superimposing signal. The OR gate 174 obtains a logical sum of the count output of the counter 173 and the pixel period synchronizing signal, and supplies the output of the logical sum to video signal switches $172_R$, $172_G$, and $172_B$ as a switching signal for the video signal switches $172_R$, $172_G$, and $172_B$ and supplies the output of the logical sum to an oscillation phase synchronizing circuit 1283 as a control signal for the oscillation phase synchronizing circuit 128.

In the laser driving circuit $12_P$ according to the seventeenth example having the above configuration, the oscillation stop/oscillation start of the superimposing signal oscillator 123 is controlled on the basis of the result of the logical sum of the count output of the counter 173 and the pixel period synchronizing signal. Thereby, stops of oscillation of the superimposing signal oscillator 123 are synchronized with the periods of the high-frequency signal, and starts of oscillation of the superimposing signal oscillator 123 are synchronized with pixel periods.

Figure 43:
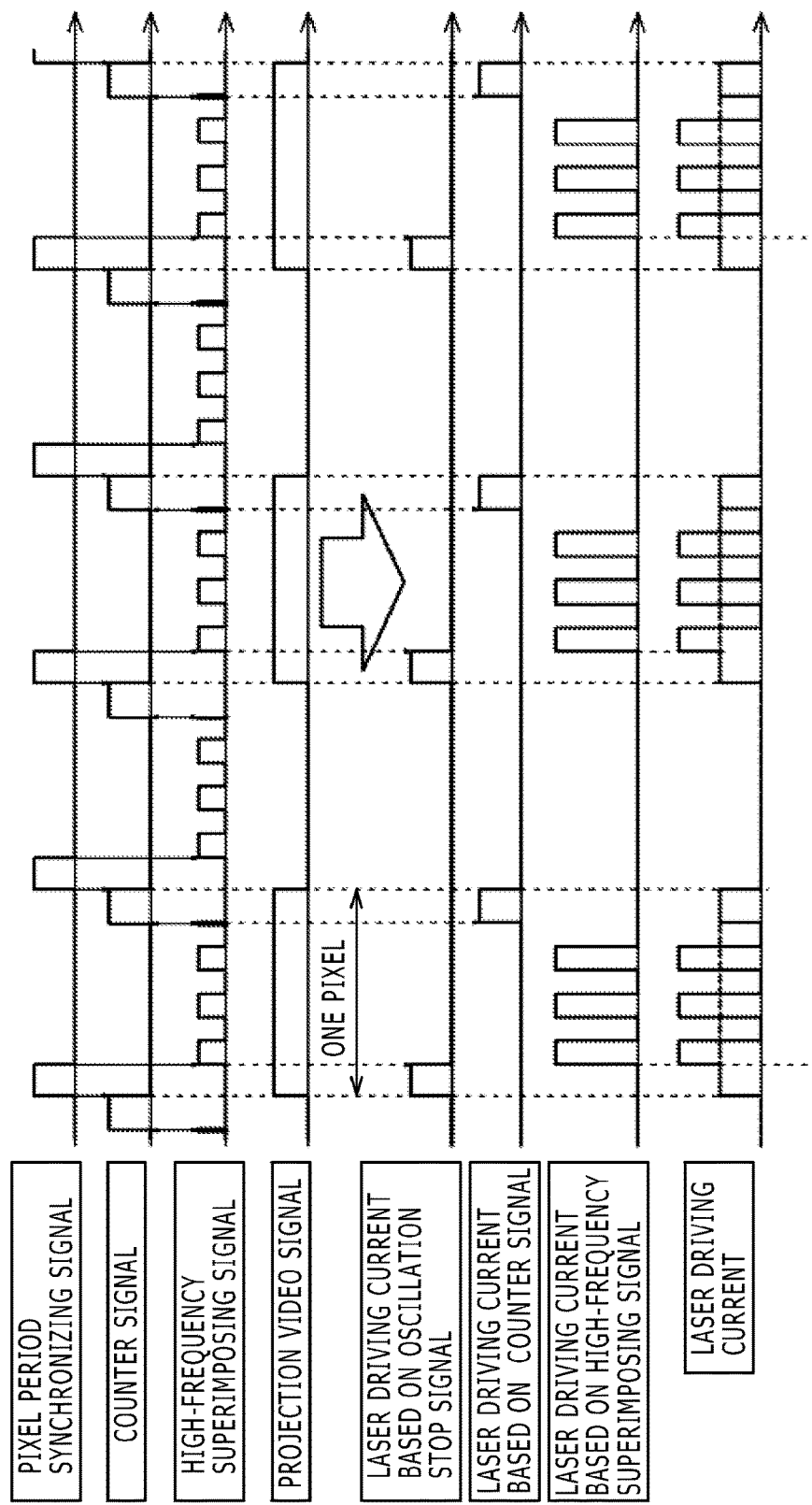
FIG. 43 is a timing waveform chart showing an example of laser driving current on which a high-frequency signal whose oscillation stop/oscillation start is synchronized with the pixel periods of a projection video signal is superimposed in the seventeenth example.

FIG. 43 is a timing waveform chart of an example of laser driving current on which the high-frequency signal whose oscillation stop/oscillation start is synchronized with the pixel periods of a projection video signal is superimposed in the seventeenth example.

When the count value of the counter 173 that counts the output of the superimposing signal oscillator 123 reaches a set value within a pixel period, a control signal (counter signal) for controlling a stop of oscillation of the superimposing signal oscillator 123 can be generated within the pixel period.

In FIG. 43, the counter value (set value) is set to four. The counter 173 outputs a counter signal at a fourth rising edge of the high-frequency superimposing signal, and the counter 173 is reset in the pixel period. The superimposing signal oscillator 123 is stopping oscillation according to the pixel period synchronizing signal even after the counter 173 is reset. The superimposing signal oscillator 123 starts oscillating in fall timing synchronized with a pixel period. When the count value is set to an optimum value, it is possible to obtain the waveform of stable laser driving current without the high-frequency signal superimposed thereon at a time of pixel switching.

In the example of FIG. 43, the amplifiers/attenuators $171_R$, $171_G$, and $171_B$ are set to ½, and produce output during superimposition stop periods, whereby average driving current can retain ½ of the video signal even during the superimposition stop periods.

Incidentally, in the example of FIG. 43, the amplifiers/attenuators $171_R$, $171_G$, and $171_B$ common to the pixel period synchronizing signal and the counter signal are used. However, when respective different amplifiers/attenuators for the pixel period synchronizing signal and the counter signal are provided, and power at times of a start and an end of a pixel is adjusted, luminance can be controlled more accurately. In addition, it is possible to adopt a configuration without the amplifiers/attenuators $171_R$, $171_G$, and $171_B$ in which configuration the oscillation of the superimposing signal oscillator 123 is stopped by the pixel period synchronizing signal, and the oscillation of the superimposing signal oscillator 123 is started by the counter signal.

In the tenth to seventeenth examples described above, description has been made of application to the laser driving circuits that basically include the superimposing signal oscillator 123 and the video signal switches $125_R$, $125_G$, and $125_B$ in addition to the laser driving video current generating circuits $121_R$, $121_G$, and $121_B$. However, the technology according to the present disclosure is not limited to application to the laser driving circuits of such a configuration. A case of application to a laser driving circuit of another configuration will be described in the following as an eighteenth example.

6-9. Eighteenth Example

Figure 44:
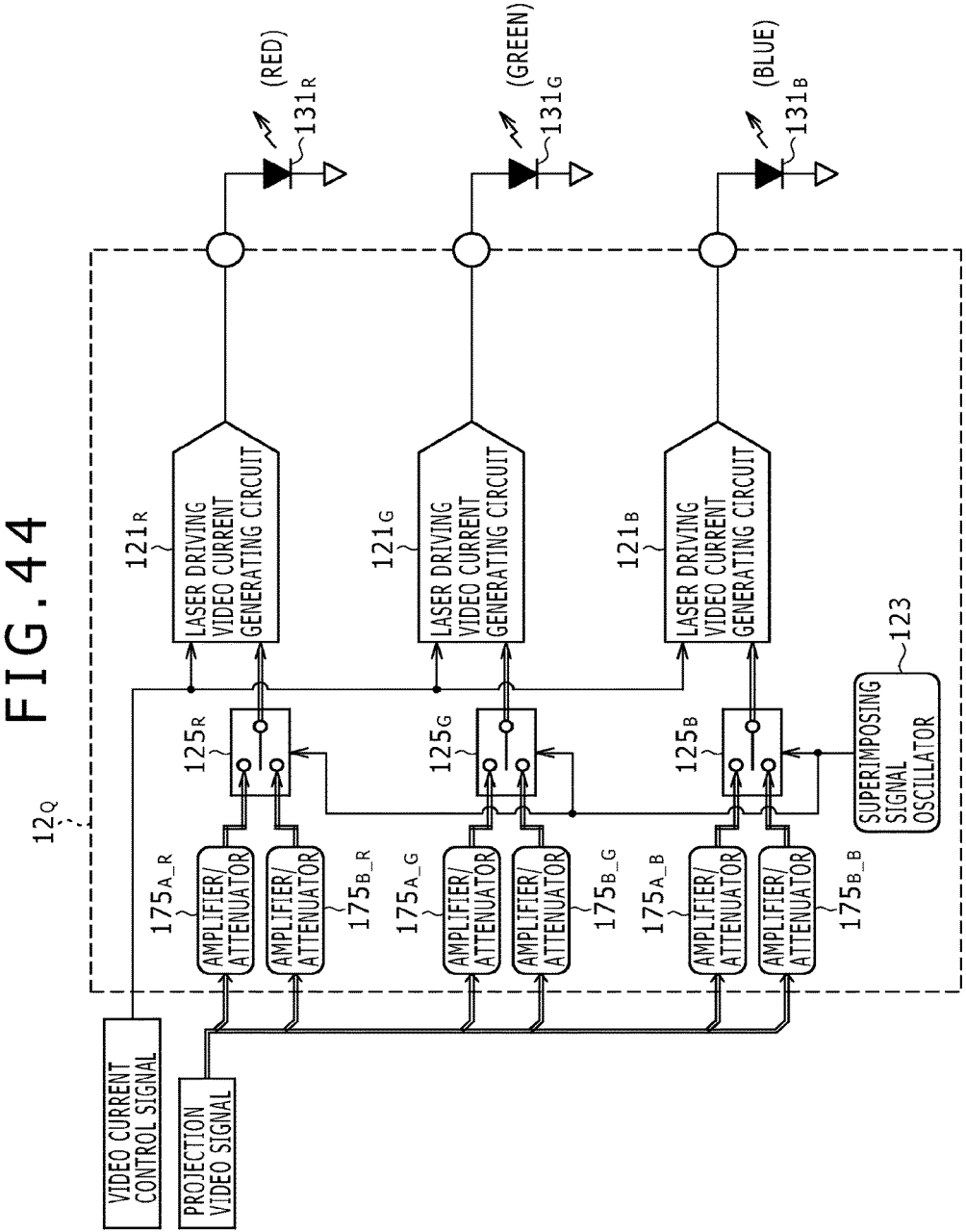
FIG. 44 is a block diagram showing a configuration of a laser driving circuit according to an eighteenth example.

FIG. 44 is a block diagram showing a configuration of a laser driving circuit according to the eighteenth example. The laser driving circuit $12_Q$ according to the eighteenth example includes a plurality of amplifiers/attenuators (two amplifiers/attenuators in the present example) 175A and $175_B$ in addition to video signal switches $125_R$, $125_G$, and $125_B$ for each of laser driving video current generating circuits $121_R$, $121_G$, and $121_B$ on the input side of these laser driving video current generating circuits $121_R$, $121_G$, and $121_B$.

The functions of the two amplifiers/attenuators $175_{A\_R}$ and $175_{B\_R}$ and the video signal switch $125_R$ on a red side will be concretely described in the following. However, the amplifiers/attenuators $175_{A\_G}$ and $175_{B\_G}$ and the video signal switch $125_G$ on a green side and the amplifiers/attenuators $175_{A\_B}$ and $175_{B\_B}$ and the video signal switch $125_B$ on a blue side have similar functions.

The two amplifiers/attenuators $175_{A\_G}$ and $175_{B\_G}$ have respective different gains, and generate two projection video signals of different amplitudes on the basis of an input projection video signal. The two projection video signals are two inputs to the video signal switch $125_R$. The video signal switch $125_R$ selects (switches) the two projection video signals generated by the two amplifiers/attenuators $175_{A\_G}$ and $175_{B\_G}$ according to a high-frequency signal supplied from a superimposing signal oscillator 123.

With the above configuration, the video signal switch $125_R$ can select the two projection video signals of different amplitudes according to the H/L of the high-frequency signal output by the superimposing signal oscillator 123. Here, H denotes a high level of the high-frequency signal, and L denotes a low level of the high-frequency signal. For example, when the gain of one of the two amplifiers/attenuators $175_{A\_G}$ and $175_{B\_G}$ is two, and the gain of the other of the amplifiers/attenuators $175_{A\_R}$ and $175_{B\_R}$ is zero, a projection video signal on which the high-frequency signal is superimposed as shown in FIG. 45 is generated, and input to the laser driving video current generating circuit $121_R$.

The laser driving video current generating circuit $121_R$ amplifies the projection video signal on which the high-frequency signal is superimposed to a current value necessary for driving the laser light source $131_R$, and supplies the current value as laser driving current to the laser light source $131_R$. At this time, the laser driving current is supplied to the laser light source $131_R$ and drives the laser light source $131_R$ as the current on which the high-frequency signal is superimposed.

The amplitude of the high-frequency signal superimposed on the laser driving current can be set arbitrarily by the gains of the two amplifiers/attenuators $175_{A\_G}$ and $175_{B\_G}$. As another example, when the gain of one of the two amplifiers/attenuators $175_{A\_G}$ and $175_{B\_G}$ is 1.75, and the gain of the other of the amplifiers/attenuators $175_{A\_G}$ and $175_{B\_G}$ is 0.25, a projection video signal, or in turn a laser driving current, on which the high-frequency signal of smaller amplitude than in FIG. 45 is superimposed, as shown in FIG. 46, can be generated.

Figure 45:
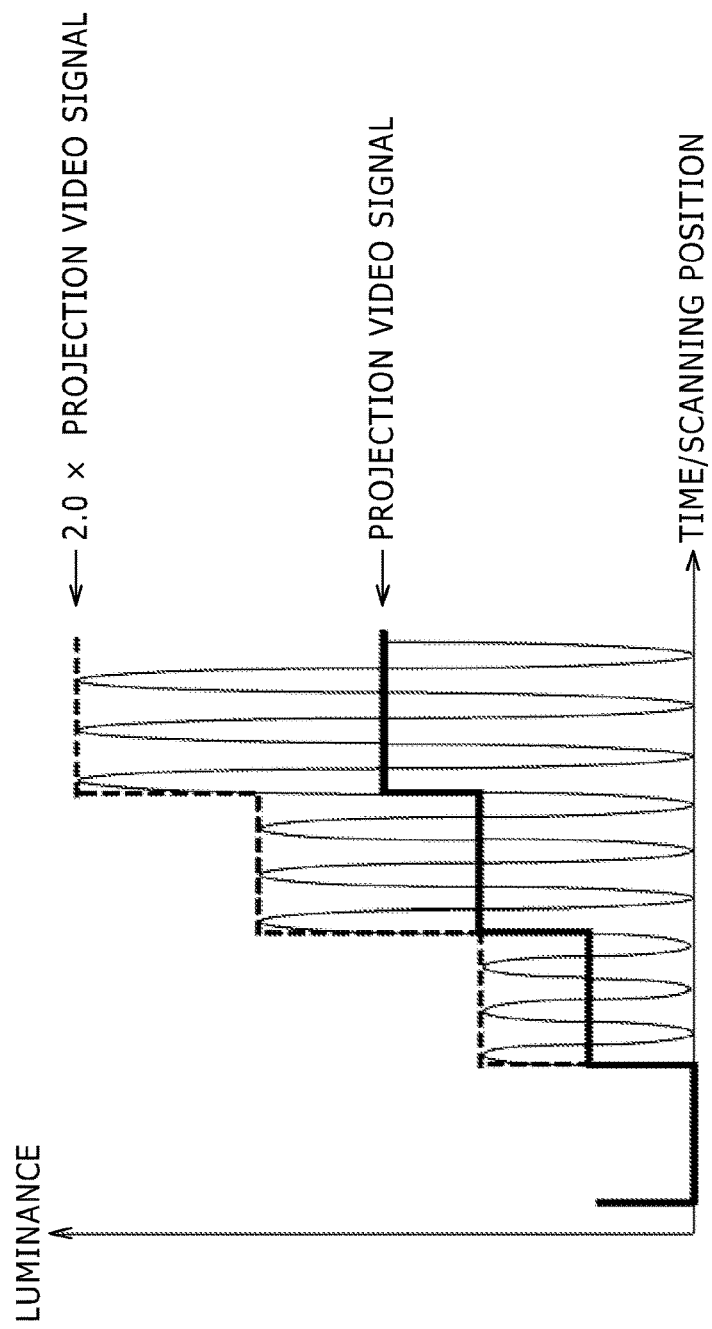
FIG. 45 is a waveform chart (1) showing relation between the gains of two amplifiers/attenuators and the amplitude of a high-frequency signal in the eighteenth example.
Figure 46:
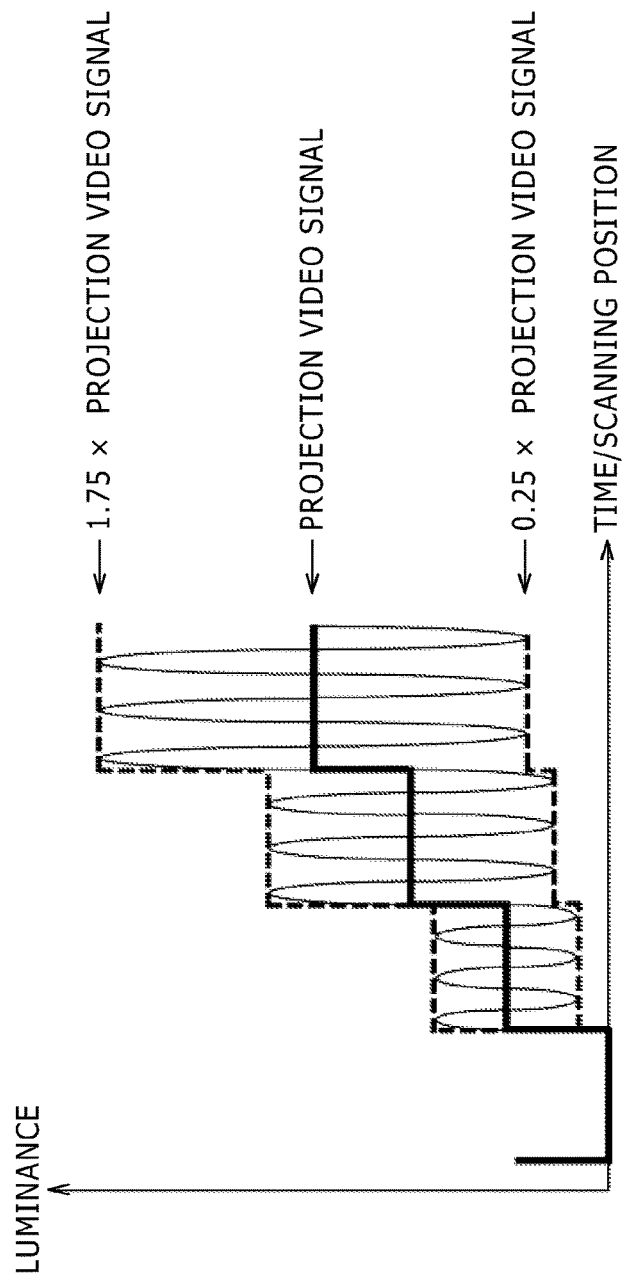
FIG. 46 is a waveform chart (1) showing relation between the gains of the two amplifiers/attenuators and the amplitude of the high-frequency signal in the eighteenth example.

As described above, according to the laser driving circuit $12_Q$ according to the eighteenth example, the high-frequency signal whose amplitude is proportional to the level of the projection video signal can be superimposed on the laser driving current, as shown in FIG. 45 and FIG. 46. Thereby, in a part of a zero level of the projection video signal, the amplitude of the high-frequency signal superimposed on the laser driving current is also zero, so that a problem of emission of laser light in the part where luminance should be zero can be avoided. In addition, in a state in which the level of the projection video signal is zero, the laser light is not emitted, and thus the problem of speckle noise does not occur. Therefore the process of superimposing the high-frequency signal on the laser driving current is not necessary.

On the other hand, the higher the level of the projection video signal, the more conspicuous the speckle noise. For this, the higher the level of the projection video signal, the larger the amplitude of the high-frequency signal superimposed on the laser driving current, thus acting to strengthen (enhance) an effect of reducing the speckle noise.

Each of the examples (tenth to seventeenth examples) in the third embodiment described earlier, in which the high-frequency signal to be superimposed on the laser driving current is synchronized with the projection video signal, can be applied also to the superimposing signal oscillator 123 in the laser driving circuit $12_Q$ according to the eighteenth example. Then, by the application, the action and effect of the tenth to seventeenth examples can be obtained in addition to action and effect of the present eighteenth example.

In the above, a case of application to the laser driving circuit 12 configured such that the process of superimposing the high-frequency signal on the laser driving current is performed on the input side of the laser driving video current generating circuits $121_R$, $121_G$, and $121_B$ has been described as the third embodiment. The technology according to the present disclosure can be similarly applied also to a laser driving circuit 12 configured such that the process of superimposing the high-frequency signal on the laser driving current is performed on the output side of the laser driving video current generating circuits $121_R$, $121_G$, and $121_B$.

7. Fourth Embodiment

In the following, description will be made of laser driving circuits 12 according to various examples of a fourth embodiment as a case of application to a laser driving circuit 12 configured such that the process of superimposing the high-frequency signal on the laser driving current is performed on the output side of the laser driving video current generating circuits $121_R$, $121_G$, and $121_B$.

7-1. Nineteenth Example

Figure 47:
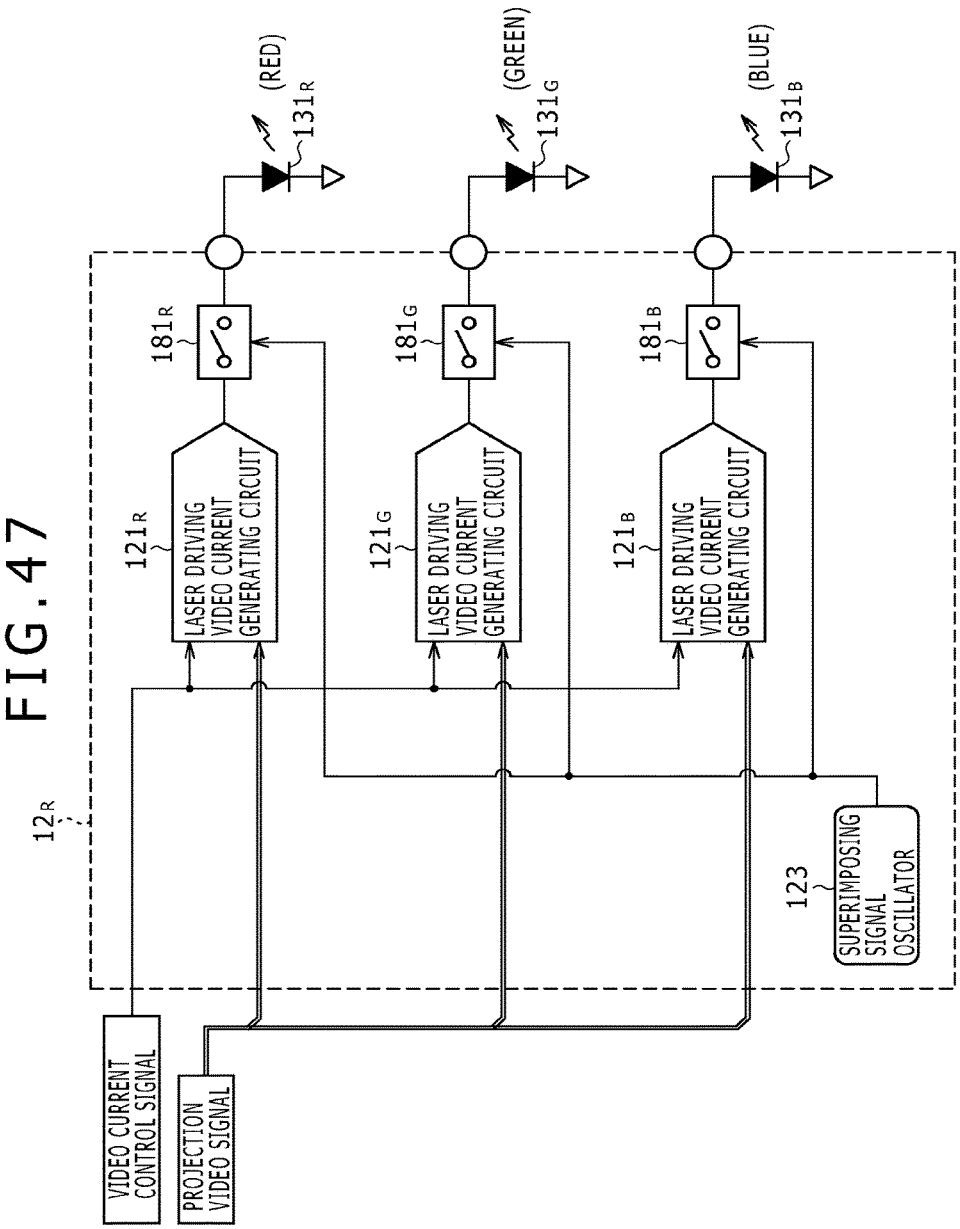
FIG. 47 is a block diagram showing a configuration of a laser driving circuit according to a nineteenth example.

FIG. 47 is a block diagram showing a configuration of a laser driving circuit according to a nineteenth example. The laser driving circuit $12_R$ according to the nineteenth example includes, as a high-frequency superimposing section, a laser driving current switch 181 ($181_R$, $181_G$, and $181_B$) for each of laser driving video current generating circuits $121_R$, $121_G$, and $121_B$ on the output side of the laser driving video current generating circuits $121_R$, $121_G$, and $121_B$ in addition to a built-in superimposing signal oscillator 123. The laser driving current switches $181_R$, $181_G$, and $181_B$ have a function of passing/interrupting laser driving currents generated by the laser driving video current generating circuits $121_R$, $121_G$, and $121_B$.

In the laser driving circuit $12_R$ according to the nineteenth example having the above configuration, the passage/interruption of the laser driving current switch 181 is controlled according to a high-frequency signal supplied from the superimposing signal oscillator 123, whereby the high-frequency signal can be superimposed on the laser driving currents generated by the laser driving video current generating circuits $121_R$, $121_G$, and $121_B$.

Also in this case, as in the eighteenth example, the high-frequency signal whose amplitude is proportional to the level of a projection video signal can be superimposed on the laser driving currents (see FIG. 45). As a result, similar action and effect to those of the eighteenth example can be obtained. Specifically, in a part of a zero level of the projection video signal, the amplitude of the high-frequency signal superimposed on the laser driving currents is also zero. In addition, the higher the level of the projection video signal, the larger the amplitude of the high-frequency signal superimposed on the laser driving currents. Therefore an effect of reducing speckle noise can be strengthened.

7-2. Twentieth Example

Figure 48:
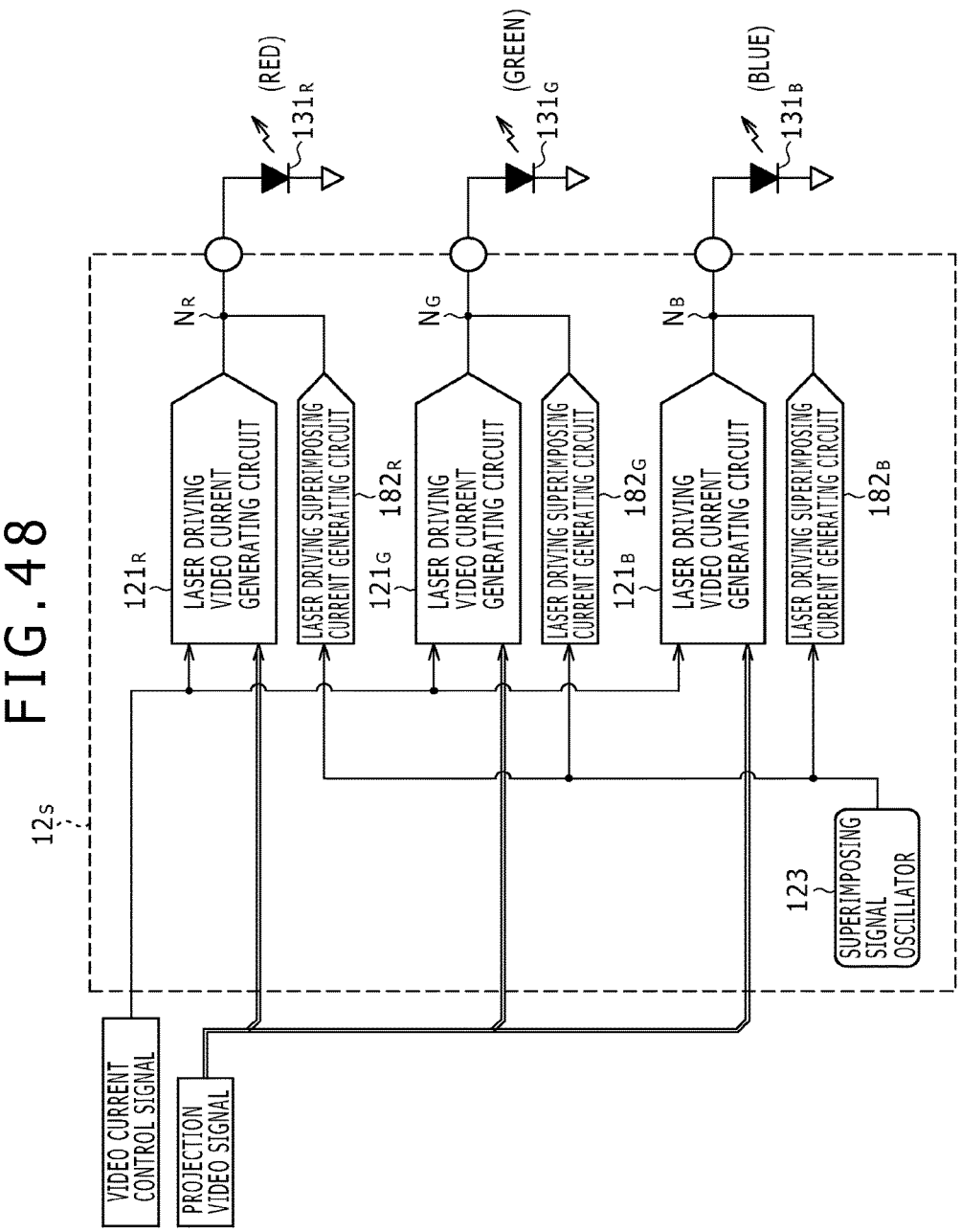
FIG. 48 is a block diagram showing a configuration of a laser driving circuit according to a twentieth example.

FIG. 48 is a block diagram showing a configuration of a laser driving circuit according to a twentieth example. The laser driving circuit $12_S$ according to the twentieth example includes, as a high-frequency superimposing section, a laser driving superimposing current generating circuit 182 ($182_R$, $182_G$, and $182_B$) for amplifying a high-frequency signal supplied from a built-in superimposing signal oscillator 123, in addition to the superimposing signal oscillator 123. The laser driving superimposing current generating circuits $182_R$, $182_G$, and $182_B$ have output terminals thereof connected to connection nodes $N_R$, $N_G$, and $N_B$ on the output side of laser driving video current generating circuits $121_R$, $121_G$, and $121_B$.

In the laser driving circuit $12_S$ according to the twentieth example having the above configuration, the laser driving superimposing current generating circuits $182_R$, $182_G$, and $182_B$ amplify the high-frequency signal output from the superimposing signal oscillator 123 to a level necessary for driving laser light sources $131_R$, $131_G$, and $131_B$. Then, high-frequency currents output from the laser driving superimposing current generating circuits $182_R$, $182_G$, and $182_B$ are added to the output currents of the laser driving video current generating circuits $121_R$, $121_G$, and $121_B$, that is, the laser driving currents at the connection nodes $N_R$, $N_G$, and $N_B$, and then supplied to the laser light sources $131_R$, $131_G$, and $131_B$.

In the case of the laser driving circuit $12_S$ according to the twentieth example, the high-frequency currents of a fixed amplitude are superimposed on the laser driving currents irrespective of the level of a projection video signal. Thereby, though an effect as in the case of the superimposition such that the amplitude of the high-frequency signal is proportional to the level of the projection video signal cannot be obtained, an effect of high-frequency superimposition, that is, an effect of reducing speckle noise as a result of widening the wavelength spectrum of laser light and decreasing coherence can be obtained.

7-3. Twenty-First Example

Figure 49:
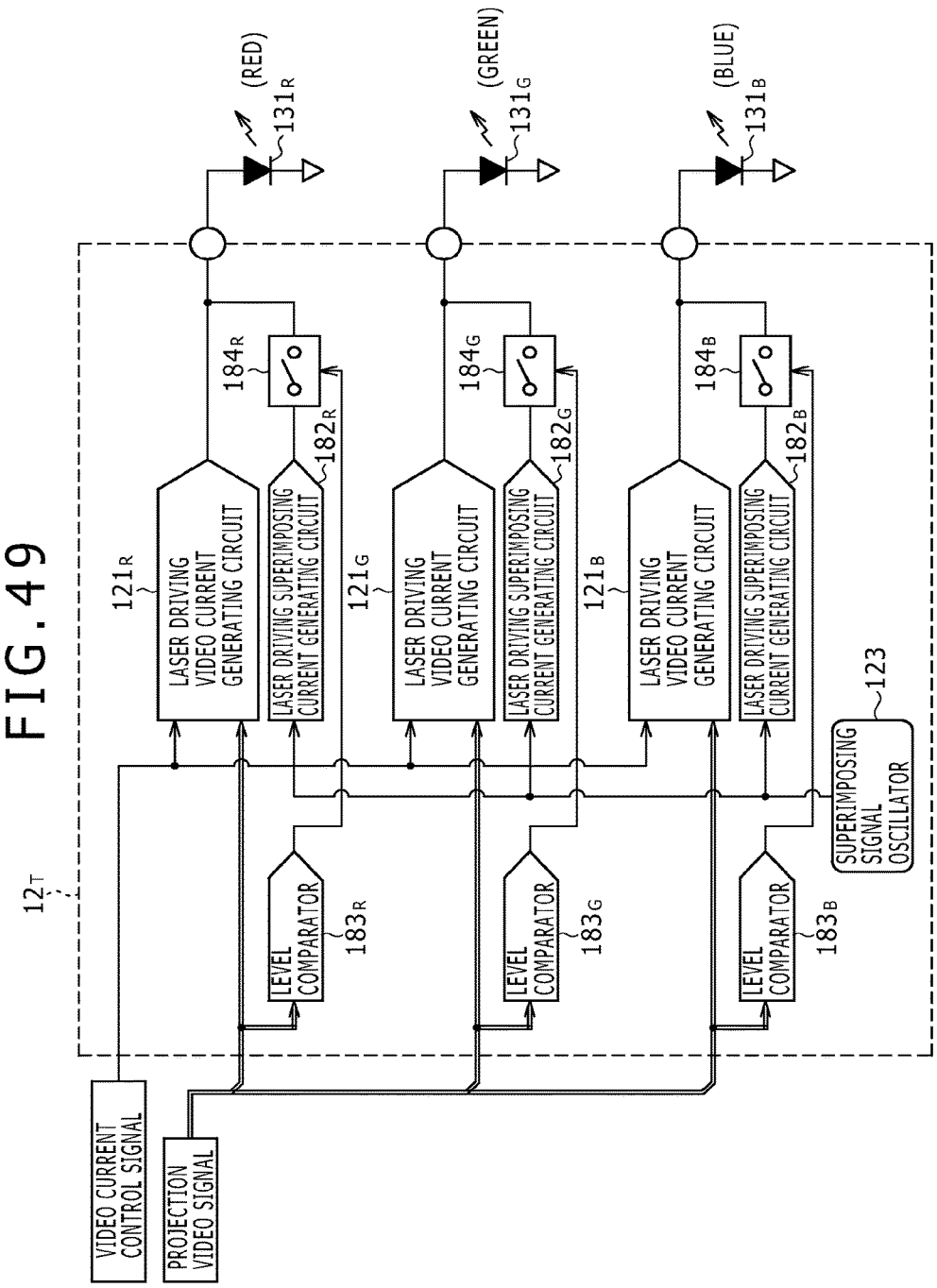
FIG. 49 is a block diagram showing a configuration of a laser driving circuit according to a twenty-first example.

FIG. 49 is a block diagram showing a configuration of a laser driving circuit according to a twenty-first example. The laser driving circuit $12_T$ according to the twenty-first example includes, as a high-frequency superimposing section, a level comparator 183 and a superimposing current switch 184 for each of laser driving video current generating circuits $121_R$, $121_G$, and $121_B$ in addition to a built-in superimposing signal oscillator 123 and a laser driving superimposing current generating circuit 182.

The level comparator 183 ($183_R$, $183_G$, and $183_B$) has a function of determining the magnitude of the level of an input projection video signal with respect to a predetermined threshold value. The predetermined threshold value is a threshold value for determining the level of the projection video signal, and is set at a value in the vicinity of a zero level of the projection video signal. Here, "the vicinity of a zero level" includes not only levels somewhat higher or lower than the zero level but also the zero level. In detecting the zero level of the projection video signal, various variations in the predetermined threshold value which variations occur in design or in manufacturing are tolerated.

The superimposing current switches $184_R$, $184_G$, and $184_B$ are connected between the output terminals of the laser driving superimposing current generating circuits $182_R$, $182_G$, and $182_B$ and the output terminals of the laser driving video current generating circuits $121_R$, $121_G$, and $121_B$. The superimposing current switches $184_R$, $184_G$, and $184_B$ perform on (closing)/off (opening) operation according to comparison results (determination results) of the level comparators $183_R$, $183_G$, and $183_B$.

In the laser driving circuit $12_T$ according to the present twenty-first example having the above configuration, when the level comparator 183 determines that the level of the video signal exceeds the predetermined threshold value, the level comparator 183 sets the superimposing current switch 184 in a conducting (on) state on the basis of the result of the determination. Thereby, the high-frequency current output from the laser driving superimposing current generating circuit 182 passes through the superimposing current switch 184, and is added to (superimposed on) the laser driving current output from the laser driving video current generating circuit 121.

According to the laser driving circuit $12_T$ according to the present twenty-first example, in addition to the effect of high-frequency superimposition, the level comparator 183 can act to prevent the high-frequency signal from being superimposed on the laser driving current when detecting that the level of the projection video signal is zero (equal to or lower than the predetermined threshold value). As a result, when the level of the projection video signal is zero, laser light is not emitted, and therefore luminance can be lowered to zero.

7-4. Twenty-Second Example

FIG. 50 is a block diagram showing a configuration of a laser driving circuit according to a twenty-second example. The laser driving circuit $12_U$ according to the twenty-second example includes a multiplier 185 ($185_R$, $185_G$, and $185_B$) for each of laser driving video current generating circuits $121_R$, $121_G$, and $121_B$ in place of the level comparator 183 and the superimposing current switch 184 in the laser driving circuit $12_T$ according to the twenty-first example.

The multipliers $185_R$, $185_G$, and $185_B$ are supplied with a high-frequency signal output from a superimposing signal oscillator 123 and projection video signals of respective wavelengths, and multiply together the high-frequency signal and the projection video signals. The respective output signals of the multipliers $185_R$, $185_G$, and $185_B$ are input to laser driving superimposing current generating circuits $182_R$, $182_G$, and $182_B$. The laser driving superimposing current generating circuits $182_R$, $182_G$, and $182_B$ amplify the respective output signals of the multipliers $185_R$, $185_G$, and $185_B$ to a level necessary for laser driving. The respective output currents of the laser driving superimposing current generating circuits $182_R$, $182_G$, and $182_B$ are added to the respective output currents of the laser driving video current generating circuits $121_R$, $121_G$, and $121_B$ at connection nodes NR, NG, and NB.

Also in the laser driving circuit $12_U$ according to the twenty-second example having the above configuration, similar action and effect to those of the eighteenth example can be obtained. Specifically, in a part of a zero level of the projection video signal, the amplitude of the high-frequency signal superimposed on the laser driving current is also zero. In addition, the higher the level of the projection video signal, the larger the amplitude of the high-frequency signal superimposed on the laser driving current. Therefore an effect of reducing speckle noise can be strengthened.

Here, respective gains of the multipliers $185_R$, $185_G$, and $185_B$ and the laser driving superimposing current generating circuits $182_R$, $182_G$, and $182_B$ can be made adjustable, and the amplitude of the high-frequency signal to be superimposed on the laser driving current can be changed by adjusting these gains. For example, by setting the amplitude of the high-frequency signal to be added relatively somewhat small, the high-frequency signal of a relatively somewhat small amplitude can be superimposed on the laser driving current. In this case, in addition to making adjustable the gains of both of the multipliers $185_R$, $185_G$, and $185_B$ and the laser driving superimposing current generating circuits $182_R$, $182_G$, and $182_B$, it is also possible to make adjustable the gains of either the multipliers $185_R$, $185_G$, and $185_B$ or the laser driving superimposing current generating circuits $182_R$, $182_G$, and $182_B$.

The technology according to the present disclosure can be applied also to the above-described laser driving circuits 12 ($12_R$ to $12_U$) according to the fourth embodiment in which the process of superimposing the high-frequency signal on the laser driving current is performed on the output side of the laser driving video current generating circuits $121_R$, $121_G$, and $121_B$. That is, the tenth to seventeenth examples in which the high-frequency signal to be superimposed on the laser driving current is synchronized with the projection video signal can be applied. Then, by the application, the action and effect of the tenth to seventeenth examples can be obtained in addition to action and effect of the nineteenth to twenty-second examples.

8. Constitutions According to Present Disclosure

Incidentally, the present disclosure can adopt the following constitutions.

[1] A laser driving circuit including:
a plurality of laser driving video current generating circuits for generating laser driving current for driving a plurality of laser light sources emitting laser light of different wavelengths on a basis of an input video signal; and
a high-frequency superimposing section configured to superimpose a high-frequency signal of a frequency exceeding a band of the video signal on the laser driving current generated by the plurality of laser driving video current generating circuits.

[2] The laser driving circuit according to the above [1], wherein the high-frequency superimposing section performs a process of superimposing the high-frequency signal on the laser driving current on an input side of the plurality of laser driving video current generating circuits.

[3] The laser driving circuit according to the above [2], wherein the high-frequency superimposing section superimposes the high-frequency signal on the laser driving current by switching the video signal input to the plurality of laser driving video current generating circuits according to the high-frequency signal.

[4] The laser driving circuit according to the above [3], wherein
the high-frequency superimposing section includes a plurality of amplifiers/attenuators for generating a plurality of video signals of different amplitudes on the basis of the input video signal, for each of the plurality of laser driving video current generating circuits, and
the high-frequency superimposing section superimposes the high-frequency signal having amplitudes corresponding to levels of the plurality of video signals on the laser driving current by selecting the plurality of video signals according to the high-frequency signal.

[5] The laser driving circuit according to the above [1], wherein the high-frequency superimposing section performs a process of superimposing the high-frequency signal on the laser driving current on an output side of the plurality of laser driving video current generating circuits.

[6] The laser driving circuit according to the above [5], wherein
the high-frequency superimposing section includes a laser driving current switch having a function of passing/interrupting the laser driving current generated by the plurality of laser driving video current generating circuits, and
the high-frequency superimposing section superimposes the high-frequency signal on the laser driving current by controlling passage/interruption of the laser driving current switch according to the high-frequency signal.

[7] The laser driving circuit according to the above [5], wherein
the high-frequency superimposing section includes a laser driving superimposing current generating circuit for amplifying the high-frequency signal, and
the high-frequency superimposing section superimposes the high-frequency signal on the laser driving current by adding output current of the laser driving superimposing current generating circuit to the laser driving current generated by the plurality of laser driving video current generating circuits.

[8] The laser driving circuit according to the above [7], wherein
the high-frequency signal includes
a superimposing current switch having a function of passing/interrupting the output current of the laser driving superimposing current generating circuit, and
a level comparator for determining magnitude of level of the video signal with respect to a predetermined threshold value, and
the high-frequency superimposing section adds the output current of the laser driving superimposing current generating circuit to the laser driving current by setting the superimposing current switch in a conducting state when the level of the video signal exceeds the predetermined threshold value.

[9] The laser driving circuit according to the above [7], wherein
the high-frequency superimposing section includes a multiplier for generating, by multiplying together the video signal and the high-frequency signal, a high-frequency signal having amplitude corresponding to level of the video signal, and the high-frequency superimposing section inputs the high-frequency signal generated by the multiplier to the laser driving superimposing current generating circuit.

[10] The laser driving circuit according to the above [9], wherein gain of the multiplier is adjustable.

[11] The laser driving circuit according to the above [9], wherein gain of the laser driving superimposing current generating circuit is adjustable.

[12] The laser driving circuit according to any one of the above [1] to the above [6] and the above [8] to the above [11], wherein the high-frequency superimposing section sets amplitude of the high-frequency signal superimposed on the video signal to zero in a part of a zero level of the input video signal.

[13] The laser driving circuit according to any one of the above [1] to the above [12], wherein the high-frequency superimposing section has an oscillator incorporated in the laser driving circuit as a signal source of the high-frequency signal.

[14] The laser driving circuit according to any one of the above [1] to the above [12], wherein the high-frequency superimposing section has a receiver for receiving a clock signal input from an outside of the laser driving circuit in a state of being synchronized with the input video signal as a signal source of the high-frequency signal.

[15] The laser driving circuit according to the above [14], wherein the clock signal has a frequency higher than the frequency band of the input video signal and is synchronized with a period of a minimum unit for repeating brightness and darkness of the video signal.

[16] The laser driving circuit according to the above [14] or the above [15], wherein the high-frequency superimposing section includes a frequency multiplier for multiplying a frequency of the clock signal received by the receiver.

[17] The laser driving circuit according to the above [16], wherein the frequency multiplier generates a high-frequency signal having a frequency of an integral multiple of the frequency of the clock signal and synchronized with the clock signal.

[18] A laser driving method including:
a plurality of laser driving video current generating steps of generating laser driving current for driving a plurality of laser light sources emitting laser light of different wavelengths on a basis of an input video signal; and
a high-frequency superimposing step of superimposing a high-frequency signal of a frequency exceeding a band of the video signal on the laser driving current generated in the plurality of laser driving video current generating steps.

[19] The laser driving method according to the above [18], wherein in the high-frequency superimposing step, amplitude of the high-frequency signal is changed according to level of the input video signal.

[20] A device using a laser driving circuit, the laser driving circuit including: a plurality of laser driving video current generating circuits for generating laser driving current for driving a plurality of laser light sources emitting laser light of different wavelengths on a basis of an input video signal; and
a high-frequency superimposing section configured to superimpose a high-frequency signal of a frequency exceeding a band of the video signal on the laser driving current generated by the plurality of laser driving video current generating circuits.

[21] A laser driving circuit including:
a plurality of laser driving video current generating circuits for generating laser driving current for driving a plurality of laser light sources emitting laser light of different wavelengths on a basis of an input video signal; and
a high-frequency superimposing section including an oscillator for oscillating a high-frequency signal of a frequency exceeding a band of the video signal on a basis of a signal synchronized with the video signal, and superimposing the high-frequency signal on the laser driving current generated by the plurality of laser driving video current generating circuits.

[22] The laser driving circuit according to the above [21], wherein the oscillator includes an oscillation phase synchronizing circuit for controlling an oscillation stop/oscillation start of the oscillator according to the signal synchronized with the video signal.

[23] The laser driving circuit according to the above [21] or the above [22], wherein the signal synchronized with the video signal is a pixel period synchronizing signal indicating a start of a pixel as a minimum unit for repeating brightness and darkness of the video signal.

[24] The laser driving circuit according to any one of the above [21] to the above [23], wherein the high-frequency superimposing section includes a pixel period extracting circuit for extracting the pixel period synchronizing signal from the video signal, and supplying the pixel period synchronizing signal as the signal synchronized with the video signal to the oscillator.

[25] The laser driving circuit according to the above [21] or the above [22], wherein the high-frequency superimposing section includes a level change detecting circuit for determining level information of the video signal for each pixel as a minimum unit for repeating brightness and darkness of the video signal, detecting a level change, and supplying a signal synchronized with the level change as the signal synchronized with the video signal to the oscillator.

[26] The laser driving circuit according to any one of the above [22] to the above [25], wherein
the high-frequency superimposing section includes an oscillation stop period setting circuit for setting an arbitrary oscillation stop period or an oscillation stop period interlocked with the frequency of the high-frequency signal, and
the oscillator starts oscillation after stopping oscillation during the oscillation stop period set by the oscillation stop period setting circuit.

[27] The laser driving circuit according to the above [22] or the above [23], wherein the high-frequency superimposing section includes a plurality of oscillators, and the oscillation phase synchronizing circuit uses, during an oscillation stop period of one oscillator, oscillation output of another oscillator as the high-frequency signal to be superimposed on the laser driving current, by switching between the oscillation outputs of the plurality of oscillators.

[28] The laser driving circuit according to any one of the above [22] to the above [26], wherein the high-frequency superimposing section includes a plurality of amplifiers/attenuators for adjusting amplitude of the input video signal, the plurality of amplifiers/attenuators being provided so as to correspond to the plurality of laser driving video current generating circuits, and the high-frequency superimposing section adjusts luminance by selecting output of the amplifiers/attenuators during an oscillation stop period.

[29] The laser driving circuit according to the above [22], the above [23], or the above [28], wherein
the high-frequency superimposing section includes a counter for counting output of the oscillator, and outputting a counter signal when a count value has reached a predetermined set value, and the oscillator stops oscillating by receiving the counter signal output by the counter.

[30] A laser driving method including:
a plurality of laser driving video current generating steps of generating laser driving current for driving a plurality of laser light sources emitting laser light of different wavelengths on a basis of an input video signal;
an oscillating step of oscillating a high-frequency signal of a frequency exceeding a band of the video signal on a basis of a signal synchronized with the video signal; and a high-frequency superimposing step of superimposing the high-frequency signal oscillated in the oscillating step on the laser driving current generated in the plurality of laser driving video current generating steps.

[31] A projector device including:
a plurality of laser light sources for emitting laser light of different wavelengths; a laser driving circuit for driving the plurality of laser light sources according to an input video signal; and
a scanner section configured to project the laser light emitted from the plurality of laser light sources onto a screen; wherein
the laser driving circuit includes
a plurality of laser driving video current generating circuits for generating laser driving current for driving the plurality of laser light sources on a basis of the video signal, and
a high-frequency superimposing section including an oscillator for oscillating a high-frequency signal of a frequency exceeding a band of the video signal on a basis of a signal synchronized with the video signal, and superimposing the high-frequency signal on the laser driving current generated by the plurality of laser driving video current generating circuits.

[32] A device using a laser driving circuit, the laser driving circuit including:
a plurality of laser driving video current generating circuits for generating laser driving current for driving a plurality of laser light sources emitting laser light of different wavelengths on a basis of an input video signal; and
a high-frequency superimposing section including an oscillator for oscillating a high-frequency signal of a frequency exceeding a band of the video signal on a basis of a signal synchronized with the video signal, and superimposing the high-frequency signal on the laser driving current generated by the plurality of laser driving video current generating circuits.

REFERENCE SIGNS LIST

10 . . . Pico projector of a laser beam scanning system
11 . . . Video signal processing circuit
12 ($12_A$ to $12_U$) . . . Laser driving circuit
13 . . . Light source section
14 . . . Scanner section
15 . . . Light receiving element
16 . . . Scanner driving circuit
$120_R$, $120_G$, $120_B$ . . . Driving section
$121_R$, $121_G$, $121_B$ . . . Laser driving video current generating circuit
$122_R$, $122_G$, $122_B$ . . . Base current generating circuit
123 . . . Superimposing signal oscillator
$124_{A\_R}$, $124_{B\_R}$, $124_{A\_G}$, $124_{B\_G}$, $124_{A\_B}$, $124_{B\_B}$ . . . Amplifier/attenuator
$125_R$, $125_G$, $125_B$, $172_R$, $172_G$, $172_B$ . . . Video signal switch
126 . . . Receiver
127 . . . Frequency multiplier
128 . . . Oscillation phase synchronizing circuit
129 . . . Pixel period extracting circuit
130 . . . Level change detecting circuit
$131_R$, $131_G$, $131_B$ . . . Laser light source
140 . . . Oscillation stop period setting circuit
151 . . . Frequency divider
152 . . . Inverter
153, 174 . . . OR gate
$171_R$, $171_G$, $171_B$, $175_{A\_R}$, $175_{B\_R}$, $175_{A\_G}$, $175_{B\_G}$, $175_{A\_B}$, $175_{B\_B}$ . . . Amplifier/attenuator
173 . . . Counter
$181_R$, $181_G$, $181_B$ . . . Laser driving current switch
$182_R$, $182_G$, $182_B$ . . . Laser driving superimposing current generating circuit
$183_R$, $183_G$, $183_B$ . . . Level comparator
$184_R$, $184_G$, $184_B$ . . . Superimposing current switch
$185_R$, $185_G$, $185_B$ . . . Multiplier

The invention claimed is:

1. A projection apparatus comprising:
an optical circuit including a light source unit;
a signal processing circuit configured to generate an input video signal; and
a laser driving circuit including:
a laser driving video current generating circuit for generating a laser driving current for driving the light source unit;
a high-frequency superimposing section configured to superimpose a high-frequency signal of a frequency exceeding a band of the input video signal on the laser driving current generated by the laser driving video current generating circuit; and
a receiver in the high-frequency superimposing section, the receiver is configured to receive a clock signal input from an outside of the laser driving circuit in a state of being synchronized with the input video signal as a signal source of the high-frequency signal,
wherein a frequency of the high-frequency signal is synchronized with a pixel period.

2. A projection apparatus according to claim 1, wherein the clock signal is synchronized with the input video signal before the high-frequency superimposing section receives the clock signal.

3. A projection apparatus according to claim 1, wherein the light source unit is controllable by the laser driving current to emit different wavelengths of light.

4. A projection apparatus according to claim 1, wherein the high-frequency superimposing section is configured to superimpose the high-frequency signal on the laser driving current by switching the input video signal input to the laser driving video current generating circuits according to the high-frequency signal.

5. A projection apparatus according to claim 1, wherein the high-frequency superimposing section is configured to perform a process of superimposing the high-frequency signal on the laser driving current on an input side of the laser driving video current generating circuits.

6. A projection apparatus according to claim 1, wherein the high-frequency superimposing section is configured to perform a process of superimposing the high-frequency signal on the laser driving current on an output side of the laser driving video current generating circuits.

7. A projection apparatus according to claim 1, wherein the high-frequency superimposing section is configured to superimpose the high-frequency signal on the laser driving current by adding output current of the laser driving superimposing current generating circuit to the laser driving current generated by the laser driving video current generating circuits.

8. A projection apparatus according to claim 1, wherein a level change detecting circuit is configured to detect the level change of the input video signal.

9. A projection apparatus according to claim 1, wherein an oscillator is configured to oscillate the high-frequency signal on a basis of a signal synchronized with the input video signal.

* * * * *